(12) United States Patent
Wang et al.

(10) Patent No.: US 11,289,521 B2
(45) Date of Patent: Mar. 29, 2022

(54) CAMERA MODULE AND MOLDED PHOTOSENSITIVE ASSEMBLY AND MANUFACTURING METHOD THEREFOR, AND ELECTRONIC DEVICE

(71) Applicant: NINGBO SUNNY OPOTECH CO., LTD., Zhejiang (CN)

(72) Inventors: Mingzhu Wang, Ningbo (CN); Zhenyu Chen, Ningbo (CN); Nan Guo, Ningbo (CN); Bojie Zhao, Ningbo (CN); Takehiko Tanaka, Ningbo (CN); Zhen Huang, Ningbo (CN); Zhongyu Luan, Ningbo (CN); Heng Jiang, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 151 days.

(21) Appl. No.: 16/088,435

(22) PCT Filed: Oct. 25, 2016

(86) PCT No.: PCT/CN2016/103247
§ 371 (c)(1),
(2) Date: Feb. 12, 2019

(87) PCT Pub. No.: WO2017/166798
PCT Pub. Date: Oct. 5, 2017

(65) Prior Publication Data
US 2019/0165019 A1    May 30, 2019

(30) Foreign Application Priority Data

Mar. 28, 2016 (CN) .......................... 201610183447.6
Mar. 28, 2016 (CN) .......................... 201620246631.6
(Continued)

(51) Int. Cl.
H01L 27/146 (2006.01)
H04N 5/225 (2006.01)
H01L 23/00 (2006.01)

(52) U.S. Cl.
CPC ...... *H01L 27/14618* (2013.01); *H01L 23/562* (2013.01); *H01L 24/48* (2013.01);
(Continued)

(58) Field of Classification Search
CPC ............. H01L 23/562; H01L 27/14618; H01L 27/14627; H01L 27/14634;
(Continued)

(56) References Cited

U.S. PATENT DOCUMENTS 7,402,453 B2 * 7/2008 Derderian ......... H01L 27/14618
438/64
2010/0035373 A1 * 2/2010 Hunziker ............... G01D 3/028
438/48
(Continued)

*Primary Examiner* — Robert G Bachner
(74) *Attorney, Agent, or Firm* — Wenderoth, Lind & Ponack, L.L.P.

(57) ABSTRACT

A molded photosensitive assembly of a camera module includes at least one supporting member formed by a first substance, at least one photosensitive element, at least one circuit board, at least one set of wires electrically connecting the photosensitive element to the circuit board, and at least one molded base. Two ends of each of the wires are respectively connected to a chip connector of the photosensitive element and a circuit connector of the circuit board. The molded base is formed by a second substance and comprises a molded body and has at least one light window, wherein the photosensitive element and the wires are protected by a supporting member which is provided for avoiding an upper mold of a molding-die pressing on the wires during the molding process.

20 Claims, 55 Drawing Sheets

(30) Foreign Application Priority Data

| Apr. 28, 2016 | (CN) | 201610278035.0 |
|---|---|---|
| Apr. 28, 2016 | (CN) | 201620373323.X |
| Aug. 12, 2016 | (CN) | 201610668807.1 |
| Aug. 12, 2016 | (CN) | 201610669214.7 |
| Aug. 12, 2016 | (CN) | 201620875381.2 |
| Aug. 12, 2016 | (CN) | 201620875383.1 |
| Aug. 12, 2016 | (CN) | 201620875781.3 |
| Aug. 12, 2016 | (CN) | 201620876056.8 |

(52) U.S. Cl.
CPC .... *H01L 27/1469* (2013.01); *H01L 27/14627* (2013.01); *H01L 27/14634* (2013.01); *H01L 27/14636* (2013.01); *H01L 27/14685* (2013.01); *H04N 5/225* (2013.01); *H04N 5/2253* (2013.01); *H04N 5/2257* (2013.01); *H01L 24/45* (2013.01); *H01L 2224/45139* (2013.01); *H01L 2224/45144* (2013.01); *H01L 2224/45147* (2013.01); *H01L 2224/48227* (2013.01)

(58) Field of Classification Search
CPC ......... H01L 27/14636; H01L 27/14685; H01L 27/1469; H01L 24/48; H04N 5/2253; H04N 5/2257
See application file for complete search history.

(56) References Cited

U.S. PATENT DOCUMENTS

| 2013/0264703 A1* | 10/2013 | Tae | H01L 23/48 257/737 |
|---|---|---|---|
| 2016/0191767 A1* | 6/2016 | Otani | G02B 7/08 348/373 |
| 2017/0264801 A1* | 9/2017 | Wang | G02B 5/201 |

* cited by examiner

CAMERA MODULE AND MOLDED PHOTOSENSITIVE ASSEMBLY AND MANUFACTURING METHOD THEREFOR, AND ELECTRONIC DEVICE

CROSS REFERENCE OF RELATED APPLICATION

This is a U.S. National Stage under 35 U.S.C. 371 of the International Application Number PCT/CN2016/103247, filed Oct. 25, 2016, which claims priority to Chinese application number 201610183447.6, filed Mar. 28, 2016, Chinese application number 201620246631.6, filed Mar. 28, 2016, Chinese application number 201610278035.0, filed Apr. 28, 2016, Chinese application number 201620373323.X, filed Apr. 28, 2016, Chinese application number 201610668807.1, filed Aug. 12, 2016, Chinese application number 201620875383.1, filed Aug. 12, 2016, Chinese application number 201620875381.2, filed Aug. 12, 2016, Chinese application number 201610669214.7, filed Aug. 12, 2016, Chinese application number 201620876056.8, filed Aug. 12, 2016, and Chinese application number 201620875781.3, filed Aug. 12, 2016.

BACKGROUND OF THE PRESENT INVENTION

Field of Invention

The present invention relates to optical imaging, and more particularly to a camera module and its molded photosensitive assembly and manufacturing method, and an electronic device thereof.

Description of Related Arts

In recent years, camera module for acquiring images has become more and more widely used in many electronic devices such as personal electronic products, automotive products, medical products and so on. For example, the camera module is one of the standard accessories in portable electronic devices such as smart phones and tablet computers. The camera module in portable electronic devices can not only capture images but also enable portable electronic devices to have more functions such as real-time video calls. With the increasingly thinner and lighter requirements for portable electronic devices, and the higher imaging quality requirements of the camera module, more stringent requirements are focused on the overall size of the camera module and the imaging capabilities of the camera module. In other words, with the trend of development in portable electronic devices, the imaging capability of the camera module needs to be improved and enhanced with reducing the overall size of the camera module.

It is well known that the improvement of the imaging capability of the camera module is based on the configuration of a photosensitive element with a larger imaging area and more passive electronic components such as driving resistors and capacitors. Mainly because the camera module needs to be configured by photosensitive element with larger imaging area and more passive electronic components, it has to improve the packaging process of the camera module to reduce the overall size of the camera module. The conventional packaging process used for the camera module is a COB (Chip On Board) packaging process, that is, a circuit board, a photosensitive element, a supporter, and the like of the camera module are respectively fabricated. Then, the passive electronic components, photosensitive element and the supporter are sequentially disposed to be packaged on the circuit board. In order to ensure the imaging quality of the camera module, it is necessary to fill glue between every two elements, for example, filling glue between the supporter and the circuit board to package the supporter on the circuit board and leveling the supporter with the circuit board. Therefore, the size of the camera module can not be effectively reduced in the COB packaging process and the packaging efficiency of the camera module is relatively low.

In order to solve these problems, a molding process is introduced into the field of camera module, which allows the supporter of the camera module to be integrally formed on the circuit board during manufacturing. In this way, not only the size of the camera module can be effectively reduced, it can also reduce manufacturing errors of the camera module to improve the imaging quality. However, there are still some shortcomings in introducing the molding process into the field of the camera module directly.

Firstly, the photosensitive element of the camera module mounted on the circuit board is electrically connected with the circuit board through a plurality of wires. Usually, the two ends of one of the wires are respectively soldered to the photosensitive element and the circuit board. And limited by the bonding process and the properties of the wire, after the two ends of the wire are soldered to the photosensitive element and the wire board, the wire is curved upwardly and protruded from the upper surface of the photosensitive element. During the molding process of the camera module, an upper mold of a set of molds is pressed downwardly, and the surface of the upper mold may press a protruding portion of the wire that may cause deformation of the wire. Once the wire is deformed, the wire is difficult to return to its original shape when the upper mold is removed.

Secondly, when the molding material for forming the supporter is added into a molding cavity inside the molds and solidified in the molding cavity to form the supporter, the deformed wire is preferred to be wrapped inside the supporter to be maintained in the deformed shape. The ability to transmit electrical signals between the photosensitive element and the circuit board of the deformed wire is greatly reduced, so that the imaging capability and imaging efficiency of the camera module are adversely affected. More importantly, when the wire is deformed by the pressing surface of the upper mold, the deformation direction and degree of deformation of the wire are uncontrollable. Therefore, two adjacent deformed wires may come in contact with each other that would cause a short-circuit, which leads to increasing the defect rate of the camera module. In addition, after the photosensitive element is mounted on the circuit board, a gap is formed between the photosensitive element and the circuit board. During the molding process, the molding material in fluid is capable of entering the gap formed between the photosensitive element and the circuit board, so that the mounting relationship between the photosensitive element and the circuit board is changed. Once the mounting relationship between the photosensitive element and the circuit board is changed, it inevitably causes inclination between the photosensitive element and the circuit board which adversely affects the imaging quality of the camera module.

SUMMARY OF THE PRESENT INVENTION

The invention is advantageous in that it provides a camera module, a molded photosensitive assembly thereof, a manufacturing method thereof, and an electronic device, wherein the molded photosensitive assembly provides a supporting member which is capable of avoiding an upper mold of a molding-die pressing on a wire connected between a photosensitive element and a circuit board of the molded photosensitive assembly, so as to prevent the wire from being deformed by being pressed during molding process.

Another advantage of the invention is to provide a camera module, a molded photosensitive assembly thereof, a manufacturing method thereof, and an electronic device, wherein during the molding process, when the upper mold of the molding-die is matched on a lower mold while a pressing surface of the upper mold touched on the top surface of the supporting member, the upper mold is supported by the supporting member upwardly, in order to avoid the pressure of the upper mold applying directly on the wire, so as to prevent the wire from being pressed and deformed.

Another advantage of the invention is to provide a camera module, a molded photosensitive assembly thereof, a manufacturing method thereof, and an electronic device, wherein during the molding process, when the upper mold of the molding-die is matched on a lower mold while a pressing surface of the upper mold touched on the top surface of the supporting member, the upper mold is supported by the supporting member upwardly so as to form a safety distance between the pressing surface of the upper mold and the wire and prevent the pressing surface of the upper mold from directly contacting the wire.

Another advantage of the invention is to provide a camera module, a molded photosensitive assembly thereof, a manufacturing method thereof, and an electronic device, wherein the supporting member is made of elastic material and thus the supporting member is capable of absorbing an impact force generated when the pressing surface of the upper mold pressing on the top surface of the supporting member, so as to avoid the photosensitive element, the circuit board, the wires, and the electronic components being damaged when the upper mold and the lower mold of the molding-die are closed.

Another advantage of the invention is to provide a camera module, a molded photosensitive assembly thereof, a manufacturing method thereof, and an electronic device, wherein the supporting member is formed by an elastic material, when the upper mold is pressing the supporting member, a top surface of the supporting member is capable of avoiding any gap formed between the top surface of the supporting member and the pressing surface of the upper mold by way of deformation, so as to prevent flash occurred at the position of a light window of a module base while forming the module base of the molded photosensitive assembly, which facilitates the yield while packaging and ensures the imaging quality of the camera module.

Another advantage of the invention is to provide a camera module, a molded photosensitive assembly thereof, a manufacturing method thereof, and an electronic device, wherein the supporting member is formed from an elastic material, when the upper mold is pressing the supporting member, the top surface of the supporting member is capable of avoiding any gap formed between the top surface of the supporting member and the pressing surface of the upper mold by way of deformation, so as to avoid the molding material of the module base entering the connecting position of the top surface of the supporting member and the pressing surface of the upper mold into the photosensitive area of the photosensitive element to cause contamination or damage. That is, during the molding process, the photosensitive area of the photosensitive element is in a closed environment.

Another advantage of the invention is to provide a camera module, a molded photosensitive assembly thereof, a manufacturing method thereof, and an electronic device, wherein the supporting member is formed from an inflexible material, and the pressing surface of the upper mold of the molding-die is provided with a covering film. When the pressing surface of the upper mold is pressed against the top surface of the supporting member, the covering film is positioned between the pressing surface of the upper mold and the top surface of the supporting member. On one hand, the covering film can prevent a gap from being formed between the pressing surface of the upper mold and the supporting member, and on the other hand, the covering film can avoid the photosensitive element, the circuit board, the wires, and electronic components being damaged when the upper mold and the lower mold of the molding-die is closed.

Another advantage of the invention is to provide a camera module, a molded photosensitive assembly thereof, a manufacturing method thereof, and an electronic device, wherein the supporting member is formed in an inflexible material, and the pressing surface of the upper mold of the molding-die is provided with a covering film. When the pressing surface of the upper mold is pressed against the top surface of the supporting member, the supporting member is remained in shape, for preventing the wires from being deformed to protect the effective electrical properties of the wires.

Another advantage of the invention is to provide a camera module, a molded photosensitive assembly thereof, a manufacturing method thereof, and an electronic device, wherein the supporting member is disposed along a non-photosensitive area of the photosensitive element. During the molding process, the supporting member is capable of preventing the molding material from entering the photosensitive area of the photosensitive element through the connecting position of the supporting member and non-photosensitive area of the photosensitive element to contaminate or damage the photosensitive area of the photosensitive element.

Another advantage of the invention is to provide a camera module, a molded photosensitive assembly thereof, a manufacturing method thereof, and an electronic device, wherein the supporting member is disposed to cover the connecting position of the wire and the photosensitive element and the connecting position of the wire and the circuit board, so that the supporting member isolates every connecting position with the molding material during the molding process for making the connecting position more reliable.

Another advantage of the invention is to provide a camera module, a molded photosensitive assembly thereof, a manufacturing method thereof, and an electronic device, wherein the supporting member is positioned in a molding cavity formed between the upper mold and the lower mold of the molding-die, so that the supporting member is capable of blocking the flowing molding material from impinging on the wire when the molding material is injected into the molding cavity to be solidified to form the molded base.

Another advantage of the invention is to provide a camera module, a molded photosensitive assembly thereof, a manufacturing method thereof, and an electronic device, wherein the supporting member is pre-mounted on the circuit board and the photosensitive element, so that the supporting member can keep the photosensitive element and the circuit board from being displaced while the molding material is filled into the molding cavity to be solidified to form the molded base.

Another advantage of the invention is to provide a camera module, a molded photosensitive assembly thereof, a manufacturing method thereof, and an electronic device, wherein the supporting member is disposed to cover at least a part of the non-photosensitive area of the photosensitive element, so as to avoid the molding material contacting with the photosensitive area of the photosensitive element that prevents the photosensitive area of the photosensitive element from being contaminated or damaged.

Another advantage of the invention is to provide a camera module, a molded photosensitive assembly thereof, a manufacturing method thereof, and an electronic device, wherein the supporting member is disposed to cover at least a part of the photosensitive element and the circuit board, so that the gap formed between the photosensitive element and the circuit board is sealed by the supporting member for preventing the flowing molten molding material from entering between the photosensitive element and the circuit board during the molding process.

Another advantage of the invention is to provide a camera module, a molded photosensitive assembly thereof, a manufacturing method thereof, and an electronic device, wherein the supporting member is arranged to cover and enclose the wires so as to maintain the wires in a predetermined optimal effective condition by the supporting member.

Another advantage of the invention is to provide a camera module, a molded photosensitive assembly thereof, a manufacturing method thereof, and an electronic device, wherein the supporting member is provided to cover the wires to avoid stray light being generated inside the camera module to affect the captured imaging quality of the camera module during the using of the camera module subsequently.

Another advantage of the invention is to provide a camera module, a molded photosensitive assembly thereof, a manufacturing method thereof, and an electronic device, wherein the supporting member has a viscosity that can adhere contaminants, such as solder powder generated when the electronic components are mounted on the circuit board, before the molded base is molded, adapted for preventing contaminants from the photosensitive area of the photosensitive element.

Another advantage of the invention is to provide a camera module, a molded photosensitive assembly thereof, a manufacturing method thereof, and an electronic device, wherein both connecting ends of each of the wires are respectively connected to a chip connector of the photosensitive element and a circuit connector of the circuit board, wherein the top surface of the supporting member is higher than the chip connector of the photosensitive element, so that the chip connector of the photosensitive element is not effected when the molding-die is operated in the molding process.

Another advantage of the invention is to provide a camera module, a molded photosensitive assembly thereof, a manufacturing method thereof, and an electronic device, wherein the supporting member is arranged to cover the chip connector of the photosensitive element, adapted for preventing the molding material from contacting the chip connector of the photosensitive element during the molding process, so as to protect the chip connector of the photosensitive element.

Another advantage of the invention is to provide a camera module, a molded photosensitive assembly thereof, a manufacturing method thereof, and an electronic device, wherein the supporting member is disposed outside the chip connector of the photosensitive element, for preventing the molding material from contacting the chip connector of the photosensitive element during the molding process, so as to protect the chip connector of the photosensitive element.

Another advantage of the invention is to provide a camera module, a molded photosensitive assembly thereof, a manufacturing method thereof, and an electronic device, wherein the camera module provides a supporter having at least two mounting passages for mounting at least two drivers or lens holders respectively in the at least two mounting passages of the supporter to maintain the coaxiality of the optical lenses for forming an array camera module.

Another advantage of the invention is to provide a camera module, a molded photosensitive assembly thereof, a manufacturing method thereof, and an electronic device, wherein the camera module provides at least one filter member, and the filter member is held between the photosensitive element and the optical lens and configured to filter the stray light from the optical lens entering into the interior of the array camera module for improving the imaging quality of the array camera module.

Another advantage of the invention is to provide a camera module, a molded photosensitive assembly thereof, a manufacturing method thereof, and an electronic device, wherein the camera module provides a protective frame which is disposed on an outer peripheral of the photosensitive area of the photosensitive element for preventing the molding material adapted for forming an integrated package holder in the molding process from damaging the photosensitive area of the photosensitive element.

Another advantage of the invention is to provide a camera module, a molded photosensitive assembly thereof, a manufacturing method thereof, and an electronic device, wherein the protective frame prevents flashing being formed inside the integrated package holder during the molding of the integrated package holder.

Another advantage of the invention is to provide a camera module, a molded photosensitive assembly thereof, a manufacturing method thereof, and an electronic device, wherein the protective frame is disposed on the outer peripheral of the filter member, wherein the protective frame prevents "flashing" being formed inside the integrated package holder during the molding formation of the integrated package holder.

Another advantage of the invention is to provide a camera module, a molded photosensitive assembly thereof, a manufacturing method thereof, and an electronic device, wherein the protective frame is protrudedly provided on an outer peripheral of a photosensitive area of the photosensitive element, so that the photosensitive element will not directly contact with the molding-die by means of the integrated package holder, so as to prevent the photosensitive area of the photosensitive element from being pressed to be damaged or scratched.

Another advantage of the invention is to provide a camera module, a molded photosensitive assembly thereof, a manufacturing method thereof, and an electronic device, wherein the protective frame has a predetermined elasticity to provide a buffering ability, wherein the protective frame can be sufficiently in contact with the molding-die under pressing pressure so as to provide a sealing effect that isolates the photosensitive area of the photosensitive element from the external environment to prevent damage to the photosensitive area of the photosensitive element during the molding of the integrated package holder.

Another advantage of the invention is to provide a camera module, a molded photosensitive assembly thereof, a manufacturing method thereof, and an electronic device, wherein the protective frame has a predetermined elasticity to provide a buffering ability for reducing the requirement for the flatness of the camera module and reducing the assembly requirements of the various units of the camera module.

Another advantage of the invention is to provide a camera module, a molded photosensitive assembly thereof, a manufacturing method thereof, and an electronic device, wherein the protective frame is molded to overlappedly arrange on the photosensitive element to improve the manufacturing efficiency of the camera module.

Another advantage of the invention is to provide a camera module, a molded photosensitive assembly thereof, a manufacturing method thereof, and an electronic device, wherein the surface of the upper mold of the molding-die is provided with a covering film which can provide additional protection to the photosensitive element when the molds of the molding-die is applying pressure thereto, wherein the covering film also facilitates mold unloading and increases sealing ability while avoiding burr formation.

Another advantage of the invention is to provide a camera module, a molded photosensitive assembly thereof, a manufacturing method thereof, and an electronic device, wherein a portion of the molding-die, corresponding to the position of the photosensitive area of the photosensitive element, can be made and designed in a concave manner to ensure a safe distance defined between the photosensitive area of the photosensitive element and the molding-die, adapted for further reducing adverse influence on the photosensitive element.

Another advantage of the invention is to provide a camera module, a molded photosensitive assembly thereof, a manufacturing method thereof, and an electronic device, wherein the protective frame is covered with a protective film to facilitate the setting of the protective frame to the photosensitive element. In addition, the protective film may also isolate the photosensitive area of the photosensitive element to the external environment.

Another advantage of the invention is to provide a camera module, a molded photosensitive assembly thereof, a manufacturing method thereof, and an electronic device, wherein the camera module comprises at least one insulating member provided at a periphery around at least a photosensitive area of the photosensitive element and an integral encapsulating support structure formed to enclose, case and/or wrap up a non-photosensitive area of the photosensitive element, the circuit board and the bonding wires therebetween, wherein the insulating member is provided to prevent the molding material of the integral encapsulating support structure, before it is solidified, from flowing to the photosensitive area of the photosensitive element during the formation process of the integral encapsulating support structure.

Another advantage of the invention is to provide a camera module, a molded photosensitive assembly thereof, a manufacturing method thereof, and an electronic device, wherein the insulating member is protruded on the photosensitive element to enable a bottom surface of an upper mold of the molding-die to contact with the insulating member. In other words, the insulating member can provide a cushioning effect and avoid the bottom surface of the upper mold of the molding-die from directly contacting with the photosensitive element, so as to protect the photosensitive area of the photosensitive element from being damaged by the applied pressure of the upper mold of the molding-die.

Another advantage of the invention is to provide a camera module, a molded photosensitive assembly thereof, a manufacturing method thereof, and an electronic device, wherein the insulating member can prevent the molding material of the integral encapsulating support structure, before it is solidified, from flowing from the non-photosensitive area to the photosensitive area of the photosensitive element. In addition, when the integral encapsulating support structure is formed and solidified, the insulating member is able to prevent any burr from forming at the side, toward the photosensitive element, of the integral encapsulating support structure, so as to increase the product yield rate of the camera module.

Another advantage of the invention is to provide a camera module, a molded photosensitive assembly thereof, a manufacturing method thereof, and an electronic device, wherein the insulating member may have elasticity and flexibility that allows the insulating member to deform according to the gap formed between the upper mold of the molding-die and the photosensitive element. Therefore, the photosensitive area of the photosensitive element is insulated from external environment by the insulating member, so that the molding material of the integral encapsulating support structure is prevented from entering the photosensitive area of the photosensitive element through the gap formed between the upper mold of the molding-die and the photosensitive element, so as to ensure the reliability of the camera module during the manufacturing process of the camera module.

Another advantage of the invention is to provide a camera module, a molded photosensitive assembly thereof, a manufacturing method thereof, and an electronic device, wherein the insulating member is provided to have a stickiness for sticking pollutant such as dusts, so as to enhance the imaging quality of the camera module by reducing the dirty spot of the photosensitive area of the photosensitive element.

Another advantage of the invention is to provide a camera module, a molded photosensitive assembly thereof, a manufacturing method thereof, and an electronic device, wherein the camera module comprises at least one filter member which can be provided on the filter member, wherein the integral encapsulating support structure which encloses, cases and/or wraps up the circuit board and an outer area of the filter member after it is formed and solidified, so that the integral encapsulating support structure, the filter member, the photosensitive element, and the circuit board are connected with each other to form an integral body. In addition, the insulating member substantially prevents the molding material from entering the inner effective function area of the filter member and prevents the filter member from being damaged during the mold pressing process.

According to the present invention, the foregoing and other objects and advantages are attained by a molded photosensitive assembly of a camera module, which comprises:

at least one supporting member formed of a first substance;

at least one photosensitive element;

at least one circuit board;

at least one set of wires, wherein two ends of each of the at least one set of wires are respectively connected to a chip connector of each of the photosensitive element and a circuit connector of each of the circuit board; and at least one molded base formed of a second substance, wherein each of the at least one molded base respectively comprises a molded body and has at least one light window, wherein during the molded body is molding by a molding-die in molding process, the photosensitive element and the wires are protected by said supporting member, wherein the photosensitive area of the photosensitive element is correspondingly disposed at said light window.

According to an embodiment of the present invention, each of the at least one supporting members comprises a frame-shaped supporting body and has at least one through hole, the supporting body is covered with a part of the non-photosensitive area of the photosensitive element, wherein the photosensitive area of the photosensitive element is disposed corresponding to the through hole, wherein the supporting body has a top surface, an inner surface and an outer surface, wherein the top surface of the supporting body is extended inwardly and outwardly connecting the inner surface and the outer surface, wherein the through hole is formed by the inner surface, wherein the pressing surface of the molding-die and the top surface of the supporting body are in contact during the molding process.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-inner portion is covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-inner portion and at least part of the chip-connecting portion are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-inner portion, at least part of the chip-connecting portion and at least part of the chip-outer portion are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-outer portion and at least part of the chip-connecting portion are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-outer portion is covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-connecting portion is covered by the supporting body.

According to an embodiment of the present invention, each of the supporting member comprises a frame-shaped supporting body and having a through hole, wherein at least a part of a periphery area of the circuit board is covered by the supporting body, wherein the photosensitive area of the photosensitive element is correspondingly disposed at the through hole, wherein the supporting body has a top surface, an inner surface and an outer surface, wherein the top surface of the supporting body is extended inwardly and outwardly to connect with the inner surface and the outer surface respectively, wherein the through hole is formed in the inner surface, wherein the pressing surface of the molding-die is in contact with the top surface of the supporting body during the molding process.

According to an embodiment of the present invention, at least a part of the photosensitive element is covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-inner portion and at least part of the chip-outer portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-inner portion, the chip-outer portion and at least part of the chip-connecting portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-inner portion, the chip-outer portion, the chip-connecting portion and at least part of the chip-inner portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-connecting portion, the circuit-inner portion and at least part of the chip-outer portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the chip-outer portion, the circuit-connecting portion, the chip-inner portion and at least part of the chip-outer portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-connecting portion, the circuit-inner portion, the chip-outer portion and at least part of the chip-connecting portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-connecting portion, the circuit-inner portion, the chip-outer portion, the chip-connecting portion and at least part of the chip-inner portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-outer portion, the circuit-connecting portion, the circuit-inner portion, the chip-outer portion and at least part of the chip-connecting portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein at least part of the circuit-outer portion, the circuit-connecting portion, the circuit-inner portion, the chip-outer portion, the chip-connecting portion and at least part of the chip-inner portion are covered by the supporting body.

According to an embodiment of the present invention, the outer surface of the supporting body is covered by the molded body.

According to an embodiment of the present invention, at least a part of the top surface of the supporting body is covered by the molded body.

According to an embodiment of the present invention, the height of the supporting member is higher than or equal to the height at which the wires protrudes upwardly.

According to an embodiment of the present invention, the height of the supporting member is lower than the height at which the wires protrudes upwardly.

According to an embodiment of the present invention, the supporting member has a predetermined elasticity.

According to an embodiment of the present invention, the supporting member has an adhesive ability.

According to an embodiment of the present invention, the Shore hardness range of the supporting member is A50-A80, wherein the elastic modulus range of the supporting member is 0.1 Gpa-1 Gpa.

According to the present invention, the foregoing and other objects and advantages are also attained by a molded photosensitive module of a camera module, comprising:

at least one photosensitive element;
at least one circuit board;

at least one set of wires, wherein two ends of each of the at least one set of wires are respectively connected to a chip connector of each of the at least one photosensitive element and a circuit connector of each of the at least one circuit board;

at least one supporting member, wherein each of the at least one supporting member is configured to cover at least a part of each of the at least one set of wires; and at least one molded base, wherein each of at least one molded base comprises a molded body and has at least one light window, wherein the periphery area of the circuit board and at least a part of the supporting member is covered by the molded body after molded, wherein, the photosensitive area of each of the at least one photosensitive element respectively is correspondingly disposed to the light window of each of the at least one molded base.

According to an embodiment of the present invention, the supporting member comprises a supporting body and a through hole, wherein the supporting body has a top surface, an inner surface and an outer surface, wherein the top surface of the supporting body is extended inwardly and outwardly to connect to the inner surface and the outer surface, wherein the through hole is formed by the inner surface, wherein the supporting body is disposed to cover at least a part of the wires, wherein the photosensitive element is correspondingly disposed at the through hole, and the outer surface of the supporting body is covered by the molded body.

According to an embodiment of the present invention, the molded base further comprises at least a part of the top surface of the supporting body.

According to the present invention, the foregoing and other objects and advantages are further attained by a camera module with a molded photosensitive assembly, comprising:

at least one optical lens; and at least one molded photosensitive assembly, wherein each of the at least one molded photosensitive assembly further comprises:

a supporting member formed by the first substance;

a photosensitive element;

a circuit board;

a set of wires, wherein the two ends of each of the set of wires are respectively connected to a chip connector of the photosensitive element and a circuit connector of the circuit board; and a molded base formed of a second substance, wherein the molded base comprises a molded body and has a light window, wherein during the molding process by a molding-die to mold the molded body, the supporting member is configured to prevent a pressing surface of the molding-die from being pressed against the wires, wherein a photosensitive area of the photosensitive element is correspondingly disposed at the light window, wherein each of the at least two optical lenses is respectively disposed at each of the photosensitive path of the photosensitive element of the molded photosensitive assembly.

According to an embodiment of the present invention, the camera module further comprises at least one driver, wherein each of the at least two optical lenses is respectively mounted on each of the at least one driver, wherein each of the at least one driver is mounted to the top surface of the molded body of the photosensitive element.

According to an embodiment of the present invention, the camera module further comprises at least one filter member, wherein each of the at least one filter member is disposed between each of the optical lenses and each of the photosensitive elements of the molded photosensitive assembly.

According to an embodiment of the present invention, each of the filter members is respectively mounted on a top surface of the molded body of each of the molded photosensitive assembly.

According to an embodiment of the present invention, the top surface of the molded body has an inner surface and an outer surface and the inner surface is positioned at a lower plane than the outer surface, wherein a recess is formed on the molded body, wherein the filter member is mounted on the inner surface of the molded body and is positioned in the recess, wherein the driver is mounted on the outside surface of the molded body.

According to an embodiment of the present invention, the camera module further comprises at least one supporting member, wherein each of the filter member is mounted on each of the at least one supporting member, wherein each of the at least one supporting member is mounted on the top surface of the molded body, wherein the filter members are respectively disposed between the at least two optical lenses and the photosensitive elements of the molded photosensitive assembly.

According to the present invention, the foregoing and other objects and advantages are attained by a camera module with a molded photosensitive assembly, which comprises:

at least one optical lens; and at least one molded photosensitive assembly, wherein each of the at least one molded photosensitive assembly further comprises:

a photosensitive element;

a circuit board;

a set of wires, wherein the two ends of each of the set of wires are respectively connected to a chip connector of the photosensitive element and a circuit connector of the circuit board;

a supporting member, wherein the supporting member is disposed to cover at least a part of each of the set of wires; and a molded base, wherein the molded base comprises a molded body and has a light window, wherein an periphery area of the circuit board and at least a part of the supporting member is covered by the molded body after molded, wherein the photosensitive area of each of the photosensitive elements is corresponding to the light window of the molded base, wherein each of the at least two optical lenses is disposed on the respective photosensitive path of the photosensitive element of the at least one molded photosensitive assembly.

According to an embodiment of the present invention, the camera module is a fixed focus camera module or a zoom camera module.

According to the present invention, the foregoing and other objects and advantages are attained by an electronic device, which comprises:

an electronic device body; and at least one camera module, wherein each of the at least one camera module is disposed on the electronic device body for acquiring images, wherein each of the at least one camera module comprises at least one optical lens and at least one molded photosensitive assembly, wherein the at least one molded photosensitive assembly comprises:

a supporting member, a photosensitive element, a circuit board, a set of wires, a supporting member and a molded base, wherein the two ends of each of the a set of wires are respectively connected to a chip connector of the photosensitive element and a circuit connector of the circuit board, wherein the supporting member is arranged to cover at least a part of each of the set of wires wherein the molded base comprises a molded body and has a light window, wherein a periphery area of the circuit board and at least a part of the supporting member are covered by the molded body after molded, wherein the photosensitive area of each of the photosensitive elements is positioned corresponding to the light window of the molded base, wherein each of the at least two optical lenses is disposed on the respective photosensitive path of the photosensitive element of the at least one molded photosensitive assembly.

According to the present invention, the foregoing and other objects and advantages are attained by a manufacturing method of a molded photosensitive assembly, comprising the following steps:

(a) electrically connecting a photosensitive element and a circuit board through a set of wires;

(b) placing the photosensitive element and the circuit board on an upper mold or a lower mold of a molding-die;

(c) when the upper mold and the lower mold are closed, supporting the upper mold upwardly by a supporting member to prevent a pressing surface of the upper mold from being pressed against each of the set of the wires; and (d) adding a molten molding material to a molding cavity formed between the upper mold and the lower mold to form a molded base after the molding material is solidified and cured, wherein the molded base comprises a molded body and has at least one light window, wherein at least a part of a periphery area of the circuit board and at least a part of the supporting member are covered by the molded body.

According to an embodiment of the present invention, in the step (c), when the pressing surface of the upper mold is pressed against the top surface of the supporting body, the top surface of the supporting body is deformed to closely press on the pressing surface of the upper surface, so that the photosensitive area of the photosensitive element is in a sealed environment, wherein in the step (d), the supporting body prevents the molding material from entering the sealing environment, so that the outer surface of the supporting body is covered by the molding material formed the molded body after curing, and the light window is formed on an inner surface of the supporting body.

According to the present invention, the foregoing and other objects and advantages are attained by a method of manufacturing a molded photosensitive assembly, comprising the steps of:

(A) connecting a photosensitive element and a circuit board through a set of wires;

(B) covering at least a part of the set of wires by a supporting member to form a molded photosensitive assembly semi-finished product;

(C) placing the molded photosensitive assembly semi-finished product on an upper mold or a lower mold of a molding-die, wherein the upper mold is supported by the supporting member when the upper mold and the lower mold are closed to prevent a pressing surface of the upper mold from being pressed against the set of wires; and (D) adding a fluid-state molding material to a molding cavity formed between the upper mold and the lower mold to form a molded base after the molding material is solidified and cured, wherein at least a part of a periphery area of the circuit board and at least a part of the supporting member are covered by the molded body, wherein the photosensitive area of the photosensitive element is positioned corresponding to the light window.

According to the present invention, the foregoing and other objects and advantages are attained by a method of manufacturing a molded photosensitive assembly, comprising the steps of:

(i) mounting a photosensitive element on a circuit board, and conducting the photosensitive element and the circuit board through at least one set of wires;

(ii) pre-fixing the photosensitive element and the circuit board by a supporting member to obtain a molded photosensitive assembly semi-finished product, whereby the supporting member prevents a gap from being formed between the photosensitive element and the circuit board;

(iii) placing the molded photosensitive assembly semi-finished product on an upper mold or a lower mold of a molding-die to form an annular molding cavity between the upper mold and the lower mold when the upper mold and the lower mold are closed by clamping; and (iv) adding a fluid state molding material to the annular molding cavity to form the molded base after the molding material is cured, wherein the molded base comprises a molded body and has a light window, wherein at least a part of a periphery area of the circuit board and at least a part of the supporting member are covered by the molded body, wherein the photosensitive area of the photosensitive element is positioned corresponding to the light window.

According to the present invention, the foregoing and other objects and advantages are attained by a method of manufacturing a molded photosensitive assembly, comprising the steps of:

(a) connecting a chip connector of a photosensitive element and a circuit connector of a circuit board through a set of wires;

(b) placing the photosensitive element and the circuit board on an upper mold or a lower mold of a molding-die to form an annular molding cavity between the lower mold and the upper mold when the upper mold and the lower mold are clamped and closed;

(c) when a fluid state molding material is added to the annular molding cavity, reducing an impact force generated by the molding material with a supporting member positioned in the annular molding cavity by blocking the molding material; and (d) forming a molded base after the molding material is solidified and cured, wherein the molded base comprises a molded body and has a light window, wherein a periphery area of the circuit board, the supporting member, the supporting member and at least a part of the non-photosensitive area of the photosensitive element are covered by the molded body.

According to the present invention, the foregoing and other objects and advantages are attained by a molded photosensitive assembly, comprising:

at least one supporting member formed by a first substance;

at least one circuit board, wherein each of the at least one circuit board has at least one chip mounting area;

at least two photosensitive elements, wherein the at least two photosensitive elements are respectively mounted on the at least one chip mounting area of the at least one circuit board;

at least two sets of wires, wherein two ends of each of the at least two sets of wires are respectively connected to a chip connector of each of the at least two photosensitive elements and a circuit connector of the at least one circuit board; and a molded base formed by a second substance, wherein the molded base comprises a molded body and has at least two light windows, wherein the wires, the circuit board and the at least two photosensitive elements are protected by the supporting member when and after the molded body is molded, wherein the molded body is integrally coupled to at least a part of each of the circuit boards, and the photosensitive areas of the photosensitive elements are respectively positioned correspond to the light windows of the molded base.

According to an embodiment of the present invention, the mold assembly comprises two supporting members, one circuit board, two photosensitive elements, and the two sets of the wires, wherein the circuit board has two chip mounting areas.

According to an embodiment of the present invention, the mold assembly comprises two supporting members, one circuit board, two photosensitive elements, and two sets of the wires, wherein each of the circuit boards has one chip mounting area.

According to an embodiment of the present invention, the molded photosensitive assembly further comprises at least one electronic component, wherein the circuit board has a periphery area, wherein the periphery area and the chip mounting area are integrally molded, wherein each of the at least one electronic component is mounted on the periphery area, wherein the supporting member is positioned between the at least one electrical component and the photosensitive area of the photosensitive element.

According to an embodiment of the present invention, the supporting member comprises a frame-shaped supporting body and has a through hole, wherein the supporting body is provided outside of the photosensitive area of the photosensitive element, wherein the photosensitive area of the photosensitive element is correspondingly disposed at the through hole, wherein at least a part of the supporting body is covered by the molded body.

According to an embodiment of the present invention, the supporting body has a top surface, an inner surface and an outer surface, wherein the top surface is extended inwardly and outwardly to the inner surface and the outer surface respectively, wherein the through hole is formed by the inner surface, wherein at least the outer surface of the supporting body is covered by the molded body.

According to an embodiment of the present invention, the supporting body has a top surface, an inner surface and an outer surface, wherein the top surface is extended respectively inwardly and outwardly to the inner surface and the outer surface, wherein the through hole is formed by the inner surface, wherein the outer surface of the supporting body and at least a part of the top surface are covered by the molded body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein at least part of the chip-inner portion of the photosensitive element is covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein at least part of the chip-connecting portion of the photosensitive element is covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein at least part of the chip-outer portion of the photosensitive element is covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein at least part of the chip-inner portion and at least part of the chip-connecting portion of the photosensitive element are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein at least part of the chip-outer portion and at least part of the chip-connecting portion of the photosensitive element are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein at least part of the chip-inner portion, the chip-connecting portion and at least part of the chip-outer portion of the photosensitive element are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein at least part of the circuit-inner portion is covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein at least part of the circuit-connecting portion is covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein at least part of the circuit-outer portion is covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein at least part of the circuit-inner portion and at least part of the circuit-connecting portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the circuit-outer portion and at least part of the circuit-connecting portion are covered by the supporting body.

According to an embodiment of the present invention, the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein at least part of the circuit-inner portion, the circuit-connecting portion and at least part of the circuit-outer portion are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned on an inside and an outside of the chip-connecting portion, wherein the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein at least part of the circuit-inner portion and at least part of the chip-outer portion are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the circuit-inner portion, at least part of the circuit-connecting portion and at least part of the chip-outer portion are covered by the supporting body.

According to an embodiment of the present invention, the non-photosensitive area of the photosensitive element comprises a chip-inner portion, a chip-connecting portion and a chip-outer portion, wherein the chip connector of the photosensitive element is disposed on the chip-connecting portion, wherein the chip-inner portion and the chip-outer portion are respectively positioned an inside and an outside of the chip-connecting portion, wherein the periphery area of the circuit board comprises a circuit-inner portion, a circuit-connecting portion, and a circuit-outer portion, wherein the circuit connector is disposed on the circuit-connecting portion, wherein the circuit-inner portion and the circuit-outer portion are respectively positioned at an inner side and an outer side of the circuit-connecting portion, wherein the circuit-inner portion, the circuit-connecting portion, at least part of the circuit-outer portion and at least part of the chip-outer portion are covered by the supporting body.

According to an embodiment of the present invention, at least a part of the chip-connecting portion of the photosensitive element is covered by the supporting body.

According to an embodiment of the present invention, at least a part of the chip-connecting portion of the photosensitive element is covered by the supporting body.

According to an embodiment of the present invention, at least a part of the chip-connecting portion of the photosensitive element is covered by the supporting body.

According to an embodiment of the present invention, at least a part of the chip-inner portion of the photosensitive element is covered by the supporting body.

According to an embodiment of the present invention, at least a part of the chip-inner portion of the photosensitive element is covered by the supporting body.

According to an embodiment of the present invention, at least a part of the chip-inner portion of the photosensitive element is covered by the supporting body.

According to the present invention, the foregoing and other objects and advantages are attained by an array camera module, comprising:

at least two optical lenses; and a molded photosensitive assembly, which comprises:

at least one supporting member formed by a first substance;

at least one circuit board, wherein each of the at least one circuit board has at least one chip mounting area;

at least two photosensitive elements, wherein each of the at least two photosensitive elements is mounted on the at least one chip mounting area of the at least one circuit board;

at least two sets of wires, wherein two ends of each of the at least two sets of wires are respectively connected to a chip connector of each of the at least two photosensitive elements and a circuit connector of the at least one circuit board; and a molded base formed by a second substance, wherein the module base comprises a molded body and has at least two light windows, wherein the wires, the circuit board and the at least two photosensitive elements are protected by the supporting member when and after the molded body is molded, wherein the molded body is integrally coupled to at least a part of each of the circuit boards, and the photosensitive areas of the at least two photosensitive elements are respectively positioned corresponding to the at least two light windows of the molded base, wherein the at least two optical lenses are disposed on two photosensitive paths of the at least two photosensitive elements respectively, wherein a light path is provided by each of the optical windows for the respective optical lens and the photosensitive element.

According to an embodiment of the present invention, the array camera module further comprises at least two drivers, wherein the at least two optical lenses are mounted on the at least two drivers respectively, which each of the at least two drivers is mounted on the top surface of the molded body.

According to an embodiment of the present invention, the array camera module further comprises at least one driver and at least one lens-barrel, wherein at least one of the at least two optical lenses is mounted on the at least one driver and the at least one lens-barrel, wherein the at least one driver and the at least one lens-barrel are respectively positioned at different positions on the top surface of the molded body.

According to an embodiment of the present invention, the array camera module further comprises at least two lens-barrels, wherein each of the at least two lens-barrels is integrally formed on the top surface of the molded body, wherein the at least two optical lenses are respectively mounted into the at least two lens-barrels. Or, the array camera module further comprises at least two lens-barrels, wherein at least one of the at least two lens-barrels is integrally formed on a top surface of the molded body, and the other of the at least two lens-barrels is mounted on the top surface of the molded body, wherein the at least two optical lenses are mounted on the at least two lens-barrels respectively. Or, the array camera module comprises two lens-barrels mounted on the top surface of the molded body, wherein the at least two optical lenses are respectively mounted on the two lens-barrels.

According to an embodiment of the present invention, the array camera module further comprises at least one filter member, wherein the at least one filter member is mounted on the top surface of the molded body, so that the at least one filter member is held between one of the at least two optical lenses and one of the at least two photosensitive elements.

According to an embodiment of the present invention, the top surface of the molded body has at least two inner surfaces and an outer surface, wherein the at least one filter member is mounted on one of the at least two inner surfaces, wherein the at least two drivers are mounted at different positions on the outer surface of the molded body.

According to an embodiment of the present invention, the plane of the inner surface of the molded body is below the plane of the outer surface to form at least one recess on the molded body for the respective filter member positioned therein.

According to an embodiment of the present invention, the supporting member comprises a frame-shaped supporting body and has a through hole, wherein the supporting body is provided outside of the photosensitive area of the photosensitive element, wherein the photosensitive area of the photosensitive element is correspondingly disposed in the through hole, wherein a part of the supporting body is covered by the molded body.

According to an embodiment of the present invention, part of the periphery area of the circuit board is covered by the supporting body.

According to an embodiment of the present invention, at least a part of the non-photosensitive area of the photosensitive element is covered by the supporting body.

According to an embodiment of the present invention, a part of the periphery area of the circuit board and at least a part of the non-photosensitive area of the photosensitive element are covered by the supporting body.

According to an embodiment of the present invention, the array camera module further comprises at least one supporting member and at least one filter member, wherein the at least one filter member is mounted on the at least one supporting member, wherein the at least one supporting member is mounted on the top surface of the molded body such that the at least one filter member is held between the respective optical lens and the respective photosensitive element.

According to the present invention, the foregoing and other objects and advantages are attained by an electronic device, comprising:
an electronic device body; and
the array camera module, wherein the array camera module is disposed on the electronic device body for acquiring an image.

According to the present invention, the foregoing and other objects and advantages are attained by a camera module, which comprises:
at least one circuit board;
at least one optical lens;
at least one protective frame;
at least one photosensitive chip, wherein the protective frame is convexly disposed on an outer peripheral of the photosensitive area of the photosensitive chip; and
at least one integrated package holder, wherein the integrated package holder is arranged to wrap the circuit board and the non-photosensitive area of the photosensitive chip so as to integrate the integrated package holder, the circuit board and the photosensitive chip, wherein the optical lens is disposed in a photosensitive path of the photosensitive chip while the photosensitive chip is electrically connected to the circuit board.

According to an embodiment of the present invention, a size of an inner side of the protective frame is larger than or equal to a size of the photosensitive area of the photosensitive chip.

According to an embodiment of the present invention, a size of an outer side of the protective frame is less than or equal to a size of the photosensitive chip.

According to an embodiment of the present invention, the protective frame has a predetermined elasticity.

According to an embodiment of the present invention, the camera module further comprises a cementing layer, wherein the cementing layer is disposed between the protective frame and an outer peripheral of the photosensitive area of the photosensitive chip to connect the protective frame and the outer peripheral of the photosensitive area of the photosensitive chip.

According to an embodiment of the present invention, the integrated package holder is further configured to wrap an outer side of the protective frame.

According to an embodiment of the present invention, the camera module further comprises a lens holding member, wherein the lens holding member is provided on the integrated package holder, wherein the optical lens is disposed on the lens holding member.

According to an embodiment of the present invention, the lens holding member is integrally formed with the integrated package holder.

According to an embodiment of the present invention, the lens holding member is a motor which is electrically connected to the circuit board.

According to an embodiment of the present invention, the camera module further comprises a filter member, wherein the filter member is disposed on top of the integrated package holder such that the filter member is positioned between the photosensitive chip and the optical lens.

According to the present invention, the foregoing and other objects and advantages are attained by a camera module, which comprises:

at least one circuit board;
at least one optical lens;
at least one protective frame;
at least one photosensitive chip;
at least one filter member, wherein the filter member is disposed on the photosensitive chip in an overlapping manner, wherein the protective frame is disposed on an outer peripheral of the filter member; and
at least one integrated package holder, wherein the integrated package holder is arranged to cover an outer peripheral of the filter member and the circuit board, such that the integrated package holder, the filter member, the photosensitive chip, and the circuit board are integrally formed, wherein the optical lens is disposed in a photosensitive path of the photosensitive chip, wherein the photosensitive chip is electrically connected to the circuit board.

According to an embodiment of the present invention, a size of an inner side of the protective frame is greater than or equal to a size of the photosensitive area of the photosensitive chip, so that the protective frame is disposed away from the photosensitive area of the photosensitive chip.

According to an embodiment of the present invention, the protective frame has a predetermined elasticity.

According to an embodiment of the present invention, the camera module further comprises a cementing layer, wherein the cementing layer is disposed between the protective frame and the filter member to connect the protective frame and the outer peripheral of the filter member.

According to an embodiment of the present invention, the integrated package holder is further arranged to wrap an outer side of the protective frame.

According to an embodiment of the present invention, the camera module further comprises a lens holding member, wherein the lens holding member is provided on the integrated package holder and the optical lens is disposed on the lens holding member.

According to an embodiment of the present invention, the lens holding member is integrally formed with the integrated package holder.

According to the present invention, the foregoing and other objects and advantages are attained by a method of manufacturing a camera module, comprising the following steps:

(a) connecting at least one photosensitive chip with at least one circuit board in an electrically conductive manner;
(b) providing at least one protective frame which is disposed on an outer peripheral of the photosensitive area of the photosensitive chip;
(c) pressing a protective surface of an upper mold of a molding-die to the protective frame to isolate the photosensitive area with the non-photosensitive area of the photosensitive chip;
(d) wrapping the circuit board and the non-photosensitive area of the photosensitive chip by a molding material filled in the molding-die to form an integrated package holder integrating with the photosensitive chip and the circuit board after the molding material is solidified and cured; and
(e) providing at least one optical lens which is disposed in a photosensitive path of the photosensitive chip to form the camera module.

According to an embodiment of the present invention, in the step (b), a protective film is provided on an upper portion of the protective frame such that the protective film is correspondingly disposed to the photosensitive area of the photosensitive chip, wherein after the step (d), the protective film is removed from the protective frame.

According to an embodiment of the present invention, a recess is formed in a part of the upper mold of the molding-die corresponding to the photosensitive area, wherein in the step (c), the pressing surface of the upper mold is kept with a safe distance from the photosensitive area of the photosensitive chip.

According to an embodiment of the present invention, a covering film is provided on the pressing surface of the upper mold of the molding-die.

According to an embodiment of the present invention, in the step (d), an outer surface of the protective frame is covered by the molding material to integrally form the integrated package holder with the photosensitive chip, the circuit board, and the protective frame.

According to an embodiment of the present invention, before the step (e), the method further comprises a step of:
attaching at least one filter member to the top of the integrated package holder, wherein the filter member is held between the photosensitive chip and the optical lens.

According to an embodiment of the present invention, in the step (b), a cementing layer is formed between the outer peripheral of the protective frame and the photosensitive area of the photosensitive chip, wherein the cementing layer is connected with the protective frame and the outer peripheral of the photosensitive chip.

According to an embodiment of the present invention, the protective frame and/or the outer peripheral of the photosensitive chip is covered with a glue to form the cementing layer after the glue curing.

According to an embodiment of the present invention, the glue is cured by heat or UV light.

According to the present invention, the foregoing and other objects and advantages are attained by a method of manufacturing a camera module, which comprises the following steps:

(A) connecting at least one photosensitive chip and at least one circuit board in an electrically conductive manner;
(B) overlapping a filter member on the photosensitive chip;
(C) providing at least one protective frame, wherein the protective frame is disposed on an outer peripheral of the filter member;
(D) pressing the protective frame through the pressing surface of an upper mold of a molding-die to isolate the inner region and the outer peripheral of the filter member;
(E) wrapping the circuit board and the outer peripheral of the filter member by a molding material filled in the molding-die to form an integrated package holder combined with a filter member, the photosensitive chip and the circuit board after the molding material is solidified and cured; and
(F) providing at least one optical lens, wherein the optical lens is disposed in the photosensitive path of the photosensitive chip to form the camera module.

According to an embodiment of the present invention, in the step (E), the molding material further comprises an outer surface of the protective frame to form an integrated package holder combined with the filter member, the photosensitive chip and the circuit board after the molding material is solidified and cured.

According to an embodiment of the present invention, in order to achieve the above objectives and advantages and other advantages, a camera module is provided, which comprises:

at least a circuit board;

at least one optical lens;

at least one insulating member;

at least one photosensitive element having a photosensitive area and a non-photosensitive area provided thereon;

at least one insulating member provided around the periphery of at least the photosensitive area of the photosensitive element for insulating the photosensitive area from the non-photosensitive area; and at least one integral encapsulating support structure integrally enclosing, casing and/or covering the circuit board and at least a part of the non-photosensitive area of the photosensitive element, wherein the integral encapsulating support structure, the photosensitive element and the circuit board are combined to form an integral structure, wherein the optical lens is installed along a photosensitive path of the photosensitive element and the photosensitive element is electrically connected with the circuit board.

According to an embodiment of the present invention, the camera module further comprises a camera lens holding member, wherein the camera lens holding member is provided on the integral encapsulating support structure and the optical lens is supported on the camera lens holding member.

According to an embodiment of the present invention, the integral encapsulating support structure integrally is extended to form the camera lens holding member.

According to an embodiment of the present invention, the camera module further comprises at least a driver such as a motor, wherein the driver is installed on the integral encapsulating support structure and is electrically connected with the circuit board, wherein the optical lens is installed on the driver.

According to an embodiment of the present invention, the camera module further comprises at least one filter member, wherein the filter member is disposed on top of the integral encapsulating support structure.

According to an embodiment of the present invention, the camera module further comprises a set of electrical components such as resistance-capacitance components, wherein the resistance-capacitance components are attached on the circuit board, wherein the integral encapsulating support structure encloses, cases, and/or wraps up the resistance-capacitance components and the bonding wires therein.

According to an embodiment of the present invention, the insulating member is formed by solidified elastic material such as solidified adhesive, rubber, silicon, and polyester material.

According to an embodiment of the present invention, the material that formed the insulating member is preferably to further have a stickiness after solidification, so as to stick dust within the camera module. Certainly, in other embodiments, the material may also have no stickiness after solidification. The present invention shall not be limited with this feature.

According to an embodiment of the present invention, the insulating member formed by solidified material has a predetermined elasticity.

According to an embodiment of the present invention, the integral encapsulating support structure is covered by the peripheral surface of the insulating member.

According to another aspect of the present invention, the present invention provides a camera module, which comprises:

at least one circuit board;

at least one optical lens;

at least one insulating member;

at least one photosensitive element and at least one filter member, wherein the filter member is provided above the photosensitive element, wherein the insulating member is disposed on the periphery of the filter member; and an integral encapsulating support structure, wherein the integral encapsulating support structure encloses, cases and/or wraps up the circuit board and an outer area of the filter member, so that when the integral encapsulating support structure is formed, the integral encapsulating support structure, the filter member, the photosensitive element, and the circuit board integrally combine together to form an integral structure, wherein the optical lens is supported along a photosensitive path of the photosensitive element, wherein the photosensitive element is electrically connected with the circuit board.

According to an embodiment of the present invention, the present invention also provides a manufacturing method of camera module, wherein the manufacturing method comprises the following steps:

(a) electrically connecting at least one photosensitive element with at least one circuit board;

(b) placing the circuit board and the photosensitive element in a molding-die;

(c) providing an insulating member between the photosensitive element and a bottom surface of an upper mold of the molding-die, wherein the insulating member is positioned around the periphery around at least the photosensitive area of the photosensitive element;

(d) enclosing, casing and/or wrapping up the circuit board and a non-photosensitive area of the photosensitive element and the circuit board by a molding material added in the molding-die, so as to form an integral encapsulating support structure after the molding material is solidified that integrally combines the photosensitive element and the circuit board to form an integral structure; and (e) providing at least one optical lens, wherein the optical lens is supported along a photosensitive path of the photosensitive element, whereby the camera module is manufactured.

According to an embodiment of the present invention, an inner recess is formed in the upper mold of the molding-die at an area corresponding to the photosensitive element. According to an embodiment of the present invention, a covering film is provided on a bottom surface of the upper mold of the molding-die.

According to an embodiment of the present invention, in the step (d), the molding material encloses, cases and is covered by the circuit board.

According to an embodiment of the present invention, the integral encapsulating support structure is formed to enclose and cover the non-photosensitive area of the photosensitive element positioned outside the insulating member and an outer peripheral surface of the insulating member.

According to an embodiment of the present invention, in the above steps, an insulating material is applied along the periphery of the photosensitive element to form the insulating member on the periphery of the photosensitive element after the insulating member is solidified.

According to an embodiment of the present invention, glue or spray adhesive is used as the insulating member in the above step (c).

According to an embodiment of the present invention, the integral encapsulating support structure is made by injection molding, compression molding or pressing mold technology.

According to an embodiment of the present invention, the adhesive to be used as the insulating member is solidified by damp, heat, UV (Ultraviolet) lighting, or other solidifying reaction.

According to an embodiment of the present invention, the camera module can be fixed focus camera module or zoom camera module.

According to another aspect of the present invention, the present invention also provides a manufacturing method of camera module, wherein the manufacturing method comprises the following steps:

(A) electrically connecting at least one photosensitive element with at least one circuit board;

(B) overlapping a filter member with the photosensitive element;

(C) placing the circuit board, the photosensitive element and the filter member in a molding-die;

(D) providing an insulating member between the optical filter and a bottom surface of an upper mold of the molding-die, wherein the insulating member is positioned at an outer peripheral edge of the optical filter;

(E) enclosing, casing and/or wrapping up the circuit board and the peripheral edge of the filter member by molding material filled in the molding-die to form an integral encapsulating support structure that integrally combines with the filter member, the photosensitive element and the circuit board after the molding material is solidified; and (F) providing at least one optical lens, wherein the optical lens is supported along a photosensitive path of the photosensitive element, whereby the camera module is manufactured.

Still further objects and advantages will become apparent from a consideration of the ensuing description and drawings.

These and other objectives, features, and advantages of the present invention will become apparent from the following detailed description, the drawings, and the appended claims.

DETAILED DESCRIPTION OF THE PREFERRED EMBODIMENT

Figure 1:
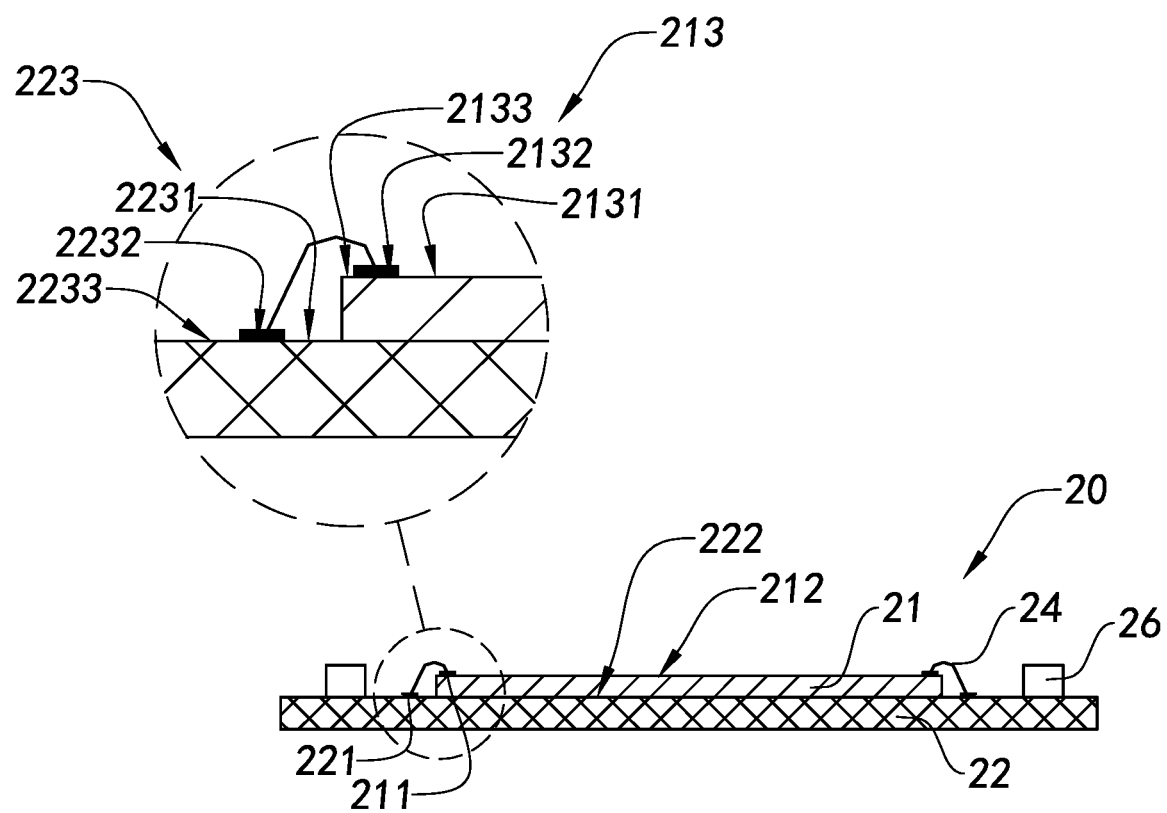
FIG. 1 is a schematic view of one of the manufacturing steps of a camera module according to a preferred embodiment of the present invention, illustrating that the photosensitive element of the camera module is mounted on the circuit board and the non-photosensitive area of the photosensitive element is connected with the circuit board by a set of wires.

The following description is disclosed to enable any person skilled in the art to make and use the present invention. Preferred embodiments are provided in the following description only as examples and modifications will be apparent to one skilled in the art. The general principles defined in the following description would be applied to other embodiments, alternatives, modifications, equivalents, and applications without departing from the spirit and scope of the present invention.

According to FIGS. 1 to 7 of the drawings of the present invention, a camera module according to a preferred embodiment of the present invention is illustrated, wherein the camera module comprises at least one optical lens 10 and at least one molded photosensitive assembly 20. The at least one molded photosensitive element 20 further comprises a photosensitive element 21, a circuit board 22, a molded base 23, and a set of wires 24, wherein each of the wires 24 has two ends extended to be connected to a non-photosensitive area of the photosensitive element 21 and the circuit board 22, wherein the molded base 23 is integrally molded with the circuit board 22, so that the molded base 23 and the circuit board 22 are formed in an integrated structure, and the at least one optical lens 10 is disposed in a photosensitive path of the photosensitive element 21 of the molded photosensitive element 20. Light reflected by an object enters the inside of the camera module from the optical lens 10 to be received and photoelectrically converted by the photosensitive element 21 subsequently, for obtaining an image about the object.

It is worth to mention that the photosensitive element 21 has a set of chip connectors 211, and the circuit board 22 has a set of circuit connectors 221, wherein two ends of each of the wires 24 can be respectively connected to the respective chip connector 211 of the photosensitive element 21 and the respective circuit connector 221 of the circuit board 22 in such a manner that the photosensitive element 21 and the circuit board 22 are electrically connected. For example, in the present invention, each of the chip connectors 211 of the photosensitive element 21 and each of the circuit connectors 221 of the circuit board 22 may be a pad. That is, each of the chip connectors 211 of the photosensitive element 21 and each of the circuit connectors 221 of the circuit board 22 may be in a round shape for connecting with the two ends of each of the wires 24 to connect the respective chip connector 211 of the photosensitive element 21 and the respective circuit connector 221 of the circuit board 22. For another example in the present invention, each of the chip connectors 211 of the photosensitive element 21 and each of the circuit connectors 221 of the circuit board 22 may be in spherical shape, such as solder paste or the like. A solder material is placed on the photosensitive element 21 and the circuit board 22 to form the chip connector 211 of the photosensitive element 21 and the circuit connector 221 of the circuit board 22. Nevertheless, the shape of the chip connector 211 of the photosensitive element 21 and the circuit connector 221 of the circuit board 22 is not limited in the present invention.

The photosensitive element 21 comprises a photosensitive area 212 and a non-photosensitive area 213, wherein the photosensitive area 212 and the non-photosensitive area 213 of the photosensitive element 21 are integrally formed, wherein the photosensitive area 212 is positioned in the middle of photosensitive element 21 and the non-photosensitive area 213 is positioned at the periphery of the photosensitive element 21, wherein the photosensitive area 212 is circularly surrounded by the surrounding non-photosensitive area 213. After the light reflected by the object enters the inside of the camera module from the optical lens 10, it can be received and photoelectrically converted by the photosensitive area 212 of the photosensitive element 21 to obtain an image associated with the object.

One skilled in the art will understand that each of the chip connectors 211 of the photosensitive element 21 is disposed in the non-photosensitive area 213 of the photosensitive element 21. In addition, the non-photosensitive area 213 of the photosensitive element 21 has a chip-inner portion 2131, a chip-connecting portion 2132, and a chip-outer portion 2133, wherein the photosensitive area 212 is surrounded by the chip-inner portion 2131. Both sides of the chip-connecting portion 2132 are respectively extended and connected to the chip-inner portion 2131 and the chip-outer portion 2133. That is, from a position where the chip connector 211 is disposed to a position of the periphery of the photosensitive area 212 to the non-photosensitive area 213 is defined as the chip-inner portion 2131, wherein an area where the chip connector 211 is disposed on the non-photosensitive area 213 is defined as the chip-connecting portion 2132, wherein an area from the position where the chip connector 211 is disposed on the non-photosensitive area 213 to the outer periphery of the photosensitive element 21 is defined as the chip-outer portion 2132. In other words, from the top view of the photosensitive element 21, in order from the outer periphery to the inside, the photosensitive element 21 is formed by the chip-outer portion 2133, the chip-connecting portion 2132, the chip-inner portion 2131, and the photosensitive area 212.

In addition, the circuit board 22 comprises a flat chip mounting area 222 and a periphery area 223, wherein the periphery area 223 is integrally formed with the chip mounting area 222, and the periphery area 223 is positioned near the periphery of the mounting area 222. The chip mounting area 222 is adapted to mount the photosensitive element 21 thereon, and the circuit connector 221 is disposed on the periphery area 223. The periphery area 223 of the circuit board 22 has a circuit-inner portion 2231, a circuit-connecting portion 2232, and a circuit-outer portion 2233. The chip mounting area 222 is surrounded by the circuit-inner portion 2231. The two sides of the circuit-connecting portion 2232 are respectively extended and connected to the circuit-inner portion 2231 and the circuit-outer portion 2233. That is, an area from a position where the board connector 221 is disposed on the periphery area 223 to a position of the periphery of the chip mounting area 222 is defined as the circuit-inner portion 2231, an area of the periphery area 223 where the circuit connector 221 is disposed is defined as the circuit-connecting portion 2232, and an area from the position where the circuit connector 221 is disposed on the periphery area 223 to the outer edge of the periphery area 223 is defined as the circuit-outer portion 2233. In other words, from the top view of the circuit board 22, in order from the inside to the outer edge, the circuit board 22 is formed by the circuit-outer portion 2233, the circuit-connecting portion 2232, the circuit-inner portion 2231, and the chip mounting area 222. The type of the wires 24 is not limited in the camera module of the present invention. For example, in one specific example, the wires 24 each may be implemented as a gold wire, that is in a manner of connecting gold wires between the photosensitive element 21 and the circuit board 22, so that the optical signal after converting into an electrical signal in the photosensitive element 21 can be further transmitted to the circuit board 22 through the wires 24. One skilled in the art will understand that in other examples of the camera module, the wire 24 can be implemented as a silver wire, a copper wire, or the like that the material can realize transferring the electrical signal between the photosensitive element 21 and the circuit board 22.

In addition, in one example, the camera module can be implemented as a fixed focus camera module, wherein the optical lens 10 is held in the photosensitive path of the photosensitive element 21 by a lens holder mounted on the molded base 23 of the camera module.

In another example, the camera module can be implemented as a zoom camera module, wherein the focal length of the camera module is adjusted by changing the distance between the optical lens 10 and the photosensitive element 21. Specifically, in the example shown in FIG. 7, the camera module further comprises at least one driver 30, wherein the optical lens 10 is disposed correspondingly to the at least one driver 30, wherein the driver 30 is mounted on the molded base 23 and is electrically and respectively connected to the circuit board 22 to drive the optical lens 10 to move along the photosensitive path of the photosensitive element 21 by the driver 30 after transmitting power and control signals with the circuit board 22 to the driver 30, thereby adjusting the focal length of the camera module. That is, the optical lens 10 is drivably disposed with respect to the driver 30.

It is worth to mention that the type of the driver 30 of the camera module is not limited in the present invention. For example, in one example, the driver 30 can be implemented as a drive unit, such as a voice coil motor, to move the optical lens 10 along the photosensitive path of the photosensitive element 21, wherein the driver 30 is capable of receiving electrical power and control signals to be in an operational state.

Figure 7:
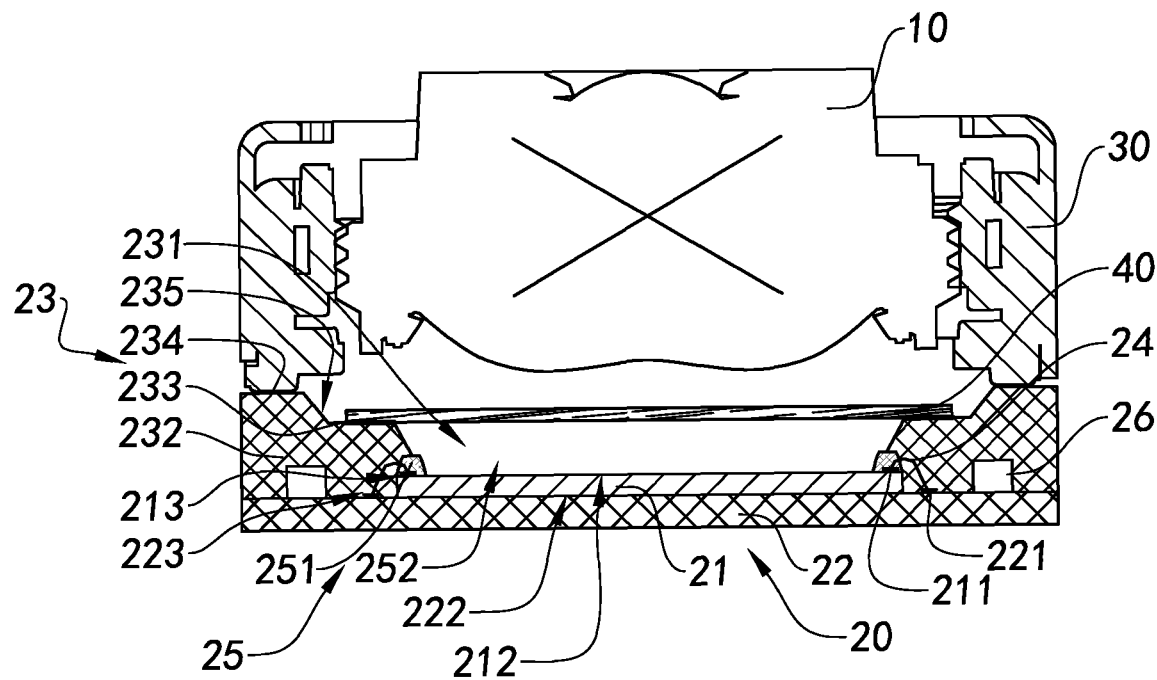
FIG. 7 is a schematic view of one of the manufacturing steps of the camera module according to the above preferred embodiment of the present invention, illustrating that an optical lens of the camera module is mounted on a driver, wherein the driver is mounted on the molded base to manufacture the camera module.

Furthermore, according to FIG. 7, the camera module further comprises at least one filter member 40, wherein the at least one filter member 40 is mounted on each of the molded base 23 and positioned in the photosensitive path of each of the photosensitive elements 21. The light reflected by the object enters the inside of the camera module from the optical lens 10 and is filtered by the filter member 40 to be received and photoelectrically converted by the photosensitive element 21. That is, the filter member 40 can filter stray light reflected by the object from the optical lens 10 into the interior of the camera module, such as an infrared light. In such a manner, the imaging quality of the camera module is improved.

One skilled in the art will understand that in different examples of the camera module, the filter members 40 can be implemented with different types, for example, the filter members 40 can be implemented as infrared cutoff filters, full transmissive spectral filters, and other filters or a combination of multiple types of filters. For example, the filter member 40 can be implemented as a combination of an infrared cutoff filter and a full transmissive filter that is the infrared cutoff filter and the full transmissive spectral filter can be selectively switched to be positioned along the photosensitive path of the photosensitive element 21. For example, in an environment where light is sufficient during daytime, the infrared cutoff filter may be chosen in the photosensitive path of the photosensitive element 21 to filter infrared rays reflected by the object entering the camera module. When the camera module is used in a dark environment, such as a dark night, the full-transmission spectral filter can be chosen in the photosensitive path of the photosensitive element 21 to allow the infrared part of the light reflected by the object entering the camera module.

According to FIG. 7, the molded photosensitive assembly 20 of the camera module further comprises a supporting member 25, wherein the supporting member 25 is disposed on the non-photosensitive area 213 of the photosensitive element 21 before the molded base 23 is molded. After the molded base 23 is molded, the circuit board 22, the non-photosensitive area 213 of the photosensitive element 21, and a part of the supporting member 25 is covered by the molded base 23 to form the molded photosensitive assembly 20, wherein the supporting member 25 can effectively improve the product yield of the camera module and improve the imaging quality of the camera module. In the following description, features and advantages of the supporting member 25 will be further illustrated and disclosed.

Furthermore, the supporting member 25 has a top surface 2501, an inner surface 2502 and an outer surface 2503, wherein the two sides of the top surface 2501 are respectively connected to the inner surface 2502 and the outer surface 2503. It is worth mentioning that the side of the supporting member 25 facing the photosensitive element 21 is defined as the inner surface 2502 of the supporting member 25 and the side of the supporting members 25 facing the circuit board 22 is defined as the outer surface 2503 of the supporting member 25.

According to FIG. 7, the molded photosensitive assembly 20 of the camera module further comprises a plurality of electronic components 26, wherein each of the electronic components 26 can be mounted on the periphery area 223 of the circuit board 22 by a process such as SMT (Surface Mount Technology). Preferably, each of the electronic components 26 is mounted on the circuit-outer portion 2233 of the periphery area 223. The photosensitive element 21 and each of the electronic components 26 may be mounted on the same side or opposite sides of the circuit board 22. For example, the photosensitive element 21 and each of the electronic components 26 are mounted on the same side of the circuit board 22, the photosensitive element 21 is mounted on the chip mounting area 222 of the circuit board 22, and each of the electronic components 26 is mounted on the periphery area 223 of the circuit board 22. After the molded base 23 is integrally molded to the circuit board 22, each of the electronic components 26 is covered by the molded base 23 to be isolated from the adjacent electronic components 26. Even the distance between two of the adjacent electronic components 26 is relatively close, the molded base 23 can prevent the adjacent electronic components 26 from contacting or interfering with each other by isolating the adjacent electronic components 26 with the photosensitive element 21 in the camera module of the present invention. And in a manner that the electronic components 26 are covered by the molded base 23, it can also be avoided the electronic contaminants generated on the surface of the electronic components 226 from contaminating the photosensitive area 212 of the photosensitive element 21, thereby reducing the size of the camera module and improving the imaging quality of the camera module. That is, the circuit board 22 in a small area can be mounted with more electronic components 26 of the camera module of the present invention by covering the electronic components 26 by the molded base 23. It is worth mentioning that the types of the electronic component 26 include, but are not limited to, resistor, capacitor, driving device, and the like.

Figure 8:
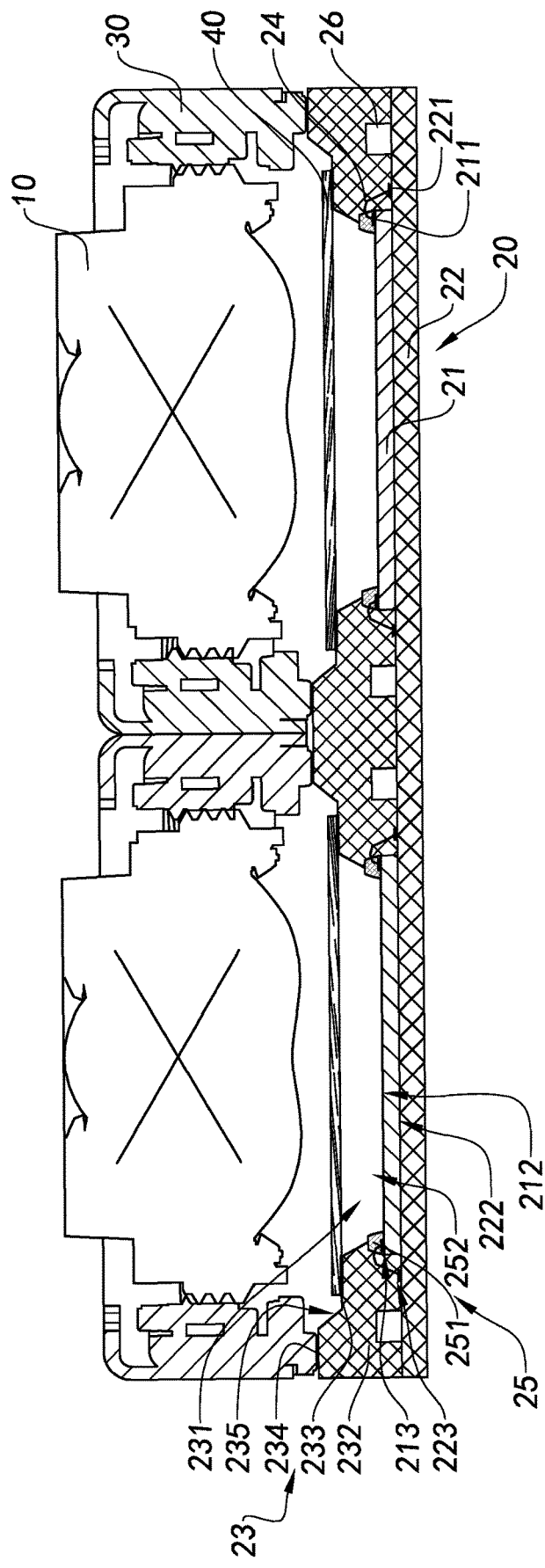
FIG. 8 is a schematic view of an alternative mode of the camera module according to the above preferred embodiment of the present invention.

In addition, it will be understood by one skilled in the art that, although the single camera module is taken as an example to disclose the manufacturing steps of the camera module and the manufacturing steps of the molded photosensitive assembly 20 as shown in FIG. 1 to FIG. 7, the camera module can also be implemented as a dual lens camera module or an array camera module as shown in FIG. 8, in which the invention should not be limited to the number of molded photosensitive assembly of the camera module.

The manufacturing steps of the camera module and the manufacturing steps of the molded photosensitive assembly 20 are illustrated as shown in FIGS. 1 to 7.

According to FIG. 1, the photosensitive element 21 is mounted on the chip mounting area 222 of the circuit board 22, and each of the chip connectors 211 of the non-photosensitive area 213 of the photosensitive element 21 and the circuit connectors 221 on the periphery area 223 of the circuit board 22 are connected by a set of the wires 24 respectively. Furthermore, each of the electronic components 26 is mounted on the circuit-outer portion 2233 of the periphery area 223 of the circuit board 22. That is, both ends of the wires 24 are respectively connected to the photosensitive element 21 and the circuit board 22, wherein each of the wires 24 upwardly protrudes on the surface of the photosensitive element 21. It can be understood that, limited to the wire bonding process of connecting the photosensitive element 21 and the circuit board 22 with the wires 24 and the characteristics of the wires 24 themselves. After the two ends of the wires 24 are respectively connected to the respective chip connector 211 of the non-photosensitive area 213 of the photosensitive element 21 and the respective circuit connector 221 of the periphery area 223 of the circuit board 22, the wires 24 need to be in an arc shape to be protruded on the upper surface of the photosensitive element 21. In addition, maintaining the arc shape of each of the wires 24 in a curved state facilitates the ability to transmit the electrical signals between the photosensitive element 21 and the circuit board 22. Each of the wires 24 is arranged between the photosensitive element 21 and the circuit board 22, for example, be equally spaced. One skilled in the art will understand that during the process of manufacturing the camera module and during using of the camera module, maintaining each of the wires 24 in this initial state has advantages for ensuring the ability of the wires 24 transmitting the electrical signals between the photosensitive element 21 and the circuit board 22 so as to ensure the image quality of the camera module.

It is to be mentioned that, in the camera module of the present invention, the wire bonding direction of the wires 24 is not limited. For example, the wire bonding direction of the wire wires 24 may be from the photosensitive element 21 to the circuit board 22, or from the circuit board 22 to the photosensitive element 21.

One skilled in the art will understand that although one of the photosensitive elements 21 is mounted on one of the circuit boards 22 as an example in FIG. 1, as illustrated in the manufacturing steps and the manufacturing steps of the camera module of the present invention are explained. In another example of the manufacturing steps of the molded photosensitive assembly 20 of the camera module, a plurality of the photosensitive elements 21 may be mounted on different positions of one of the circuit board 22 to be subsequently fabricated in a duel lens camera module or an array camera module. In another example, a plurality of the circuit boards 22 may be pieced together to form one of the circuit board, and then each of the photosensitive element 21 is respectively mounted on one of the pieced circuit board correspondingly to the position of the circuit board 22, so as to separate the pieced circuit board later. The invention is not limited in this way.

Figure 2A:
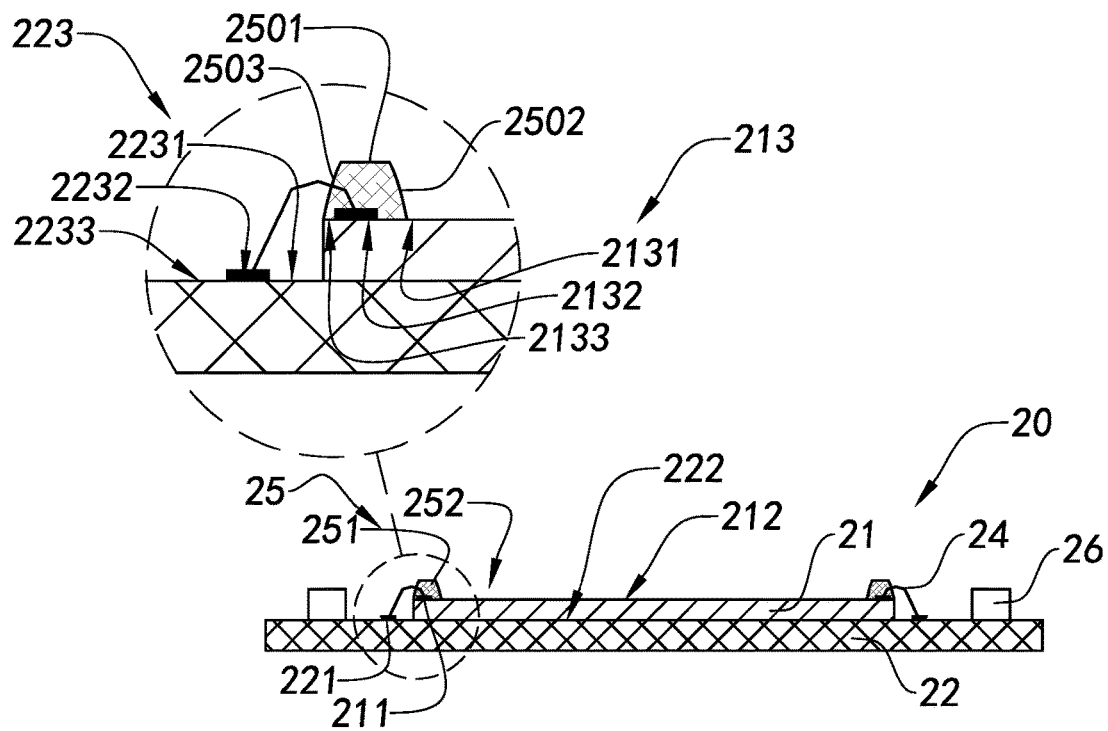
FIGS. 2A and 2B are a schematic view of one of the manufacturing steps of the camera module according to the above preferred embodiment of the present invention, illustrating that the supporting member of the camera module is disposed in the non-photosensitive area of the photosensitive element.
Figure 2B:
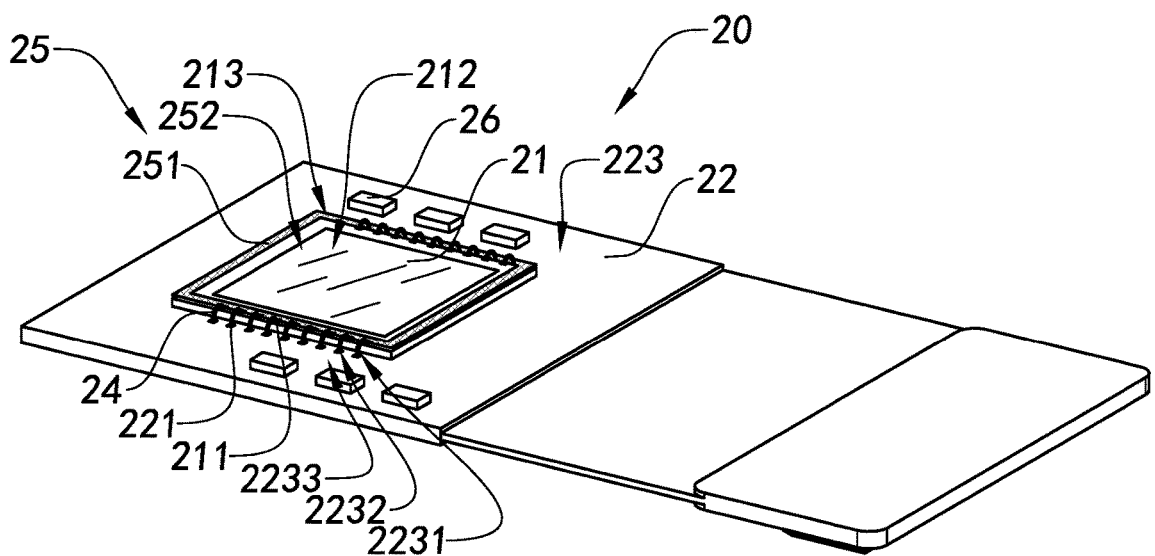

According to FIGS. 2A and 2B, the supporting member 25 is disposed on the non-photosensitive area 213 of the photosensitive element 21, so as to form a molded photosensitive assembly semi-finished product by the photosensitive element 21, the circuit board 22, and the supporting member 25, wherein the supporting member 25 is provided to cover the chip-inner portion 2131, the chip-connecting portion 2232, and the chip-outer portion 2233 of the non-photosensitive area 213 of the photosensitive element 21. In other words. The supporting member 25 can cover a part of each of the wires 24 to enable the wires 24 to be wrapped during manufacturing the camera module and during the molding of the photosensitive element 20 to improve the imaging quality of the camera module by protecting the good electrical properties of the wires 24. One skilled in the art will understand that in this embodiment of the camera module of the present invention, the chip connector 211 of the photosensitive element 21 is covered by the supporting member 25.

Furthermore, the supporting member 25 comprises a frame-shaped supporting body 251 and has a through hole 252, wherein the supporting body 251 is disposed on the non-photosensitive area 213 of the photosensitive element 21 to make the photosensitive area 212 of the photosensitive element 21 corresponding to the through hole 252 of the supporting member 25, so that the supporting body 251 can protect the photosensitive area 212 of the photosensitive element 21 during a molding process. The molded base 23 covers the outer surface 2503 of the supporting body 251 and at least a part of the top surface 2501 after molded. It is worth mentioning that the inner surface 2502 of the supporting member 25 forms the through hole 252 of the supporting member 25.

Preferably, the chip-inner portion 2131, the chip-connecting portion 2132, and the chip-outer portion 2133 of the photosensitive element 21 are covered by the supporting body 251, that is the supporting body 251 can cover the chip connector 211 of the supporting body such that the supporting body 251 can prevent the wires 24 and the connection position of the chip connector 211 from contacting the molding material for forming the molded base 23 to avoid the wires 24 being detached from the chip connector 211. It can be understood that when the supporting body 251 covers the wires 24 and the connection position of the chip connector 211, the supporting body 251 can isolate the wires 24 and the connection position of the chip connector 211 for preventing deformation of the end portion of each of the wires 24 connecting the chip connector 211 and detaching of the wires 24 from the chip connector 211 causing by the molding material during a molding process. In one embodiment, the supporting body 251 may be formed by a cured glue applied in the non-photosensitive area 213 of the photosensitive element 21, so that the supporting body 251 has a predetermined elasticity, wherein after the supporting body 251 is formed, the inner surface 2502 of the supporting body 251 forms the through hole 252 while the photosensitive area 212 of the photosensitive element 21 is positioned corresponding to the through hole 252. In addition, the supporting body 251 formed by the glue after cured may also have a viscosity for adhering contaminant such as dust subsequently, thereby preventing the contaminants from contaminating the photosensitive area 212 of the photosensitive element 21 to cause the stain point in the photosensitive area 212 of the photosensitive element 21 so as to further ensure the image quality of the camera module. For example, the supporting body 251 is disposed between the photosensitive area 212 of the photosensitive element 21 and the electronic component 26, thereby preventing contamination by contaminants, such as the solder powder generated during the electronic component 26 is mounted on the circuit board 22 from contaminating the photosensitive area 212 of the photosensitive element 21 in a way that the solder powder may be adhered by the supporting body 251.

Preferably, the supporting body 251 may cover the non-photosensitive area 213 of the photosensitive element 21 in a gel state and be formed after cured to prevent covering the non-photosensitive area 213 of the photosensitive element 21 flowing to contaminate the photosensitive area 212 of the photosensitive element 21. In other words, the glue has good plasticity and self-setting properties before cured to form the supporting body 251, so that the glue is not deformed during applying to the non-photosensitive area 213 of the photosensitive element 21 and curing. One skilled in the art will understand that the supporting body 251 formed by the glue can cover the wires 24 by applying the glue in a gel state to the non-photosensitive area 213 of the photosensitive element 21 to prevent damaging the wires 24 during applying of the glue to the non-photosensitive area 213 of the photosensitive element 21.

Figure 3A:
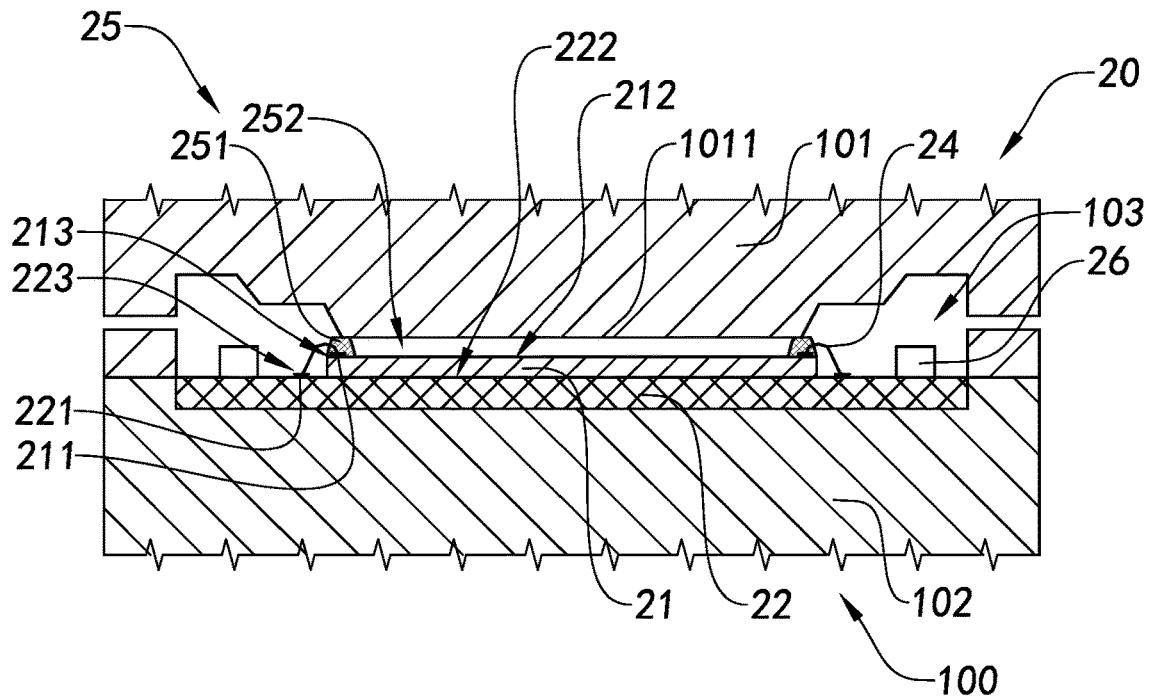
FIG. 3A is a schematic diagram of one of the manufacturing steps of the camera module according to the above preferred embodiment of the present invention, illustrating that the circuit board, the photosensitive element and the supporting member are placed in the molding-die between the upper mold and the lower mold, and the upper mold is pressed against the supporting member.

According to FIG. 3A, during the molding process, the molding material is solidified and cured by a molding-die 100 to form the molded base 23 which is at least integrally molded on the circuit board 22, such that the method can reduce the size of the camera module and reduce the assembly error of the camera module, thereby making the structure of the camera module more compact and improving the imaging quality of the camera module.

Specifically, the molding-die 100 comprises the upper mold 101 and the lower mold 102, wherein at least one of the upper mold 101 and the lower mold 102 can be moved to make the upper mold 101 and the lower mold 102 being operated to close the upper mold 101 and the lower mold 102 by a mold clamping operation, wherein at least one molding cavity 103 is formed between the upper mold 101 and the lower mold 102 and the molding material is filled in the molding cavity 103 to form the molded base 23 after solidifying and curing. For example, in one embodiment, the lower mold 102 is generally fixed, and the upper mold 101 can be moved relative to the lower mold 102 along at least a guiding rod to face the lower mold 102 to be clamped when the upper mold 101 is moved, thereby forming the molding cavity 103 between the upper mold 101 and the lower mold 102, and the molding-die 100 can be demolded while the upper mold 101 moving away from the lower mold 102. Or, in another example, the upper mold 101 is fixed, and the lower mold 102 can be moved relative to the upper mold 101 along the guiding rod to be clamped toward the upper mold 101, thereby forming the molding cavity 103 between the lower mold 102 and the upper mold 101, and that the molding-die 100 can be demolded while the lower mold 102 moving away from the upper mold 101.

The photosensitive element 21 and the circuit board 22 are electrically connected by a set of the wires 24 and the supporting body 251 is formed in the non-photosensitive area 213 of the photosensitive element 21 at to cover at least a part of each of the wires 24 to forming the molded photosensitive assembly semi-finished product. Place the molded photosensitive assembly semi-finished product on the lower mold 102 of the molding-die 100, and operate the upper mold 101 of the molding-die 100 and/or the lower mold 102 to clamp the upper mold 101 and/or the lower mold 102 to form the molding cavity 103 therebetween, wherein the photosensitive element 21, the circuit board 22 and the supporting member 25 are respectively partially in contact with the molding cavity 103 of the molding-die 100, wherein the pressing surface 1011 of the upper mold 101 is in contact with the top surface 2501 of the supporting body 251. The upper mold 101 is supported upwardly by the supporting body 251 to prevent the pressing surface 1011 of the upper mold 101 from being pressed against the wires 24.

For example, in this specific example of the present invention as illustrated in FIG. 7, the outside of the circuit board 22, the non-photosensitive area of the photosensitive element 21, and a part of the supporting member 25 are positioned in the molding cavity 103 of the molding-die 100 such that when the molded base 23 is molded in the molding cavity 103, the molded base 23 covers the outside of the circuit board 22, the non-photosensitive area of the photosensitive element 21, and a portion of the supporting member 25.

Therefore, it will be understood by one skilled in the art that the molding cavity 103 of the molding-die 100 may be an annular space to form a ring shape after the molding material is filled and cured in the molding cavity 103.

It is worth mentioning that the supporting body 251 has a predetermined elasticity so that when the molding-die 100 is closed and clamped for molding, the instantaneous impact force generated by the pressing surface 1011 of the upper mold 101 of the molding-die 100 against the top surface 2501 of the supporting body 251 is absorbed by the supporting body 251 to prevent the impact force from being further transmitted to the photosensitive element 21, thereby preventing the photosensitive element 21 from being damaged or avoiding the photosensitive element 21 being displaced relative to the circuit board 22 due to the impact force. One skilled in the art will understand that the supporting body 251 absorbs the impact force to prevent the impact force from being further transmitted to the photosensitive element 21, and also ensures that the flatness of the photosensitive element 21 mounted on the circuit board 22 is not affected, thereby ensuring the image quality of the camera module.

It is worth to mention that the supporting body 251 has a Shore hardness ranging from A50 to A80 and an elastic modulus ranging from 0.1 GPa to 1 GPa.

Preferably, in the example of the present invention as shown in FIG. 7, the height of the supporting body 251 may be implemented to be higher than or equal to the height of each of the wires 24 protruded upwardly. In the mold clamping operation of the molding-die 100, when the pressing surface 1011 of the upper mold 101 of the molding-die 100 is in contact with the top surface 2501 of the supporting body 251, the supporting body 251 can support the upper mold 101 upwardly which prevents the upper mold 101 from being pressed against the wires 24. For example, in one example, the height of the supporting body 251 is equal to the height of each of the wires 24 protruded upwardly, so that when the upper mold 101 and the lower mold 102 of the molding-die 100 are closed and clamped, the supporting body 251 supports the upper mold 101 upwardly so that the pressing surface 1011 of the upper mold 101 can contact the wires 24, but the pressing surface 1011 of the upper mold 101 does not press on the wire 24. In another example, the height of the supporting body 251 is higher than the height of each of the wires 24 protruded upwardly, so that when the upper mold 101 and the lower mold 102 of the molding-die 100 are closing and clamping, the supporting body 251 supports the upper mold 101 in an upward direction, so that the pressing surface 1011 of the upper mold 101 will not contact with the wires 24, thereby avoiding the pressing surface 1011 of the upper mold 101 being pressed on the wires 24. That is, the supporting body 251 can support the upper mold 101 in an upward direction to maintain a safe distance between the pressing surface 1011 of the upper mold 101 and the wires 24.

In addition, the supporting body 251 has a predetermined elasticity, and after the upper mold 101 and the lower mold 102 of the molding-die 100 are closed and clamped during molding, the pressing surface 1011 of the upper mold 101 is in contact with the top surface 2501 of the supporting body 251, wherein the pressure of the pressing surface 1011 of the upper mold 101 applied to the top surface 2501 of the supporting body 251 can cause slight deformation of the supporting body 251 for preventing a gap from being formed between the pressing surface 1011 of the upper mold 101 and the top surface 2501 of the supporting body 251. That is, the upper mold 101 of the molding module 100 can be closely matched with the supporting body 251 such that the photosensitive area of the photosensitive element 21 corresponding to the through hole 252 of the supporting member 25 is remained in a sealed environment to prevent the molding material entering the sealed environment to contaminate the photosensitive area of the photosensitive element 21 during the molding process.

Figure 3B:
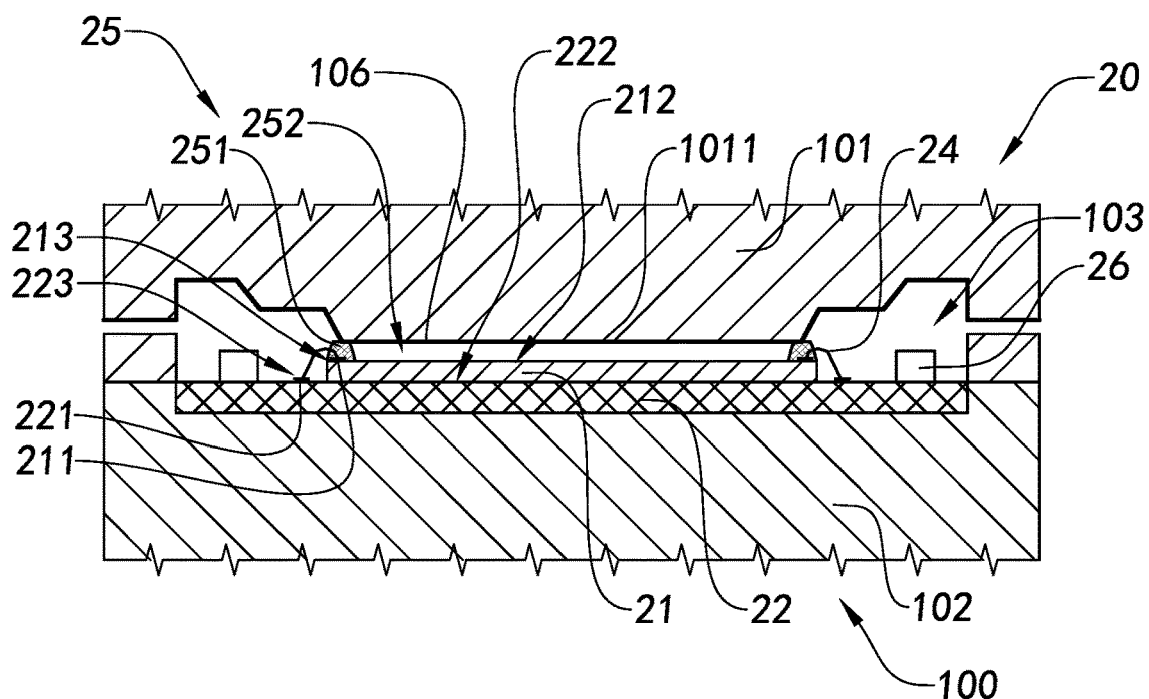
FIG. 3B is a schematic view of an alternative mode of one of the manufacturing steps of the camera module according to the above preferred embodiment of the present invention, illustrating that the circuit board, the photosensitive element and the supporting member are placed in a molding cavity between the upper mold and the lower mold of the molding-die, and a covering film is disposed between the pressing surface of the upper mold and the supporting member.

FIG. 3B shows an alternative mode of the embodiment of the molded photosensitive assembly 20 of the present invention, wherein the supporting member 25 can be made of a hard material. That is, when the supporting body 251 of the supporting member 25 is formed on at least a part of the non-photosensitive area 213 of the photosensitive element 21, and the pressing surface 1011 of the upper mold 101 of the molding-die 100 is pressed against the top surface 2501 of the supporting body 251 without deformation to ensure good electrical properties of the wires 24, thereby ensuring the yield of the camera module in the subsequent process and further ensuring the imaging quality of the camera module.

It is worth to mention that the supporting body 251 has a Shore hardness greater than D70 and a modulus of elasticity greater than 1 Fpa.

The molding-die 100 further comprises a covering film 106 adapted to be positioned between the pressing surface 1011 of the upper mold 101 and the top surfaces 2501 of the supporting body 251 during the closing and clamping of the upper mold 101 and the lower mold 102. Preferably, the covering film 106 may be placed on the pressing surface 1011 of the upper mold 101 before the upper mold 101 and the lower mold 102 are closed and clamped. The covering film 106 is disposed between the pressing surface 1011 of the upper mold 101 and the supporting body 251 and, on the one hand, a gap can be prevented being formed between the pressing surface 1011 of the upper mold 101 and the supporting body 251, such that the covering film 106 can absorb the impact force generated by the upper mold 101 and the clamped lower mold 102, thereby avoiding the photosensitive element 21, the circuit board 22, and the wires 24 being damaged when the upper mold 101 and the lower mold 102 is closed and clamped.

Figure 4:
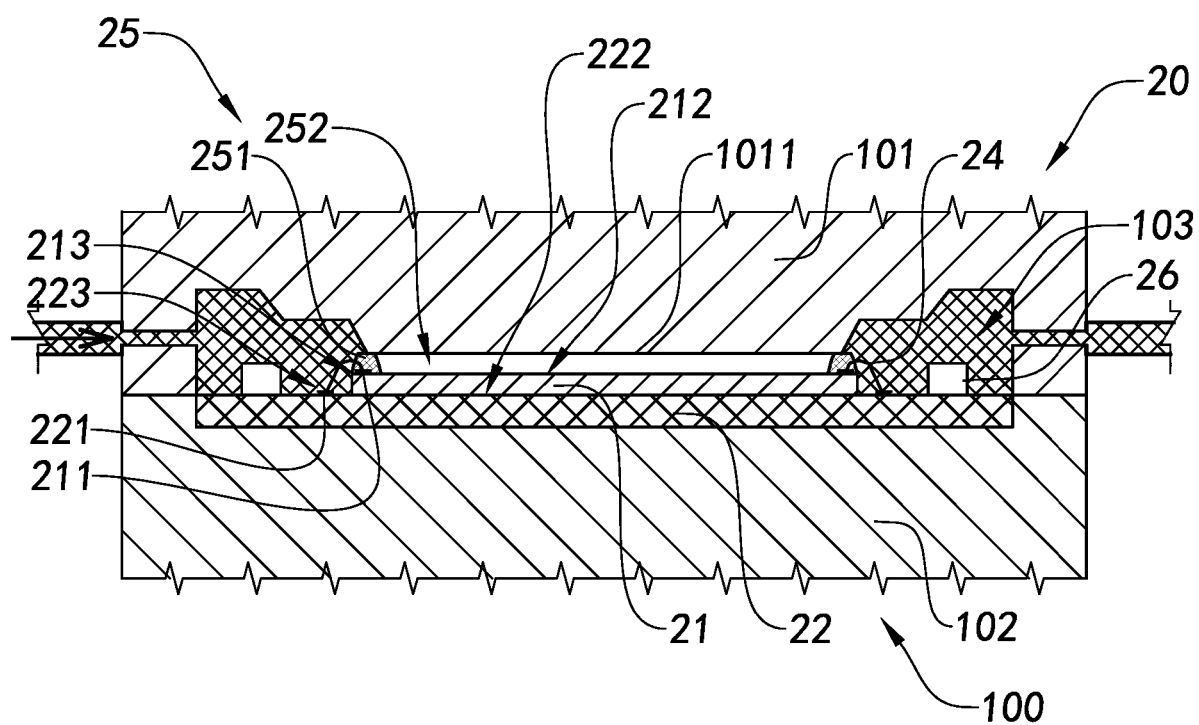
FIG. 4 is a schematic view of one of the manufacturing steps of the camera module according to the above preferred embodiment of the present invention, illustrating that a molding material for forming the molded base of the camera module is filled in the molding cavity formed between the upper mold and the lower mold.

According to FIG. 4, after the molten molding material is added into the molding cavity 103 of the molding-die 100, the molding material fills the entire molding cavity 103 where the photosensitive element 21 is disposed. The supporting body 251 formed on the non-photosensitive area 213 of the photosensitive element 21 can prevent the molding material from entering from a connection position of the supporting body 251 and the non-photosensitive area 213 of the photosensitive element 21 into the photosensitive area 212 of the photosensitive element 21. In addition, the supporting body 251 can prevent any gap formed between the pressing surface 1011 of the upper mold 101 and the top surface 2501 of the supporting body 251 due to deformation, thereby preventing the molding material entering into the sealing environment from a connection position of the top surface 2501 of the supporting body 251 and the pressing surface 1011 of the upper mold 101, that can avoid occurrence of "flashing" after the molding material is solidified.

It is worth to mention that the molding material in fluid form according to the present invention may be a liquid material or a solid particulate material or a mixed material of liquid and solid particles. It can be understood that whether the molding material is implemented as a liquid material or implemented as a solid particulate material or as a liquid and solid particulate mixed material, after being added into the molding cavity 103 of the molding-die 100, the molding material can be solidified and cured to form the molded base 23. For example, in this specific example of the invention, the flowing molding material is embodied as a liquid thermosetting material, wherein the molding material is solidified and cured after being filled in the molding cavity 103 of the molding-die 100 to form the molded base 23. It is worth mentioning that, when the molding material is added into the molding cavity 103 of the molding-die 100, the manner of how the flowing molding material is solidified and cured is not limited in the present invention.

Figure 5:
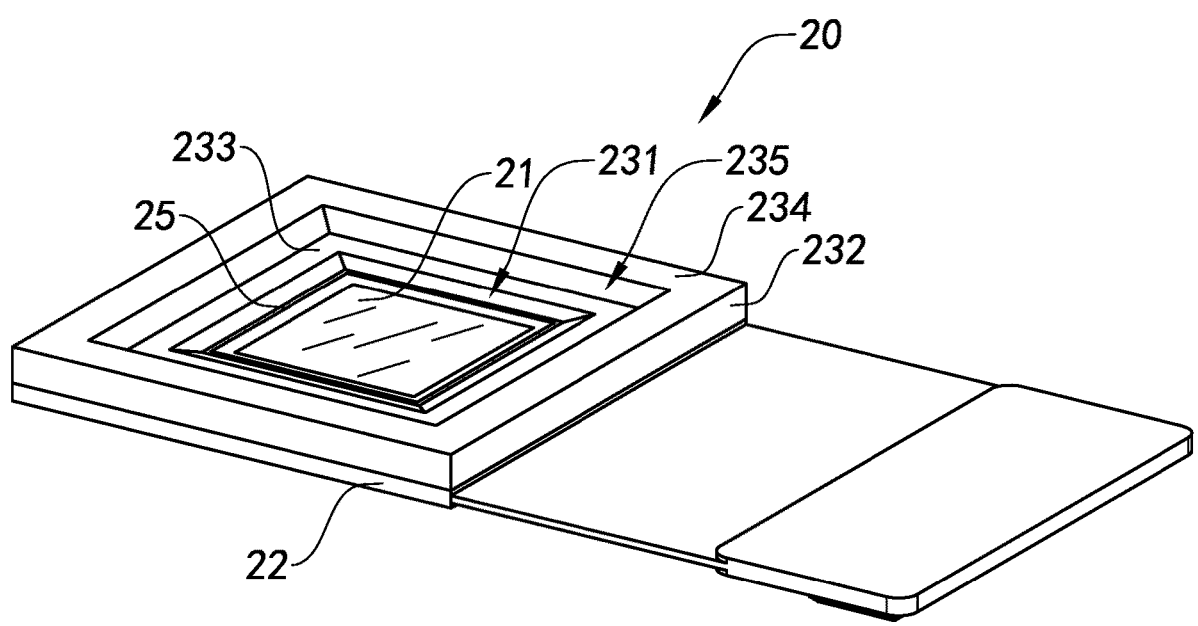
FIG. 5 is a perspective view of one of the manufacturing steps of the camera module according to the above preferred embodiment of the present invention, illustrating that the molding material is solidified and cured to form the molded base.

According to FIG. 5, the supporting body 251 is disposed on the non-photosensitive area 213 of the photosensitive element 21, wherein after the molding material is added into the molding cavity 103 of the molding-die 100, the supporting body 251 can prevent the molding material from entering the photosensitive area 212 of the photosensitive element 21, so that after the molding material is solidified and cured to form the molded base 23, a light window 231 of the molded base 23 is formed with respect to the photosensitive area 212 of the photosensitive element 21. Accordingly, the light window 231 of the molded base 23 allows light to pass through and to be received by the photosensitive element 21, wherein the photosensitive area 212 receives and performs photoelectric conversion. That is, the molding material filled in the molding cavity 103 of the molding-die 100 forms a molded body 232 of the molded base 23 and the light window 231 is formed in a middle portion of the molded base 23 after curing. In other words, the molded base 23 comprises the molded body 232 and has the light window 231, which provides a light path between the optical lens 10 and the photosensitive element 21. After the light reflected by an object enters the interior of the camera module from the optical lens 10, it is photoelectrically converted through the light window 231 of the molded base 23 and is received by the photosensitive area 212 of the photosensitive element 21.

It is worth mentioning that, after the molded base 23 is formed, the molded base 23 covers each of the electronic components 26, thereby isolating each of the electronic components 26 by the molded base 23. The electronic components 26 and the photosensitive element 21 are isolated by the molded base 23 in such a manner that, even the adjacent electronic components 26 are relatively close with each other, the molded base 23 can also prevent the adjacent electronic components 26 from contacting with each other and the contaminants generated by the electronic components 26 from contaminating the photosensitive area of the photosensitive element 21 to improve the imaging quality of the camera module.

Figure 6:
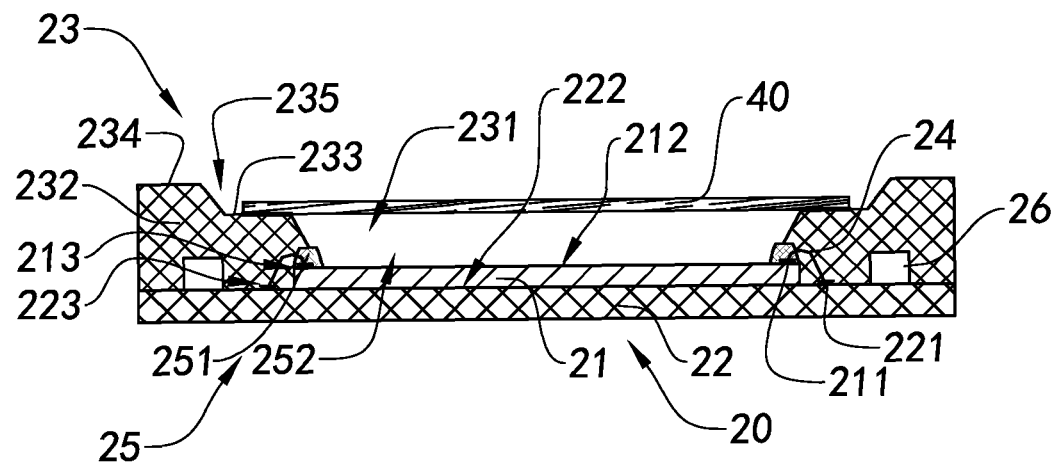
FIG. 6 is a schematic view of one of the manufacturing steps of the camera module according to the above preferred embodiment of the present invention, illustrating that a filter member of the camera module is mounted on the molded base.

According to FIG. 6, the filter member 40 is mounted on the top surface of the molded base 23, such that the light window 231 of the molded base 23 is sealed by the filter member 40. Therefore, the light from the optical lens entering the inside of the camera module can be further filtered by the filter member 40 to improve the imaging quality of the camera module.

Furthermore, the top surface of the molded base 23 forms an inner surface 233 and an outer surface 234, wherein in one example, the inner surface 233 and the outer surface 234 of the molded base 23 are on the same level. The top surface of the molded base 23 is formed into a whole flat plane, wherein the filter member 40 is mounted on the inner surface 233 of the molded base 23, wherein the driver 30 or the lens holder is mounted on the outer surface 234 of the molded base 23, or the optical lens 10 is directly mounted on the outer surface 234 of the molded base 23. In another example, the inner surface 233 of the molded base 23 may be positioned lower than the plane in which the outer surface 234 is positioned, thereby the top surface of the molded base 23 forms a stepped shape. A surface in which the inner surface 233 of the molded base 23 is positioned lower than a plane in which the outer surface 234 is positioned forms a recess 235 of the molded base 23, wherein the filter member 40 mounted on the inner surface 233 of the molded base 23 is received in the recess 235 of the molded base 23 and the driver 30 is mounted on the outer surface 234 of the molded base 23, such that the optical lens 10 mounted on the driver 30 is further held in the photosensitive path of the photosensitive element 21, as shown in FIG. 7, thereby the camera module is manufactured.

Figure 9A:
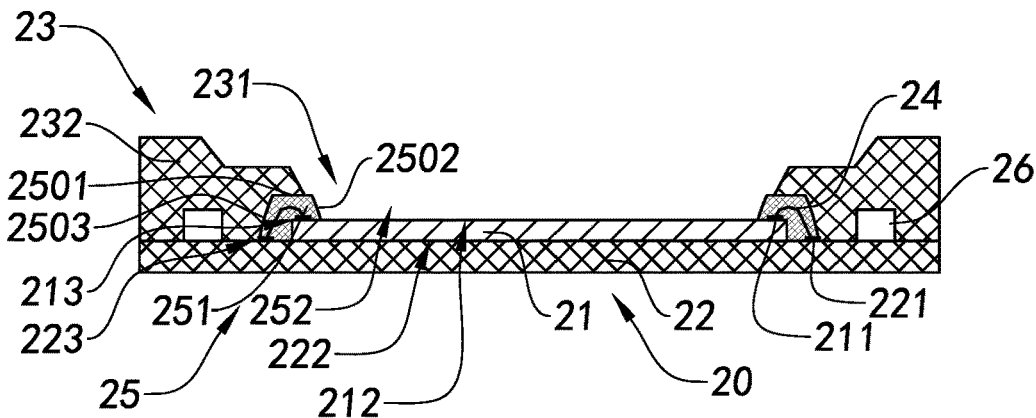
FIG. 9A is a schematic view of a first alternative mode of a molded photosensitive assembly of the camera module according to the above preferred embodiment of the present invention.

According to FIG. 9A, a first alternative mode of the above embodiment of the camera module of the present invention is illustrated, which is different from the above-described embodiment of the camera module of the present invention that each of the wires 24 of the plastic photosensitive element 20 is entirely covered inside the supporting body 251 of the camera module of the present invention.

Specifically, the supporting body 251 covers at least a part of the chip-inner portion 2131, the chip-connecting portion 2132, the chip-outer portion 2133, the circuit-inner portion 2231, the circuit-connecting portion 2232, and at least a part of the circuit-outer portion 2233, wherein the supporting body 251 not only covers an extended portion of the wires 24 but also covers the connection positions of the wires 24 and the photosensitive element 21 and the chip connector 211 as well as the connection positions of the circuit connector 221 of the circuit board 22 and the wires 24, so as to pre-fix the wires 24 by the supporting body 251. Thus, in the subsequent molding process to form the molded base 23, while the upper mold 101 and the lower mold 102 of the molding-die 100 are closed and clamped, the pressing surface 1011 of the upper mold 101 is in contact with the top surface 2501 of the supporting body 251 to prevent the pressing surface 1011 of the upper mold 101 from directly pressing the wires 24, thereby preventing the wires 24 from being stressed to be deformed or damaged.

In addition, the wires 24 are entirely covered inside the supporting body 251, so that the supporting body 251 can prevent the molding material from being direct contact with the wires 24 when the molding material is added into the molding cavity 103 formed between the upper mold 101 and the lower mold 102 to prevent the molding material with high temperature and rapid flowing to damage the wires 24. Preferably, the supporting body 251 has good heat insulation to prevent the temperature of the molding material from transferring to the wires 24. More preferably, a height of the supporting body 251 is higher than a height of the protruding portion of each of the wires 24, so that the supporting body 251 supports the upper mold 101 in an upward direction during the molding process. A safety distance is reserved between the pressing surface 1011 and the protruding portion of each of the wires 24.

And, the supporting body 251 covers the chip-outer portion 2133 of the photosensitive element 21 and the circuit-inner portion 2231 of the circuit board 22 to cover the mounting position of the photosensitive element 21 mounted on the circuit board 22 by the supporting body 251, such that the supporting body 251 can not only pre-fix the photosensitive element 21 and the circuit board 22, but also prevent the respective portions of the photosensitive element 21 and the circuit board 22 from being displaced due to uneven force during the molding process. In addition, the supporting body 251 can also prevent the molding material from contacting the mounting position of the photosensitive element 21 to the circuit board 22 which ensures the flatness of the photosensitive element 21 to improve the image quality of the camera module.

One skilled in the art should understand that the supporting body 251 is disposed along the mounting position of the photosensitive element 21 and the circuit board 22, so that the supporting body 251 is in a square shape. Therefore, the supporting body 251 is capable of preventing the molding material from entering the photosensitive area 212 of the photosensitive element 21 during the molding process, thereby forming the molded body 232 covering the edge region 223 of the circuit board 22 and the outer surface 2503 of the supporting body 251 and the light window 231 formed in the middle of the molded body 232 by the molding material after curing. The photosensitive area 212 of the photosensitive element 21 is positioned corresponding to the light window 231 of the molded base 23 such that the light window 231 provides a light path from the optical lens 10 to the photosensitive element 21. Preferably, the molded body 232 covers the periphery area 223 of the circuit board 22, the outer surface 2503 of the supporting body 251, and at least a part of the top surface 2501 after molded.

Figure 9B:
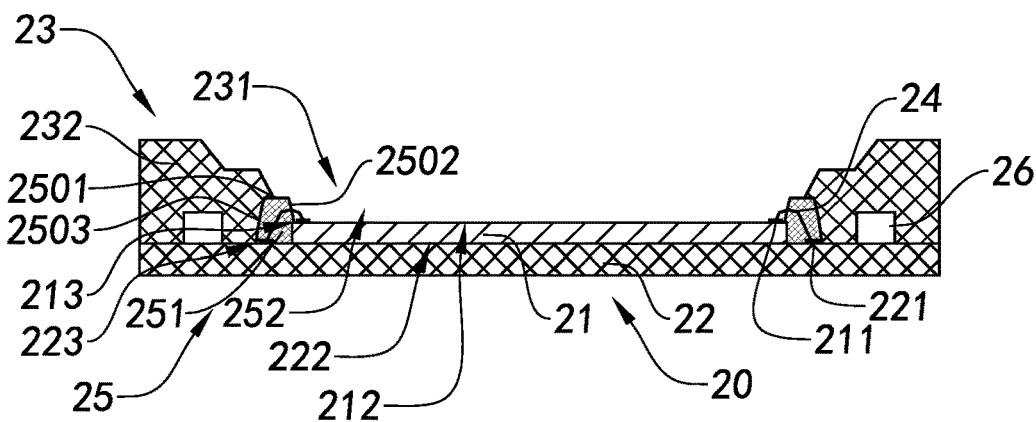
FIG. 9B is a schematic view of a second alternative mode of the molded photosensitive assembly of the camera module according to the above preferred embodiment of the present invention.

In a second alternative mode of the embodiment of the camera module of the present invention as shown in FIG. 9B, the supporting body 251 covers the chip-outer portion 2133 of the photosensitive element 21 and at least a part of the circuit-inner portion 2231, the circuit-connecting portion 2232, and the circuit-outer portion 2233 of the circuit board 22. That is, in the example of the camera module as shown in FIG. 9B, the supporting body 251 may not cover the chip-connecting portion 2132 of the photosensitive element 21.

Figure 9C:
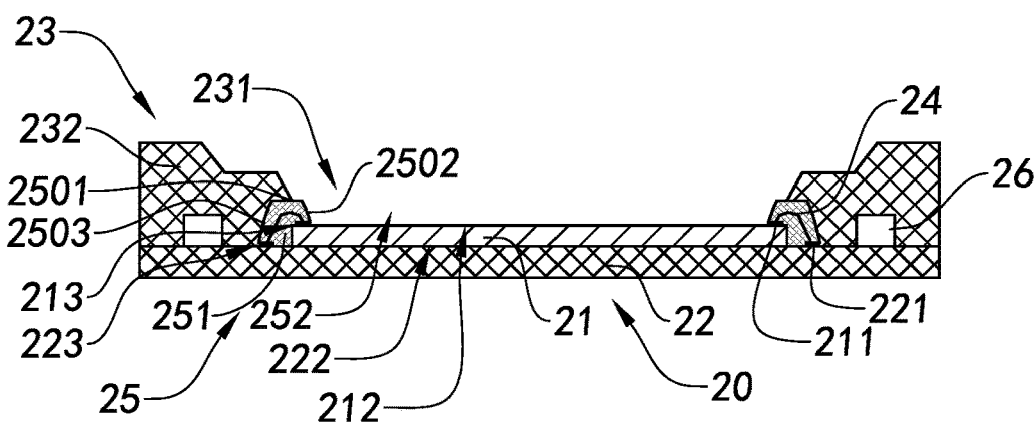
FIG. 9C is a schematic view of a third alternative mode of the molded photosensitive assembly of the camera module according to the above preferred embodiment of the present invention.

In a third alternative mode of the embodiment of the camera module of the present invention as shown in FIG. 9C, the supporting body 251 covers the chip-connecting portion 2132 and the chip-outer portion 2133 of the photosensitive element 21, and the circuit-inner portion 2231 and the circuit-connecting portion 2232 of the circuit board 22. That is, in this alternative mode of the embodiment of the camera module of the present invention as shown in FIG. 9C, the supporting body 251 may not cover the chip-inner portion 2131 of the photosensitive element 21 and the circuit-outer portion 2233 of the circuit board 22. That is, in the alternative modes of the embodiments of the camera module as shown in FIGS. 9A, 9B, and 9C, the supporting body 251 can simultaneously cover the photosensitive element 21 and a mounting position of the circuit board 22 to pre-fix the photosensitive element 21 and the circuit board 22 by the supporting body 251, and avoid the mounting position of the photosensitive element 21 and the circuit board 22 generating a slit by the supporting body 251, so that the supporting body 251 can prevent the respective portion of the photosensitive element 21 and the circuit board 22 from being displaced due to uneven force during the molding process, and the molding material from entering between the photosensitive element 21 and the circuit board 22 to ensure the flatness of the photosensitive element 21.

Figure 10A:
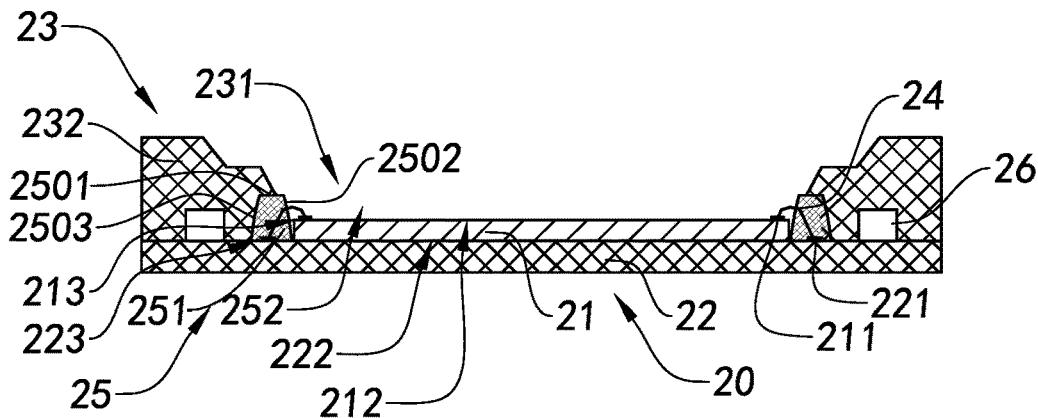
FIG. 10A is a schematic view of a fourth alternative mode of the molded photosensitive assembly of the camera module according to the above preferred embodiment of the present invention.

According to FIG. 10A, a fourth alternative mode of the embodiment of the camera module of the present invention is illustrated, wherein the supporting body 251 covers the circuit-inner portion 2231 of the periphery area 223 of the circuit board 22, at least a part of the circuit-connecting portion 2232 and at least a part of the circuit-outer portion 2233. That is, the supporting body 251 covers the circuit connector 221 of the circuit board 22 during molding. On the one hand, the wires 24 is pre-fixed by the supporting body 251, and the wires 24 and the circuit connector 221 are prevented from coming into contact with the molding material by means of the supporting body 251, thereby the wires 24 are prevented from falling off from the circuit connector 221.

Figure 10B:
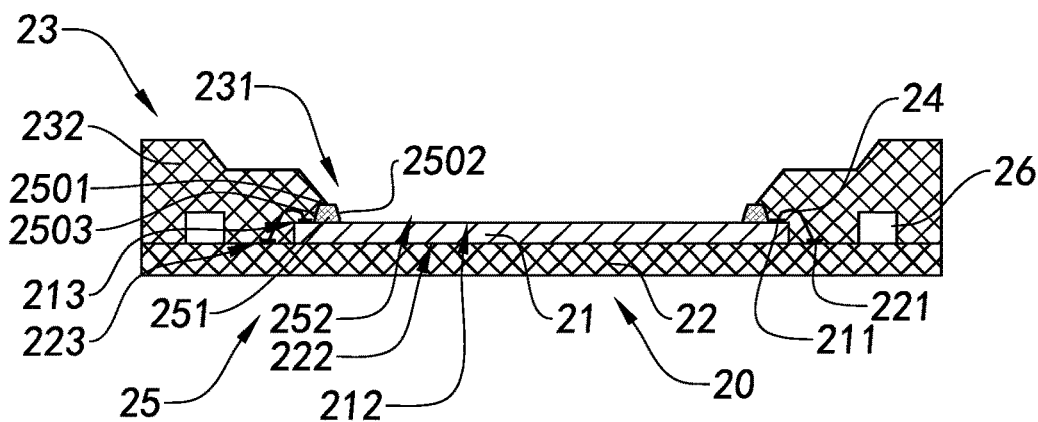
FIG. 10B is a schematic view of a fifth alternative mode of the molded photosensitive assembly of the camera module according to the above preferred embodiment of the present invention.

According to FIG. 10B, a fifth alternative mode of the embodiment of the camera module of the present invention is illustrated, wherein the supporting body 251 covers only the chip-inner portion 2131 of the photosensitive element 21 to be molded. In the molding process, the supporting body 251 blocks the molding material from entering the photosensitive area 212 of the photosensitive element 21, thereby forming the molded body 232 covering the periphery area 223 of the circuit board 22 and chip-outer portion 2133 of the photosensitive element 21 and the chip-connecting portion 2132 after the molding material is solidified and cured. The light window 231 is formed at a position with respect to the photosensitive area 212 of the photosensitive element 21.

Figure 11:
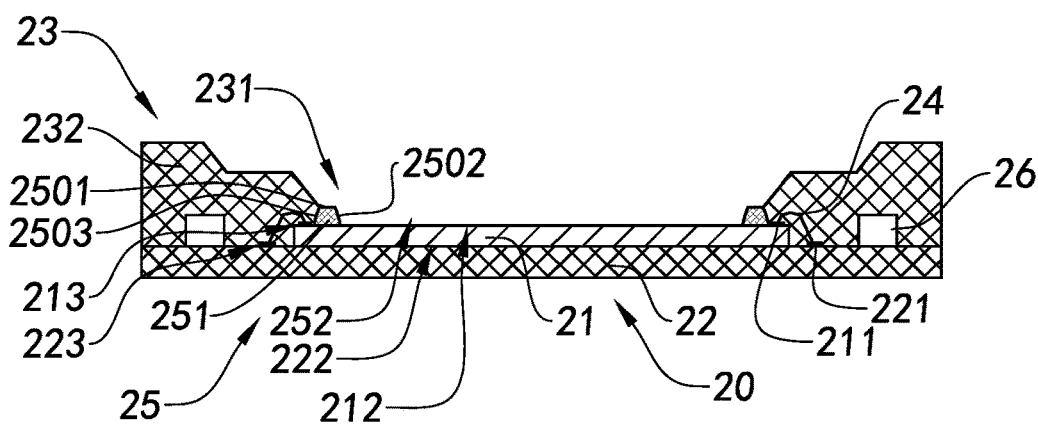
FIG. 11 is a schematic view of a sixth alternative mode of the molded photosensitive assembly of the camera module according to the above preferred embodiment of the present invention.

According to FIG. 11, a sixth alternative mode of the embodiment of the camera module of the present invention is illustrated, which is different from the above-described embodiment of the present invention in that the molded body 232 is not covered with the top surface 2501 of the supporting body 251 after molded. For example, in this particular example as illustrated in FIG. 11, the molded body 232 covers the periphery area 223 of the circuit board 22 and the outer surface 2503 of the supporting body 251 after molded.

It is to be mentioned that, although the embodiments in which the height of the supporting body 251 is higher than the height of the protruding portion of each of the wires 24 are shown in FIGS. 1 to 11, in other alternative modes of the present invention, the height of the supporting body 251 may also be equal to the height of the protruding portion of each of the wires 24, or that the height of the supporting body 251 may also be lower than each of the height of the protruding portion of the wires 24 as long as, during the molding process, the pressing surface 1011 of the upper mold 101 of the molding-die 100 is in contact with the top surface of the supporting body 251 and the pressing surface of the mold 101 is not directly pressed against each of the wires 24.

Figure 12:
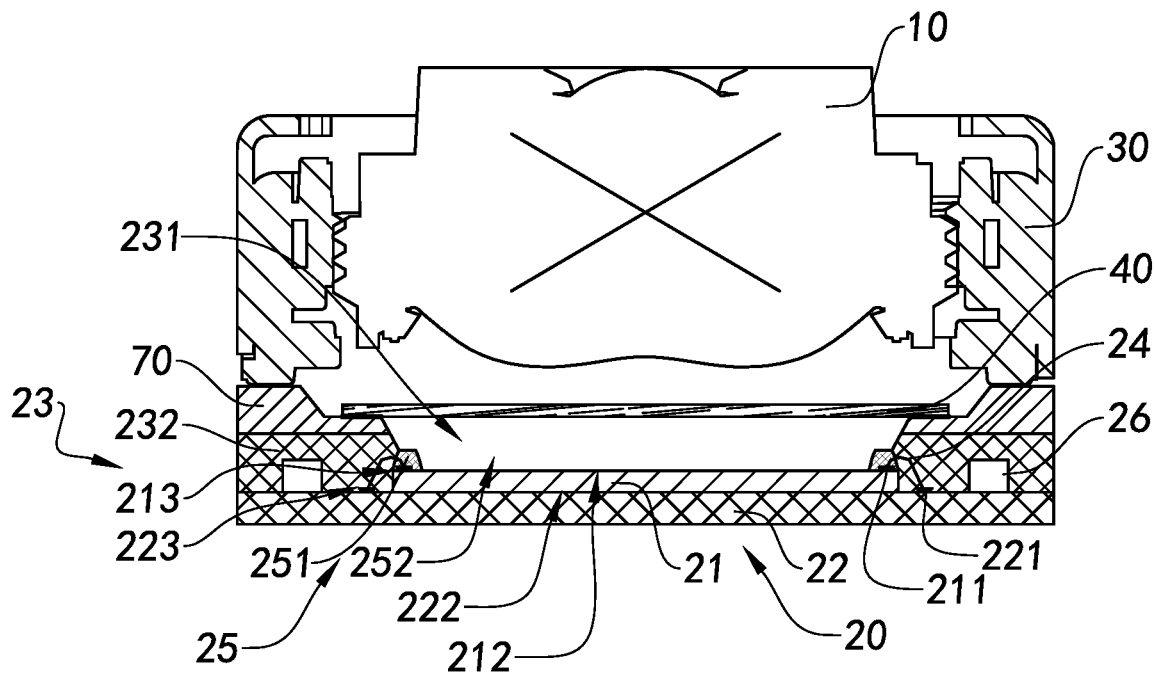
FIG. 12 is a schematic view of an alternative mode of the camera module according to the above preferred embodiment of the present invention.

FIG. 12 shows an alternative mode of the above embodiment of the camera module, wherein the filter member 40 is not directly mounted on the module body 232, but at least one holder 70 is provided by the camera module, wherein the filter member 40 is mounted on the holder 70 and the holder 70 is mounted on the top surface of the molded body 232, such that the filter member 40 is held and positioned between the optical lens 10 and the photosensitive element 21. Accordingly, the size of the filter member 40 can be reduced and the height of the camera module is reduced correspondingly too.

Furthermore, the top surface of the molded body 232 can be a flat surface, so that after the molded base 23 is molded, the holder 70 is firstly mounted on the top surface of the molded body 232, and then the driver 30 or the lens barrel 60 is mounted on the holder 70. That is, the driver 30 or the lens barrel 60 may not be directly mounted on the top surface of the molded body 232 but may be mounted on the holder 70.

Figure 13:
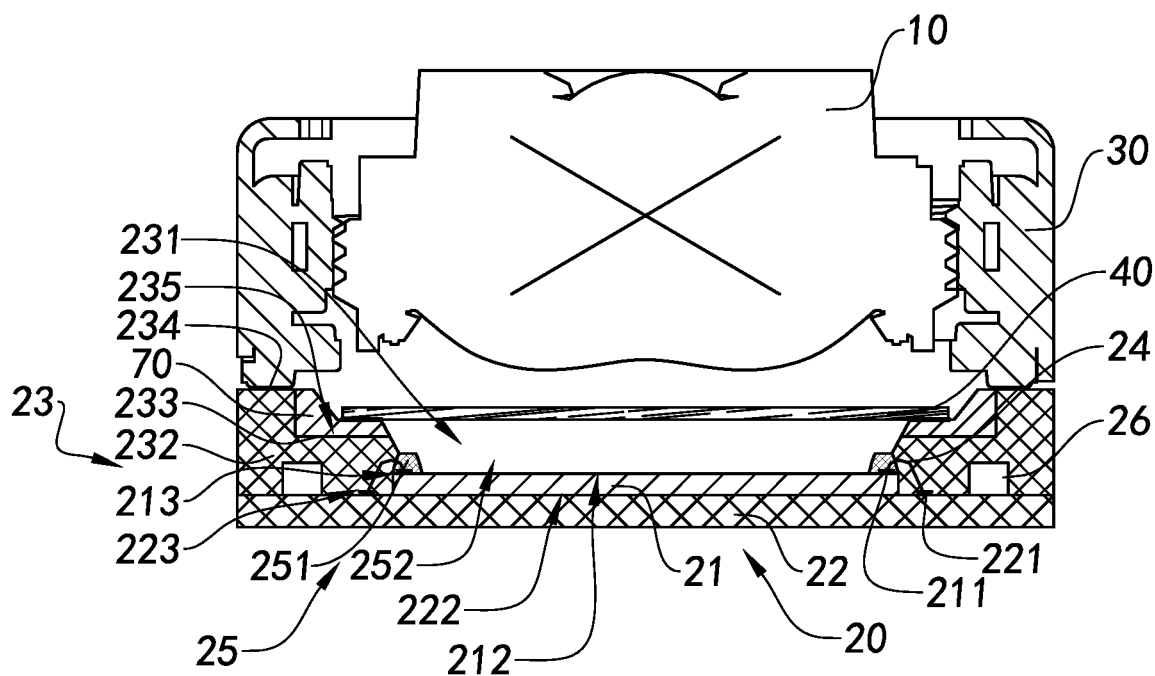
FIG. 13 is a schematic view of an alternative mode of the camera module according to the above preferred embodiment of the present invention.
Figure 14:
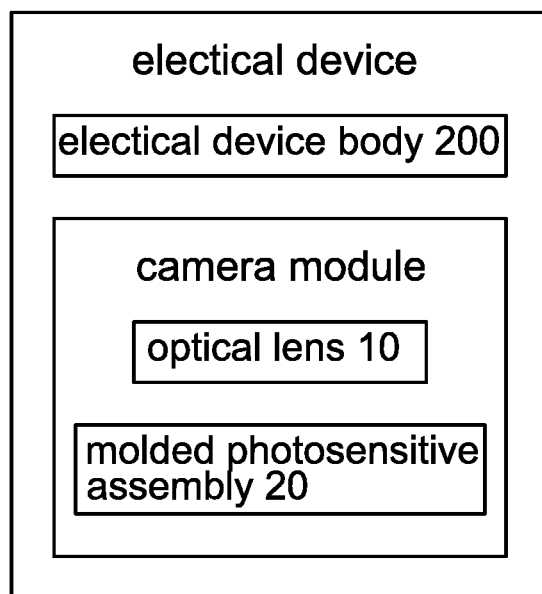
FIG. 14 is a block diagram of the camera module according to the above preferred embodiment of the present invention, illustrating an electronic device.

FIG. 13 shows another alternative mode of the above embodiment of the camera module, wherein the top surface of the molded body 232 has a recess 235 and the holder 70 mounted on the top surface of the molded body 232 is received in the recess 235 to further reduce the height of the camera module. In this situation, the driver 30 or the lens barrel 60 can be directly mounted on the top surface of molded body 232.

However, it will be understood by one skilled in the art that, in other alternative modes of the camera module of the present invention, the optical lens 10 may also be directly mounted on the top surface of the molded body 232 or the optical lens 10 can also be directly mounted on the top surface of the holder 70. According to another aspect of the present invention, a manufacturing method of a molded photosensitive assembly 20 is provided, which comprises the steps of:

(a) electrically connecting a photosensitive element 21 and a circuit board 22 through a set of wires 24;

(b) placing the photosensitive element 21 and the circuit board 22 in an upper mold 101 or a lower mold 102 of a molding-die 100;

(c) in the process of closing and clamping the upper mold 101 and the lower mold 102 of the molding-die 100, supporting the upper mold 101 in an upward direction by a supporting member 25 to prevent the pressing surface 1011 of the upper mold 101 from being pressed against each set of the wires 24; and (d) adding a fluid molding material into a molding cavity 103 formed between the upper mold 101 and the lower mold 102 of the molding-die 100 to form a molded base 23 after the molding material is cured, wherein the molded base 23 comprises a molded body 232 and has a light window 231, wherein at least a part of an periphery area 223 of the circuit board 22 and at least a part of the supporting member 25 is covered by the molded body 232.

According to another aspect of the present invention, the present invention further provides a manufacturing method of a molded photosensitive assembly 20, wherein the manufacturing method comprises the steps of:

(A) electrically connecting a photosensitive element 21 and a circuit board 22 by a set of wires 24;

(B) covering at least a partial of the wires 24 by a supporting member 25 to form a molded photosensitive assembly semi-finished product;

(C) placing the molded photosensitive assembly semi-finished product in an upper mold 101 or a lower mold 102 of a molding-die 100, wherein the supporting member 25 is upwardly supporting the upper mold 101 to prevent the pressing surface 1011 of the upper mold 101 from being pressed against the wire 24 during the closing and clamping process of the upper mold 101 and the lower mold 102; and (D) adding a fluid molding material into a molding cavity 103 formed between the upper mold 101 and the lower mold 102 to form a molded base 23 after the molding material is solidified and cured, wherein the molded base 23 comprises a molded body 232 and has a light window 231, wherein the molded body 232 covers an periphery area 223 of the circuit board 22 and at least a part of the supporting member 25, wherein the photosensitive area 212 of the photosensitive element of 21 faces the light window 231.

According to another aspect of the present invention, the present invention provides a manufacturing method of a molded photosensitive element, wherein the manufacturing method comprises the steps of:

(a) mounting a photosensitive element 21 on a circuit board 22 and electrically conducting the photosensitive element 21 and the circuit board 22 through at least one set of wires 24;

(b) pre-fixing the photosensitive element 21 and the circuit board 22 by a supporting member 25 to obtain a molded photosensitive assembly semi-finished product, wherein the supporting member 25 prevents a gap formed between the photosensitive element 21 and the circuit board 22;

(c) placing the molded photosensitive assembly semi-finished product in an upper mold 101 or a lower mold 102 of a molding-die 100 which forms an annular molding cavity 103 between the upper mold 101 and the lower mold 102 when the upper mold 101 and the lower mold 102 are closed and clamped; and (d) adding a fluid molding material to the molding cavity 103 to form the molded base 23 after the molding material is solidified and cured, wherein the molded base 23 comprises a molded body 232 and has a light window 231, wherein at least a part of a periphery area 223 of the circuit board 22 and at least a part of the supporting member 25 are covered by the molded body 232, wherein the photosensitive area 212 of the photosensitive element 21 is positioned corresponding to the light window 231.

According to another aspect of the present invention, the present invention provides a manufacturing method of a molded photosensitive element, wherein the manufacturing method comprises the steps of:

(A) electrically connecting to a chip connector 211 of a photosensitive element 21 and a circuit connector 221 of a circuit board 22 through a set of wires 24;

(B) placing the photosensitive element 21 and the circuit board 22 on an upper mold 101 or a lower mold 102 of a molding-die 100 which forms an annular molding cavity 103 between the upper mold 101 and the lower mold 102 when the upper mold 101 and the lower mold 102 are closed and clamped;

(C) when a fluid molding material is added to the molding cavity 103, reducing the impact force towards the wires 24 generated by the molding material with a supporting member 25 positioned in the molding cavity 103 to block the molding material; and (D) forming a molded base 23 after the molding material is solidified and cured, wherein the molded base 23 comprises a molded body 232 and has a light window 231, wherein a periphery area 223 of the circuit board 22, the supporting member 25 and at least a part of the non-photosensitive area 213 of the photosensitive element 21 are covered by said molded body 232.

The present invention further provides an electronic device, wherein the electronic device comprises an electronic device body 200 and at least one camera module, wherein the at least one camera module is disposed on the electronic device body 200 for obtaining graphics. The at least one camera module further comprises at least one optical lens 10, at least one molded photosensitive assembly 20 comprising a supporting member 25, a photosensitive element 21, a circuit board 22, a set of wires 24, and a molded base 23, wherein both ends of each of the wires 24 are connected respectively to the chip connector 211 of the photosensitive element 21 and the board connector 221 of the circuit board 22, wherein the molded base 23 comprises a molded body 232 and has a light window 231, wherein during the molding process with a molding-die 100 to mold and form the molded body 232, the supporting member 25 prevents the pressing surface 1011 of the molding-die 100 from being pressed against the wires 24, wherein the photosensitive area 212 of the photosensitive element 21 is positioned corresponding to the light window 231, wherein the at least one optical lens 10 is disposed in the respective photosensitive path of the photosensitive element 21.

According to FIGS. 15 to 23 of the drawings of the present invention, an array camera module according to a preferred embodiment of the present invention is illustrated, wherein the array camera module comprises at least two optical lenses 10A and a molded photosensitive assembly 20A, wherein the molded photosensitive assembly 20A further comprises at least two photosensitive elements 21A, a circuit board 22A, a molded base 23A, and at least two sets of wires 24A.

Each of the photosensitive elements 21A comprises a set of chip connectors 211A, a photosensitive area 212A, and a non-photosensitive area 213A, wherein the photosensitive area 212A and the non-photosensitive area 213A are integrally formed, wherein the photosensitive area 212A is positioned in the middle of the photosensitive element 21A and the non-photosensitive area 213A is positioned at a periphery of the photosensitive element 21A, wherein the non-photosensitive area 213A is arranged surrounding the photosensitive area 212A and the chip connector 211A is disposed on the non-photosensitive area 213A.

Correspondingly, the circuit board 22A comprises at least two sets of circuit connectors 221A, at least two flat chip mounting areas 222A and a periphery area 223A, wherein the periphery area 223A is integrated with each of the chip mounting areas 222A. The periphery area 223A is formed around each of the chip mounting areas 222A, and the board connectors 221A are disposed in the periphery area 223A.

Each of the wires 24A respectively has a chip-connecting end 241A and a circuit-connecting end 242A, wherein each of the wires 24A is extended in a curved manner between the chip-connecting end 241A and the circuit-connecting end 242A.

The photosensitive elements 21A are respectively mounted on the chip mounting areas 222A of the circuit board 22A, wherein the chip-connecting end 241A of each of the wires 24A is connected to the respective chip connector 211A of the photosensitive element 21A and the circuit-connecting end 242A of each of the wires 24A is connected to the respective circuit connector 221A of the circuit board 22A, wherein at least the periphery area 223A of the molded base 23A is integrated with the circuit board 22A to form the molded photosensitive assembly 20A, wherein the optical lenses 10A are respectively disposed in photosensitive paths of the photosensitive elements 21A of the molded photosensitive assembly 20A. Light reflected by the object enters the inside of the array camera module from the optical lenses 10A to be subsequently received and photoelectrically converted by the photosensitive areas 212A of the photosensitive elements 21A respectively for obtaining image about the object.

In an example of the array camera module of the present invention, the chip connectors 211A of the photosensitive elements 21A and the circuit connectors 221A of the circuit board 22A each can be an electrical connection pad. That is, the chip connectors 211A of the photosensitive elements 21A and the circuit connectors 221A of the circuit board 22A each may be in a disk shape for connecting the chip-connecting ends 241A of the wires 24A to the chip connectors 211A of the photosensitive elements 21A respectively and connecting the circuit-connecting ends 242A of the wires 24A to the circuit connectors 221A of the circuit board 22A respectively. In the array camera module of the present invention, in another example, the chip connectors 211A of the photosensitive elements 21A and the circuit connectors 221A of the circuit board 22A each may be in a spherical shape, wherein, for example, solder paste or other solder material is spotted on the non-photosensitive area 213A of each of the photosensitive elements 21A and the periphery area 223A of the circuit board 22A to form the chip connector 211A of each of the photosensitive elements 21A and each of the circuit connectors 221A of the circuit board 22A. Nevertheless, it will be understood by one skilled in the art that the chip connectors 211A of the photosensitive elements 21A or the circuit connectors 221A of the circuit board 22A are not intended to limit the present invention. That is, in other examples, the chip connectors 211A of the photosensitive elements 21A and the circuit connectors 221A of the circuit board 22A may be in other shapes not being mentioned above.

The non-photosensitive area 213A of each of the photosensitive elements 21A further has a chip-inner portion 2131A, a chip-connecting portion 2132A and a chip-outer portion 2133A, wherein the chip connector 211A is disposed on the chip-connecting portion 2132A and the chip-inner portion 2131A is provided surrounding the photosensitive area 212A, wherein both sides of the chip-connecting portion 2132A are respectively extended and connected to the chip-inner portion 2131A and the chip-outer portion 2133A. That is, from a position where the chip connector 211A is disposed to a position of the periphery of the photosensitive area 212A of the non-photosensitive area 213A is defined as the chip-inner portion 2131A, and an area where the chip connector 211A is disposed on the non-photosensitive area 213A is defined as the chip-connecting portion 2132A, and an area from the position where the chip connector 211A disposed on the non-photosensitive area 213A to the outer periphery of the photosensitive element 21A is defined as the chip-outer portion 2132A. In other words, from the top view of the photosensitive element 21A, in order from the outer periphery to the inside, the photosensitive element 21A is formed by the chip-outer portion 2133A, the chip-connecting portion 2132A, the chip-inner portion 2131A, and the photosensitive area 212A.

Similarly, the periphery area 223A of the circuit board 22A has a circuit-inner portion 2231A, a circuit-connecting portion 2232A and a circuit-outer portion 2233A. The chip mounting area 222A is surrounded by the circuit-inner portion 2231A. The two sides of the circuit-connecting portion 2232A are respectively extended and connected to the circuit-inner portion 2231A and the circuit-outer portion 2233A. That is, an area from a position where the board connector 221A disposed on the periphery area 223A to a position of the periphery of the chip mounting area 222A is defined as the circuit-inner portion 2231A, and an area of the periphery area 223A where the circuit connector 221A disposed is defined as the circuit-connecting portion 2232A, and an area from the position where the circuit connector 221A disposed on the periphery area 223A to the outer edge of the periphery area 223A is defined as the circuit-outer portion 2233A. It is worth to mention that, in the embodiment of the array camera module of the present invention, the circuit board 22A is an integrated board. Preferably, the chip mounting areas 222A are respectively disposed on the sides of the circuit board 22A so that the circuit board 22A is symmetrical.

Furthermore, the type of the wires 24A is not limited in the camera module of the present invention. For example, in one specific example, each of the wires 24A may be implemented as a gold wire to be connected between the photosensitive element 21A and the circuit board 22A, so that the optical signal after converting into an electrical signal in the photosensitive element 21A can be further transmitted to the circuit board 22A through the wires 24A. One skilled in the art will understand that in other examples of the camera module, the wires 24A can also be implemented as a silver wire, a copper wire, or the like, that the material can transfer the electrical signal between the photosensitive element 21A and the circuit board 22A.

Figure 21:
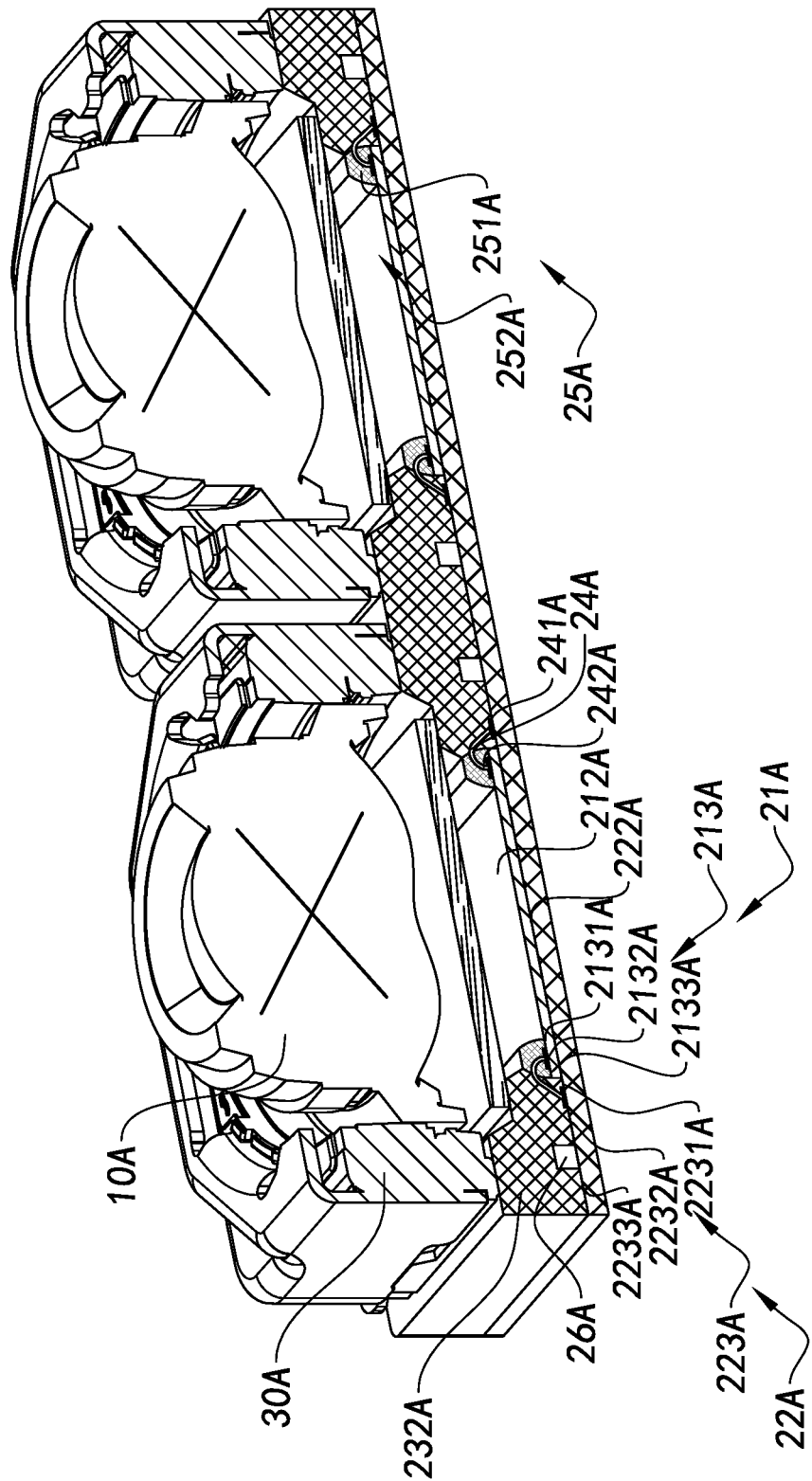
FIG. 21 is a perspective sectional view of one of the manufacturing steps of the array camera module according to the above preferred embodiment of the present invention, illustrating that an optical lens of the array camera module is mounted on a driver, wherein the driver is mounted on the top surface of the module base.

The array camera module may be a fixed focus camera module or a zoom camera module. For example, the array camera module may have an optical zooming capability under the premise of controlling a height dimension to improve the imaging quality of the array camera module. Specifically, in the example of the array camera module as shown in FIG. 21, the array camera module further comprises at least two drivers 30A, wherein the optical lenses 10A are mounted on the drivers 30A respectively while the drivers 30A are mounted on a top surface of the molded base 23A, such that each of the optical lenses 10A is respectively held on the photosensitive path of the respective photosensitive element 21A of the respective molded photosensitive element. Each of the drivers 30A is electrically connected to the circuit board 22A to enable each of the drivers 30A to drive the respective optical lens 10A to move reciprocatedly in the photosensitive path of the respective photosensitive element 21A after the circuit board 22A transmits power and control signals to the drivers 30A for adjusting the focal length of the array camera module. That is, the optical lenses 10A can be disposed on the drivers 30A in a drivable manner respectively.

It is worth mentioning that the type of the drivers 30A of the camera module is not limited in the present invention. For example, in one specific example, the driver 30A can be implemented as a drive unit, such as a voice coil motor, to move the optical lens 10 along the photosensitive path of the photosensitive element 21A, wherein the driver 30A is capable of receiving electrical power and control signals to be in an operational state.

Figure 20:
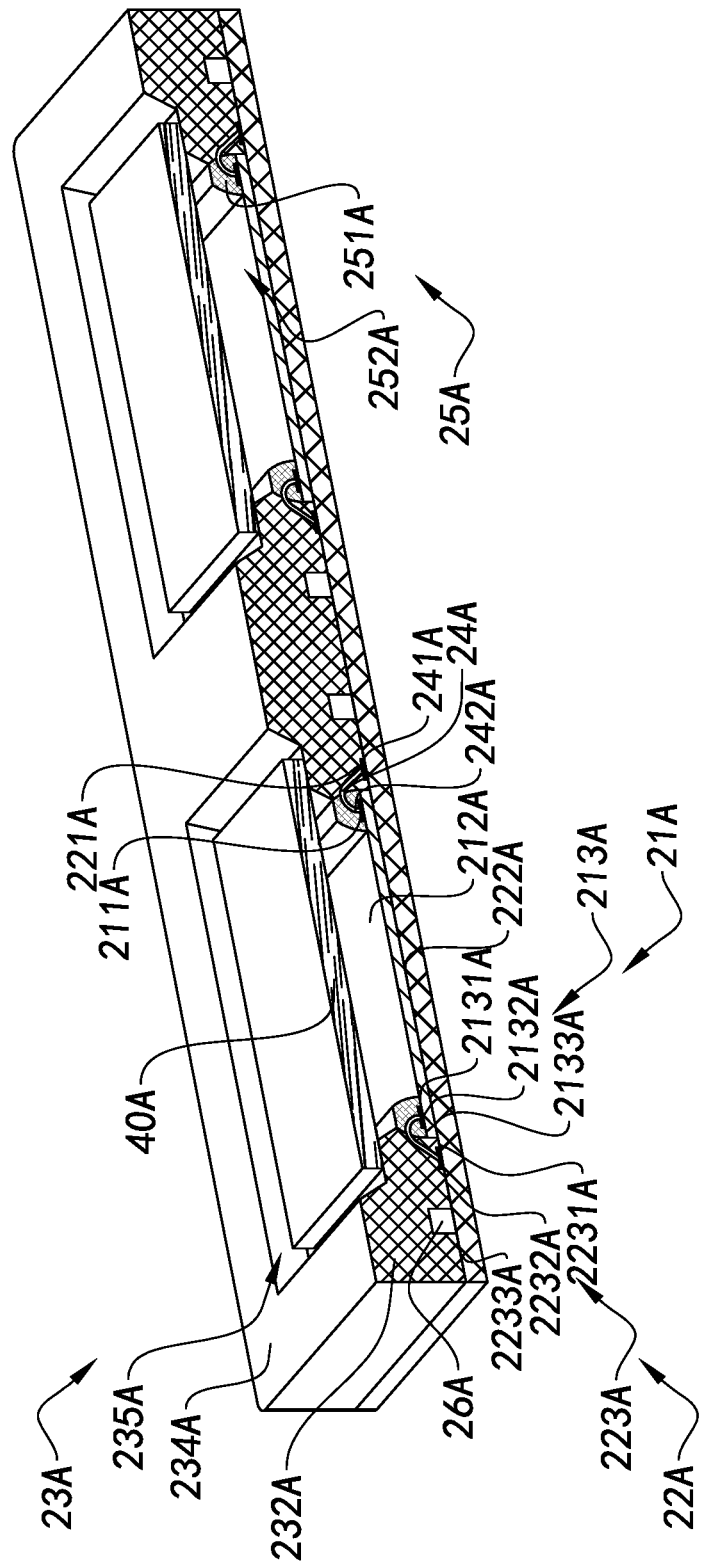
FIG. 20 is a perspective sectional view of one of the manufacturing steps of the array camera module according to the above preferred embodiment of the present invention, illustrating that a filter member is mounted on the top surface of the molded base.

Further according to FIG. 20, the array camera module further comprises at least one filter member 40A. For example, in an illustrative example of the present invention, the array camera module may comprise only one filter member 40A which is mounted on a top surface of the molded base 23A, wherein different positions of the filter member 40A are positioned respectively corresponding to the photosensitive paths of the photosensitive elements 21A. In another illustrating example, the array camera module may comprise at least two filter members 40A, wherein each of the filter members 40A is mounted on a top surface of the molded base 23A such that each of the filter members 40A is positioned corresponding to the photosensitive path of one of the photosensitive elements 21A. That is, each of the photosensitive elements 21A, each of the filter members 40A and each of the optical lenses 10A of the array camera module are arranged and aligned in a one-to-one correspondence.

When the array camera module is used, the light reflected by an object enters the inside of the respective camera module from the optical lens 10A and is filtered by the filter member 40A to be received and photoelectrically converted by the photosensitive element 21A correspondingly. That is, the filter member 40A can filter stray light reflected by the object from the optical lens 10A into the interior of the camera module, such as an infrared light. In such a manner, the imaging quality of the camera module is improved.

In addition, the filter member 40A may be directly mounted on the top surface of the molded base 23A, or the filter member 40A may be assembled by first mounting the filter member 40A to a supporting member and then mounting the supporting member on the top surface of the molded base 23A, such that the size of the filter member 40A can be reduced to reduce the manufacturing cost of the array camera module.

One skilled in the art will understand that, in different examples of the camera module, the filter members 40A can be implemented with different types. For example, the filter members 40A can be implemented as infrared cutoff filters, a full transmissive spectral filter, and other filters, or a combination of multiple types of filters. For example, the filter member 40A can be implemented as a combination of an infrared cutoff filter and a full transmissive filter, i.e. the infrared cutoff filter and the full transmissive spectral filter being able to be selectively switched to be positioned on the photosensitive path of the photosensitive element 21A. For example, in an environment where light is sufficient during daytime, the infrared cutoff filter may be chosen to position in the photosensitive path of the photosensitive element 21A to filter infrared rays reflected by the object entering the camera module, and that when the camera module is used in a dark environment, such as a dark night, the full-transmission spectral filter can be chosen to position in the photosensitive path of the photosensitive element 21A to allow the infrared part of the light reflected by the object entering the camera module.

Figure 22:
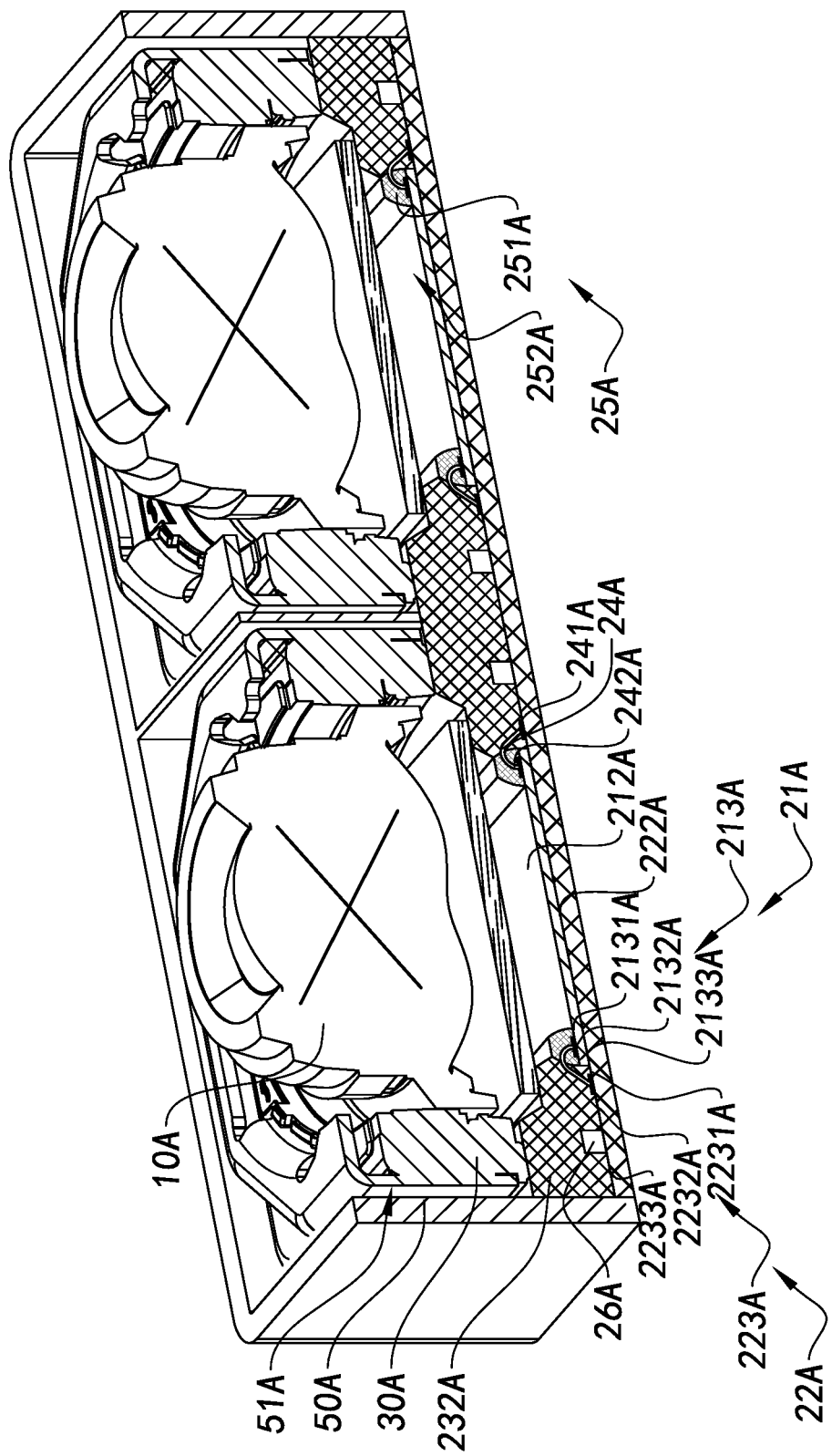
FIG. 22 is a perspective sectional view of one of the manufacturing steps of the array camera module according to the above preferred embodiment of the present invention, illustrating that each of the driver is respectively mounted on a mounting space of a supporter of the array camera module to form the array camera module.
Figure 23:
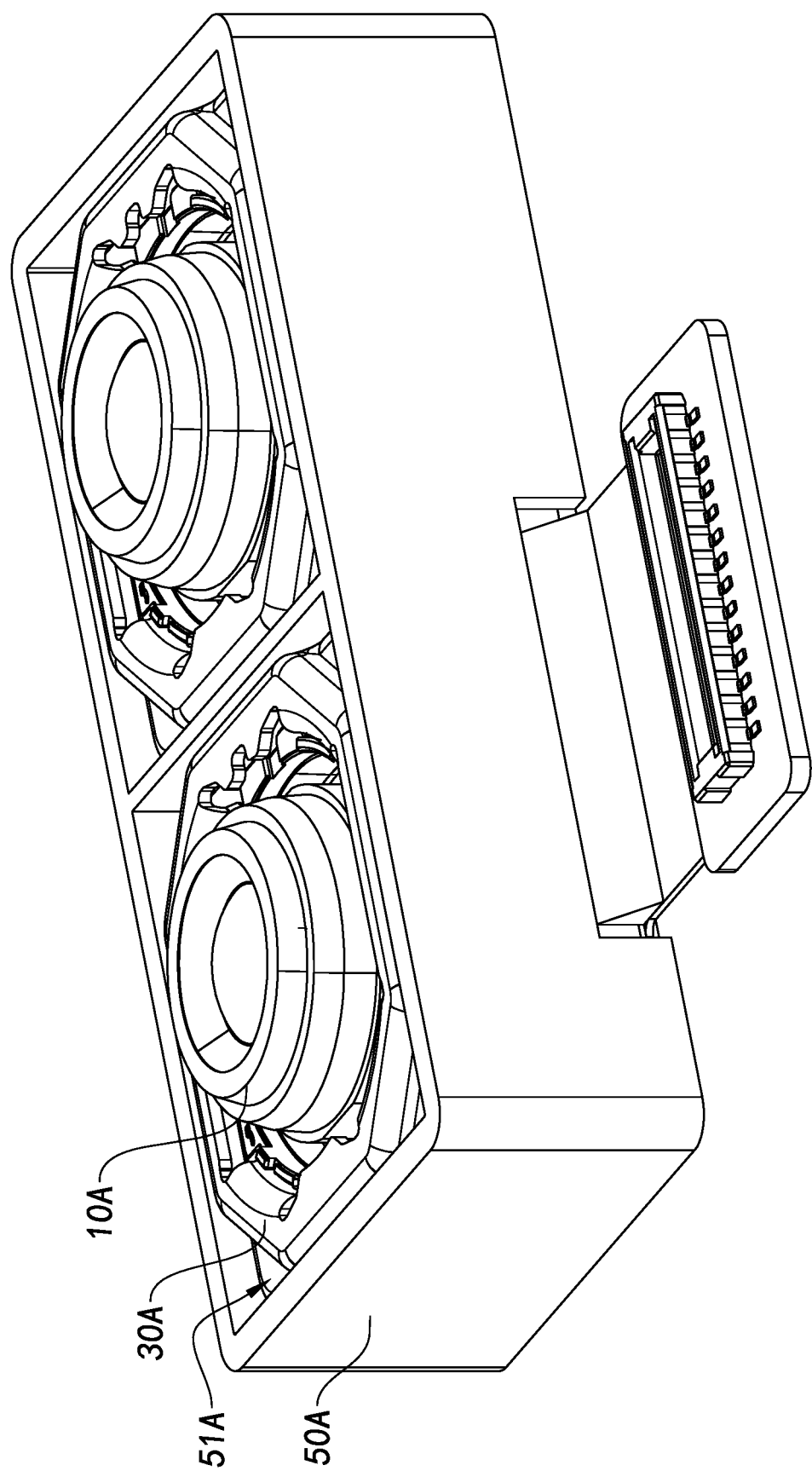
FIG. 23 is a perspective view of the array camera module according to the above preferred embodiment of the present invention.

According to FIGS. 22 and 23, the array camera module further comprises a supporter 50A, wherein the supporter 50A has at least two mounting spaces 51A which are respectively communicated with two side portions of the supporter 50A. That is, each of the mounting spaces 51A may forms one passage. The drivers 30A are respectively mounted to the mounting spaces 51A of the supporter 50A to maintain the drivers 30A in a stable state by the supporter 50A, thereby ensuring that the optical lenses 10A are coaxially mounted on the drivers 30A to increase the intensity of the array camera module to further improve the imaging quality of the array camera module.

Preferably, after the drivers 30A are mounted to the mounting spaces 51A of the supporter 50A respectively, a plurality of fillers is filled between the inner walls of the supporter 50A and the outer casings of the drivers 30A, so that each of the drivers 30A does not sway after being mounted to the respective mounting space 51A of the supporter 50A. More preferably, the fillers filled between the outer casings of the drivers 30A and the inner walls of the supporter 50A may be a glue.

The molded photosensitive assembly 20A further comprises at least one supporting member 25A to protect the wires 24A and the photosensitive elements 21A during the molding process. In an example of the invention, the number of supporting members 25A can be implemented as a minimum of two. Preferably, the number of the supporting members 25A is equal to with the number of the photosensitive elements 21A, and the supporting members 25A are respectively provided to cover the non-photosensitive areas 213A of the photosensitive elements 21A before the molded base 23A is molded. After the molded base 23A is molded, the molded base 23A covers the periphery area 223A of the circuit board 22A, a part of the non-photosensitive areas 213A of photosensitive elements 21A, and a part of the supporting member 25A to form the molded photosensitive assembly 20A. The supporting member 25A can effectively improve the product yield of the array camera module and improve the imaging quality of the array camera module. In other examples of the invention, the number of supporting members 25A can also be embodied as one, which will be further explained later.

Each of the supporting members 25A comprises a frame-shaped supporting body 251A and has a through hole 252A, wherein the supporting body 251A is provided to cover at least a part of the non-photosensitive area 213A of the respective photosensitive element 21A. The photosensitive area 212A of each of the photosensitive elements 21A is positioned corresponding to the through hole 252A of the respective supporting member 25A. Preferably, the supporting body 251A covers at least a part of the chip-inner portion 2131A, the chip-connecting portion 2132A, and at least a part of the chip-outer portion 2133 of the non-photosensitive area 213A of the photosensitive element 21A. Furthermore, the supporting body 251A has a top surface 2501A, an inner surface 2502A and an outer surface 2503A, wherein both sides of the top surface 2501A are extended inwardly and outwardly to be connected to the inner surface 2502A and the outer surface 2503A respectively. In the present invention, the side of the supporting body 251A facing the photosensitive area 212A is defined as the inner surface 2502A of the supporting body 251A, and the side of the periphery area 223A facing the circuit board 22A is defined as the outer surface 2503A of the supporting body 251A. In this embodiment, the molded base 23A covers the outer surface 2503A and at least a part of the top surface 2501A of the supporting body 251A after molded.

In addition, the molded photosensitive assembly 20A of the camera module further comprises a plurality of electronic components 26A, wherein each of the electronic components 26A can be mounted on the periphery area 223A of the circuit board 22A by a process such as SMT (Surface Mount Technology). Preferably, each of the electronic components 26A is mounted on the circuit-outer portion 2233A of the periphery area 223A. The photosensitive element 21A and the electronic components 26A may be mounted on the same side or opposite sides of the circuit board 22A. For example, in one specific example, the photosensitive element 21A and the electronic components 26A are mounted on the same side of the circuit board 22A, wherein the photosensitive element 21A is mounted on the chip mounting area 222A of the circuit board 22A and the electronic components 26A are mounted on the periphery area 223A of the circuit board 22A. After the molded base 23A is integrally molded on the circuit board 22A, the electronic components 26A are covered by the molded base 23A and isolated the spaces between the adjacent electronic components 26A. Even a distance between any two of the adjacent electronic components 26A are relatively close, the molded base 23A can prevent the adjacent electronic components 26A from contacting or interfering with each other by isolating the adjacent electronic components 26A and isolating the electronic components 26A with the photosensitive element 21A in the camera module of the present invention. Since the electronic components 26A are covered by the molded base 23A, it can also avoid electronic contaminants being gathered on the surface of the electronic components 226A and contaminating the photosensitive area 212A of the photosensitive element 21A. Accordingly, the size of the camera module is reduced and the imaging quality of the camera module is improved. That is, more the electronic components 26A can be mounted on a small area of the circuit board 2A of the camera module of the present invention by covering the electronic components 26A by the molded base 23A. It is worth mentioning that the types of the electronic components 26A include, but are not limited to, resistors, capacitors, driving devices, and the like.

Figure 24:
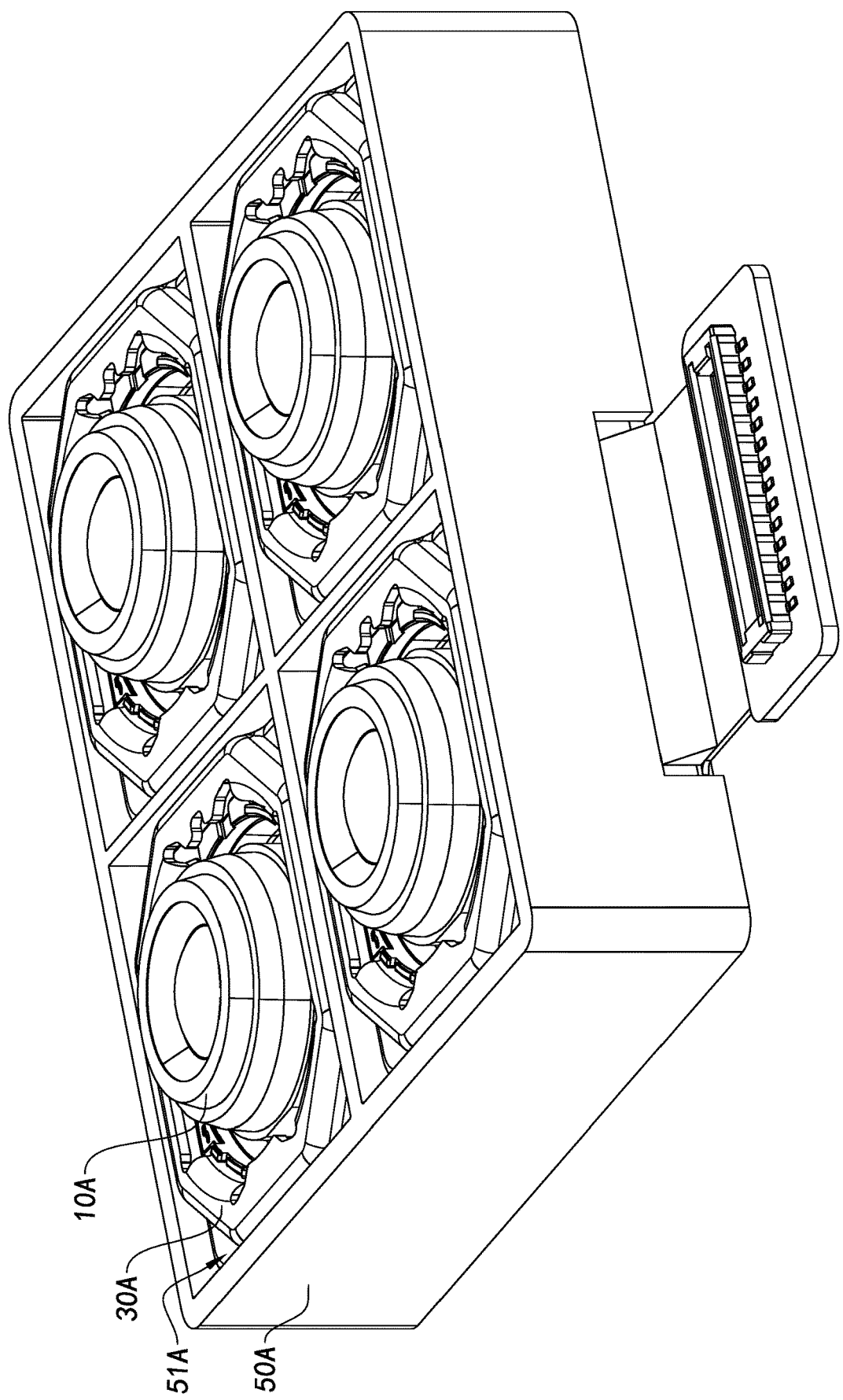
FIG. 24 is a perspective view of an alternative mode of the array camera module according to the above preferred embodiment of the present invention.

According to FIG. 15 to FIG. 23, although the array camera module is implemented as a dual lens camera module as an example in the following description of the present invention, which the features and advantages of the array camera module of the present invention are further clarified, one skilled in the art will understand that, in an alternative mode of the embodiment of the array camera module of the present invention shown in FIG. 24, the array camera module may also comprise more optical lenses 10A.

The manufacturing method of the molded photosensitive assembly 20A of the array camera module is illustrated in FIGS. 15 to 19 and the manufacturing method of the array camera module with the molded photosensitive assembly 20A is further illustrated in FIGS. 20 to 22.

Figure 15:
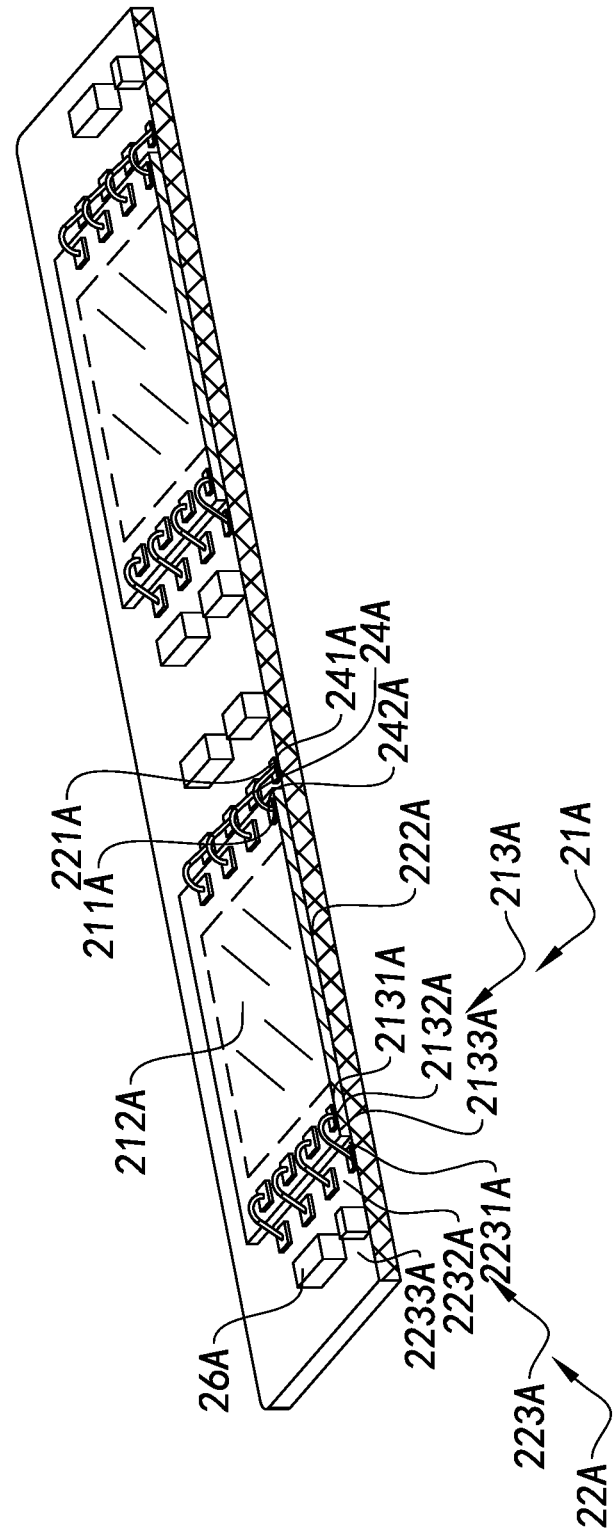
FIG. 15 is a perspective sectional view of one of the manufacturing steps of an array camera module according to a preferred embodiment of the present invention, illustrating that the photosensitive elements of an array camera module is mounted on the chip mounting area of the circuit board, and the chip connector of the photosensitive element and the circuit connector of the circuit board are electrically connected by a set of wires, wherein the circuit board is an integrated circuit board.

According to FIG. 15, two photosensitive elements 21A are respectively mounted on two chip mounting areas 222A of the circuit board 22A in a one-to-one manner correspondingly, wherein a set of the chip connectors 211A of each of the photosensitive elements 21A and two sets of the board connectors 222 of the circuit board 22A are respectively connected by a set of the wires 24A. Each of the electronic components 26A is mounted on the periphery area 233 of the circuit board 22A. Preferably, the electronic components 26A are mounted on the circuit-outer portion 2233A of the periphery area 223A. More preferably, the electronic components 26A are spaced apart from each other such that each of the electronic components 26A does not interfere with another electronic component 26A after the array camera module is manufactured.

Limited to the wire bonding process of the wire 24A and the characteristics of each of the wires 24A itself, after the chip-connecting end 241A and the circuit-connecting end 242A of each of the wires 24A are respectively connected to the chip connector 211A of the photosensitive element 21A and the board connector 221A of the circuit board 22A, each of the wires 24A protrudes in an upward direction and forms a projection on the upper surface of the photosensitive element 21A. One skilled in the art will understand that maintaining each of the wires 24A in an initial state during the manufacture and the use of the array camera module has advantageous for ensuring good electrical power of the wires 24A which guarantees the imaging quality of the array camera module.

Figure 16:
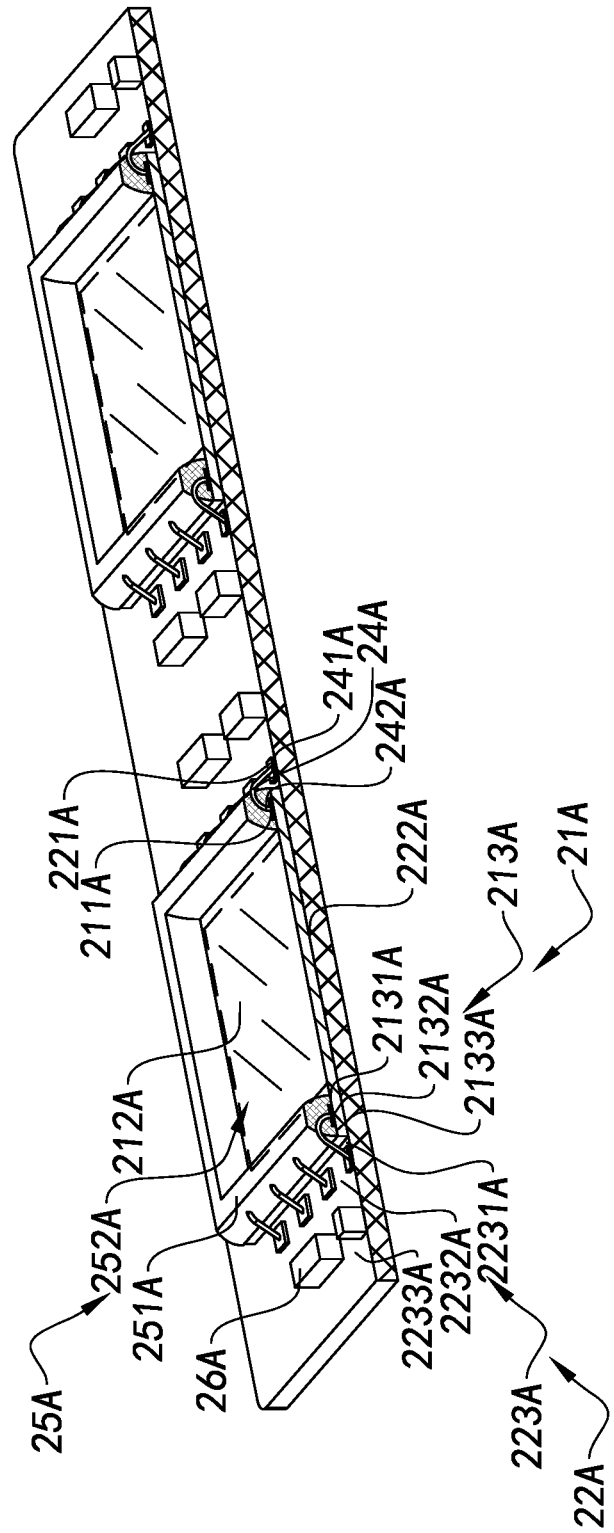
FIG. 16 is a perspective sectional view of one of the manufacturing steps of the array camera module according to the above preferred embodiment of the present invention, illustrating that a supporting body of the array camera module is disposed to cover at least a part of the non-photosensitive area of the photosensitive element to form a molded photosensitive assembly semi-finished product.

According to FIG. 16, each of the supporting bodies 251A is provided to cover at least a part of the non-photosensitive areas 213A of each of the photosensitive elements 21A, wherein the photosensitive area 212A of each of the photosensitive elements 21A is positioned corresponding to the through hole 252A of each of the supporting members 25A, so that each of the supporting members 25A, each of the photosensitive elements 21A, the circuit board 22A, and each of the sets of wires 24A form a molded photosensitive assembly semi-finished product. In an example of the array camera module of the present invention, each of the supporting bodies 251A covers at least a part of the chip-outer portion 2133A, the chip-connecting portion 2132A, and at least part of the chip-inner portion 2133 of the photosensitive element 21A. That is, each of the supporting bodies 251A can cover the connection position of the chip-connecting end 241A of the wires 24A and the chip connector 211A of the photosensitive element 21A during the molding process. Each of the supporting bodies 251A can prevent the connection position of the chip-connecting end 241A of the wires 24A and the chip connector 211A of the respective photosensitive element 21A from coming into contact with the molding material of the molded base 23A, thereby avoiding the chip-connecting end 241A of the wire 24A being detached from the chip connector 211A of the photosensitive element 21A.

It can be understood that each of the supporting bodies 251A covers the connection position of the chip-connecting end 241A of the wire 24A and the chip connector 211A of the respective photosensitive element 21A, so that the supporting bodies 251A isolate the chip-connecting ends 241A of the wires 24A and the chip connectors 211A of the photosensitive elements 21A from the molding material, thereby preventing the molding material from causing the chip-connecting end 241A of each of the wires 24A deformed or detached from the respective chip connector 211A during a molding process.

In addition, the supporting bodies 251A cover a part of each of the wires 24A, thereby pre-fixing each of the wires 24A by the supporting bodies 251A to prevent the wires 24A being deformed during a molding process. The supporting bodies 251A can prevent, in particular, the short circuit caused by the mutual contact of the wires 24A due to deformation to ensure the yield of the array camera module after being manufactured.

In one embodiment, the supporting body 251A may be formed by disposing a glue in the non-photosensitive area 213A of the photosensitive element 21A, wherein after the glue disposed in the non-photosensitive area 213A of the photosensitive element 21A is cured, the cured glue forms the supporting body 251A having a predetermined elasticity. After the supporting body 251A is formed, the inner surface 2502A of the supporting body 251A forms the through hole 252A and the photosensitive area 212A of the photosensitive element 21A is arranged corresponding to the through hole 252A. In addition, the supporting body 251A formed by the cured glue may also have a viscosity for subsequently adhering contaminants, such as dust, thereby preventing the contaminants from contaminating the photosensitive area 212A of the photosensitive element 21A and causing stain point in the photosensitive area 212A of the photosensitive element 21A, so as to further ensure the image quality of the camera module. For example, the supporting body 251A is disposed between the photosensitive area 212A of the photosensitive element 21A and the electronic components 26A, thereby preventing contamination by contaminants, such as the solder powder generated when the electronic components 26A are mounted on the circuit board 22A, from contaminating the photosensitive area 212A of the photosensitive element 21A in a way that the solder powder may be adhered by the supporting body 251A.

Preferably, the supporting body 251A can be formed after the glue in gel state applied to the non-photosensitive area 213A of the photosensitive element 21A is cured so as to prevent any glue covered on the non-photosensitive area 213A of the photosensitive element 21A from flowing to contaminate the photosensitive area 212A of the photosensitive element 21A. In other words, the glue for forming the supporting body 251A should have good plasticity and self-setting properties before cured, so that the glue will not deform during applying and curing on the non-photosensitive area 213A of the photosensitive element 21A. One skilled in the art will understand that after the chip-connecting end 241A of each of the wires 24A is disposed to be connected to the chip connector 211A of the photosensitive element 21A, after the glue in flowable gel state is applied to the non-photosensitive area 213A of the photosensitive element 21A, the chip-connecting ends 241A of the wires 24A can be covered, and the supporting body 251A covering the wires 24A is formed after the glue is cured for avoiding the wires 24A being damaged during the molding of the supporting body 251A.

Figure 17A:
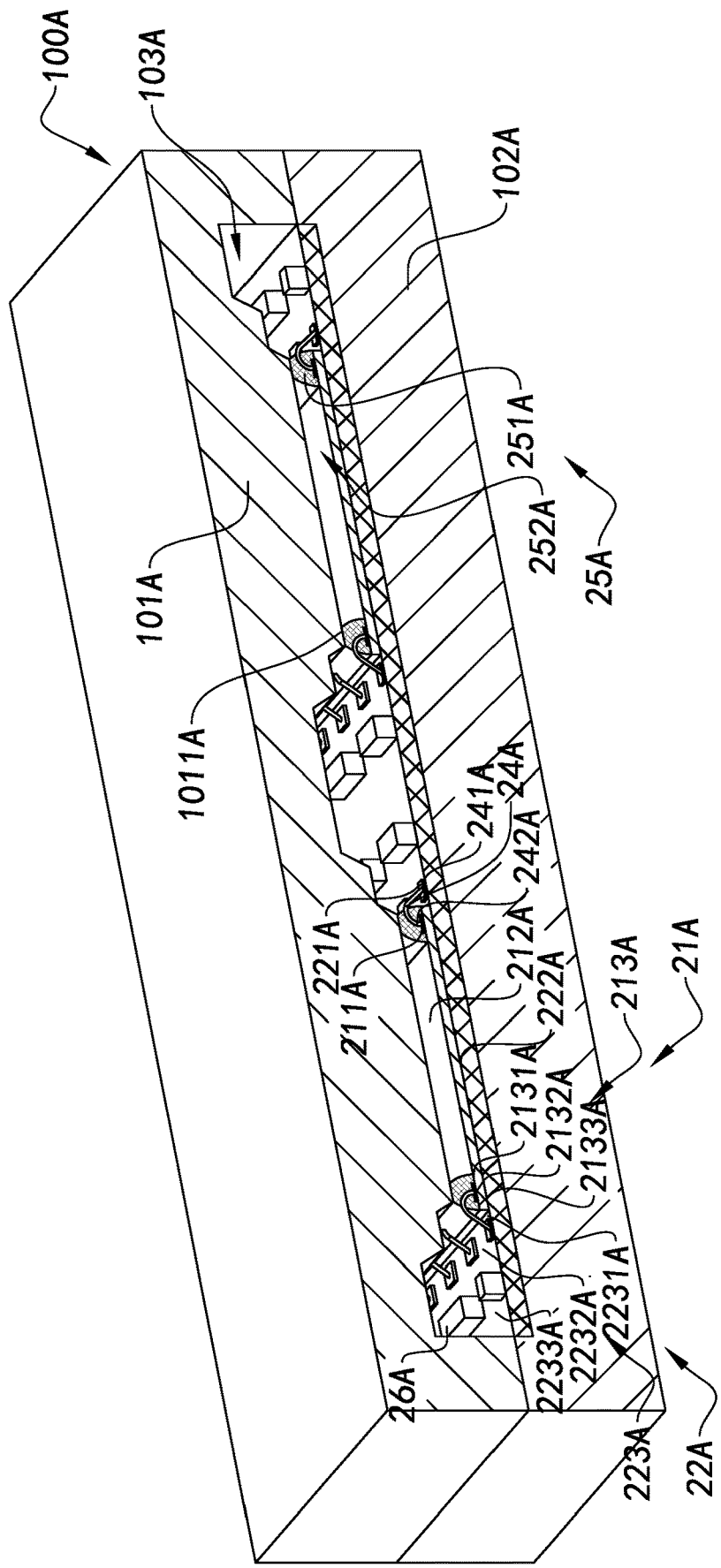
FIG. 17A is a perspective sectional view of one of the manufacturing steps of the array camera module according to the above preferred embodiment of the present invention, illustrating that the molded photosensitive assembly semi-finished product is placed between an upper mold and a lower mold of the molding-die, wherein the pressing surface of the upper mold is in contact with the top surface of the supporting body.

According to FIG. 17A, during the molding process, the molding material is solidified and cured in a molding-die 100A to form the molded base 23A which is at least integrally molded on the circuit board 22A, such that by means of the method of the invention, the size of the camera module can be reduced and the assembly error of the camera module can also be reduced too, thereby making the structure of the camera module more compact and improving the imaging quality of the camera module.

Specifically, the molding-die 100A comprises an upper mold 101A and a lower mold 102A, wherein at least one of the upper mold 101A and the lower mold 102A can be moved to operate and close the upper mold 101A and the lower mold 102A in a mold clamping operation, wherein at least one molding cavity 103A is formed between the upper mold 101A and the lower mold 102A, wherein the molding material is filled and added to the molding cavity 103A to form the molded base 23A after curing.

For example, in one embodiment, the lower mold 102A is generally fixed in stationary position, and the upper mold 101A is arranged movable in relative to the lower mold 102A along one or more guiding rods, wherein the upper and lower molds 101A, 102A can be closed and clamped when the upper mold 101A is moved towards the lower molds 102A, and the upper and lower modes 101A, 102A can be demolded when the upper mold 101A is moved away from the lower mold 102A, wherein the molding cavity 103A is formed between the upper mold 101A and the lower mold 102A when the upper and lower molds 101A, 102A are closed and clamped. Or, in another example, the upper mold 101A is fixed in stationary position, and the lower mold 102A can be arranged movable in relative to the upper mold 101A along the one or more guiding rods, wherein the upper and lower molds 101, 102A can be closed and clamped when the lower mold 102A is moved toward the upper mold 101A, and the upper and lower molds 101A, 102A can be demolded when the lower mold 102A is moved away from the upper mold 101A, wherein the molding cavity 103A is formed between the lower mold 102A and the upper mold 101A when the upper and lower molds 101A, 102A are closed and clamped.

After the molded photosensitive assembly semi-finished product is placed on the lower mold 102A or, alternatively, on the upper mold 101A, the upper mold 101A and the lower mold 102A are operated to being clamped and closed to make the molded photosensitive assembly semi-finished product, so that the molded photosensitive assembly semi-finished product is formed in each of the molding cavities 103A formed between the upper mold 101A and the lower mold 102A, wherein the pressing surface 1011A of the upper mold 101A is pressed against the top surface 2501A of the respective supporting body 251A. The upper mold 101A is upwardly supported by the supporting body 251A for preventing the pressing surface 1011A of the upper mold 101A from directly pressing on the wires 24A to protect the wires 24A from being damaged during the molding process, wherein at least the periphery area 223A of the circuit board 22A in the molded photosensitive assembly semi-finished product is positioned corresponding to the molding cavity 103A.

It is worth to mention that each of the mold cavities 103A is in an annular shape, and that the adjacent mold cavities 103A are communicated with each other so that after the molding material added in the molding cavities 103A is cured, the molded base 23A is formed.

Preferably, the supporting body 251A has a predetermined elasticity so that when the molding-die 100A is closed and clamped for molding, the instantaneous impact force generated by the pressing surface 1011A of the upper mold 101A of the molding-die 100A while contacting with the top surface 2501A of the supporting body 251A is absorbed by the supporting body 251A to prevent the impact force from being further transmitted to the photosensitive element 21A, thereby preventing the photosensitive element 21A from being damaged or avoiding the photosensitive element 21A being displaced relative to the circuit board 22A due to the impact force. One skilled in the art would understand that the supporting body 251A absorbs the impact force to prevent the impact force from being further transmitted to the photosensitive element 21A, and also ensures that the flatness of the photosensitive element 21A mounted on the circuit board 22A is not affected, thereby ensuring the image quality of the camera module.

Preferably, in one example, the height of the supporting body 251A may be embodied to be higher than the height at which the wires 24A protruded upwards, so that during the closing and clamping operation of the molding-die 100A, the pressing surface 1011A of the upper mold 101A can be directly pressed against the top surface 2501A of the supporting body 251A to prevent the pressing surface 1011A of the upper mold 101A from being pressed against the wires 24A by means of the upward supporting of the upper mold 101A by the top surface 2501A of the supporting body 251A, i.e. a safety distance being provided between the wires 24A and the pressing surface 1011A of the upper mold 101A. In another example, the height of the supporting body 251A is equal to the height at which the wire 24A protruded upwards, so that when the molding-die 100A is closed and clamped, the pressing surface 1011A of the upper mold 101A may be in contact with the wires 24A but the pressing surface 1011A of the upper mold 101A will still not be pressing against the wires 24A.

In addition, the supporting body 251A has a predetermined elasticity and, after the closing and clamping of the upper and lower molds 101A, 102A, the pressing surface 1011A of the upper mold 101A is pressed against the top surface 2501A of the supporting body 251A. The top surface 2501A of the supporting body 251A is slightly deformed for preventing generation any gap between the pressing surface 1011A of the upper mold 101A and the top surface 2501A of the supporting body 251A. That is, the pressing surface 1011A of the upper mold 101A and the top surface 2501A of the supporting body 251A are closely fitted, so that the photosensitive area 212A of the photosensitive element 21A is positioned corresponding to the through hole 252A of the supporting member 25A in a sealed environment, wherein the molding material would not enter the sealing environment during the molding process to prevent the molding material from contaminating the photosensitive area 212A of the photosensitive element 21A. It is worth mentioning that the supporting body 251A is preferred to have a Shore hardness ranging from A50 to A80 and an elastic modulus ranging from 0.1 GPa to 1 GPa.

In addition, during the molding process, the pressing surface 1011A of the upper mold 101A and the top surface 2501A of the supporting body 251A are preferred closely fitted to prevent the molding material from entering the sealing environment, thereby after the molded base 23A is formed, the "flashing" can be avoided to ensure the product yield of the array camera module.

Figure 17B:
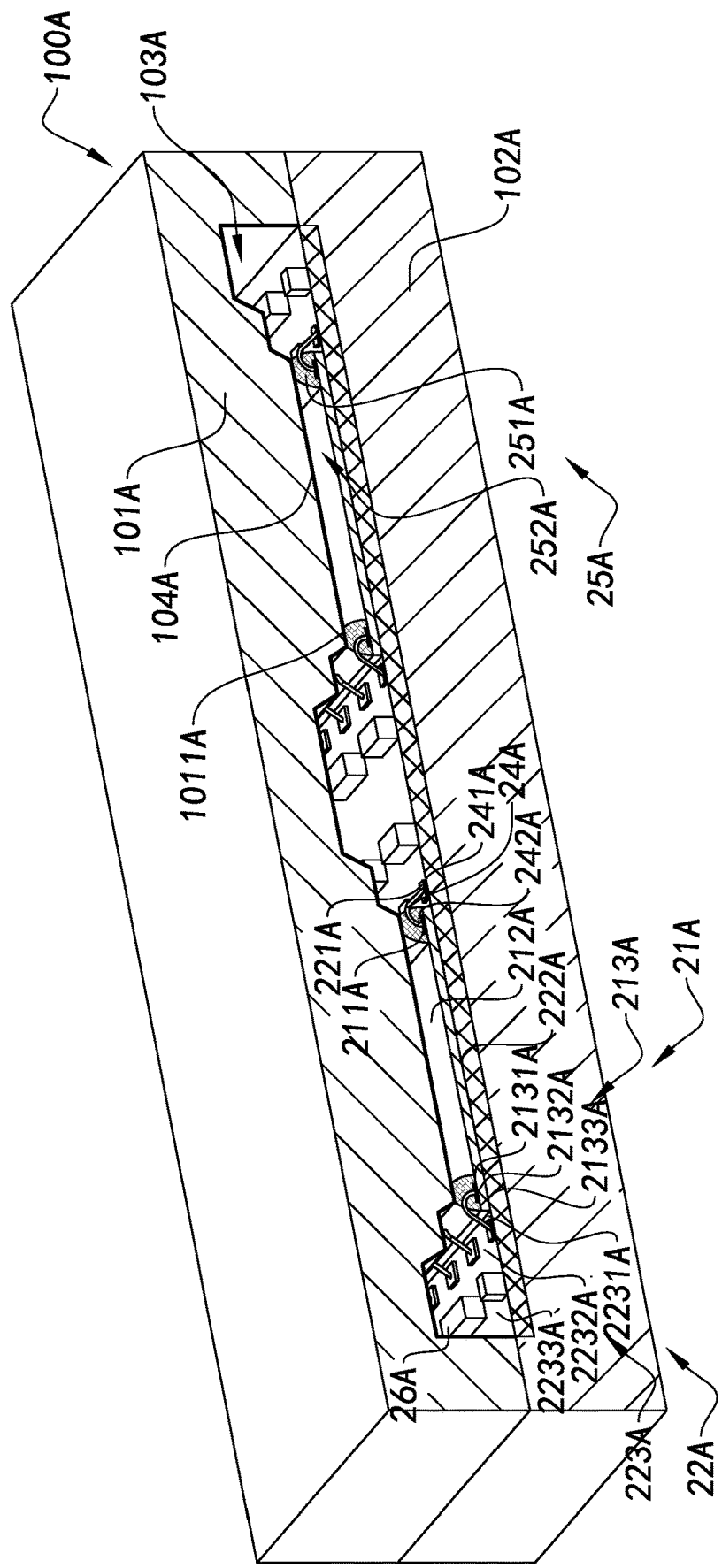
FIG. 17B is a perspective sectional view of one of the manufacturing steps of the array camera module according to the above preferred embodiment of the present invention, illustrating that a covering film is provided on the pressing surface of the upper mold, wherein the covering film is positioned between the pressing surface of the upper mold and the top surface of the supporting body when the pressing surface of the upper mold is pressed against the top surface of the supporting body.

FIG. 17B illustrates an alternative mode of the embodiment of the molded photosensitive assembly 20A of the array camera module of the present invention according to this method, wherein the supporting body 251A can also be supported by a hard material. That is, when the pressing surface 1011A of the upper mold 101A is pressed against the top surface 2501A of the supporting body 251A, the supporting body 251A may not be deformed for ensuring the goodness of the wires 24A. The electrical properties further ensure the subsequent method yield of the camera module and the imaging quality of the camera module. It is worth mentioning that the supporting body 251A is preferred to have a Shore hardness greater than D70 and a modulus of elasticity greater than 1 Fpa.

The molding-die 100A further comprises a covering film 104A overlappedly disposed on the pressing surface 1011A of the upper mold 101A, so that when the molding-die 100A is closing and clamped during the molding process, the covering film 104A is positioned between the pressing surface 1011A of the upper mold 101A and the top surface 2501A of the supporting body 251A, such that the photosensitive area 212A of the photosensitive element 21A is maintained in the sealed environment.

It is worth mentioning that the covering film 104A positioned on the upper mold 101A and the top surface 2501A of the supporting body 251A can prevent a gap being formed between the pressing surface 1011A of the upper mold 101A and the top surface 2501A of the supporting body 251A. On the other hand, the covering film 104A can absorb the impact force generated from the pressing surface 1011A of the upper mold 101A pressing the top surface 2501A of the supporting body 251A that prevents the impact force damaging the photosensitive element 21A, the circuit board 22A, and the wire 24A.

In addition, the arrangement of the covering film 104A also facilitates the demolding of the molding-die 100A after the molded base 23A is molded.

Figure 18:
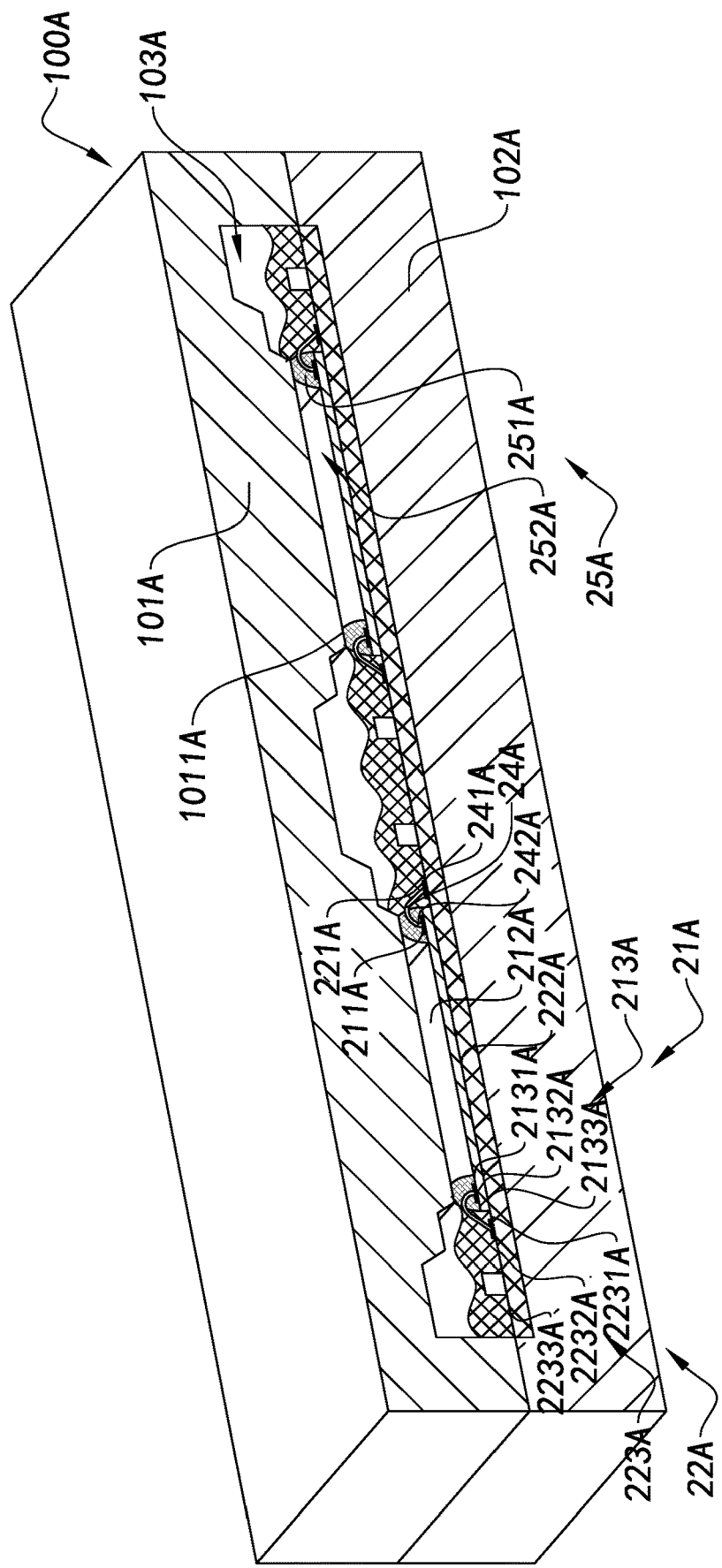
FIG. 18 is a perspective sectional view of one of the manufacturing steps of the array camera module according to the above preferred embodiment of the present invention, illustrating that a molding material is added to a molding cavity formed between the upper mold and the lower mold.

According to FIG. 18, after the molten molding material is added to each of the molding cavities 103A of the molding-die 100A, the molding material is preferred to completely fill the entire molding cavity 103A, wherein at least a part of the supporting body 251A formed on the non-photosensitive area 213A of the photosensitive element 21A can prevent the molding material from entering the sealed environment. Specifically, the supporting body 251A can prevent the molding material from entering the sealing environment through the connection position of the supporting body 251A and the non-photosensitive area 213A of the photosensitive element 21A, and can also prevent the molding material to enter the sealed environment by a connection position of the top surface 2501A of the supporting body 251A and the pressing surface 1011A of the upper mold 101A.

It is worth mentioning that the molding material in fluid form according to the present invention may be a liquid material or a solid particulate material or a mixed material of liquid and solid particles, it can be understood that whether the molding material is implemented as a liquid material or implemented as a solid particulate material or as a liquid and solid particulate mixed material, after being added to the molding cavity 103A of the molding-die 100A, the molding material will be solidified and cured to form the molded base 23A. For example, in this specific example of the invention, the flowable molding material is embodied as a liquid thermosetting material, wherein the molding material added and filled in the molding cavity 103A of the molding-die 100A will be solidified and cured to form the molded base 23A. It is worth to mention that, how the molding material added in the molding cavity 103A of the molding-die 100A is solidified and cured should not limit the scope of the present invention.

Figure 19:
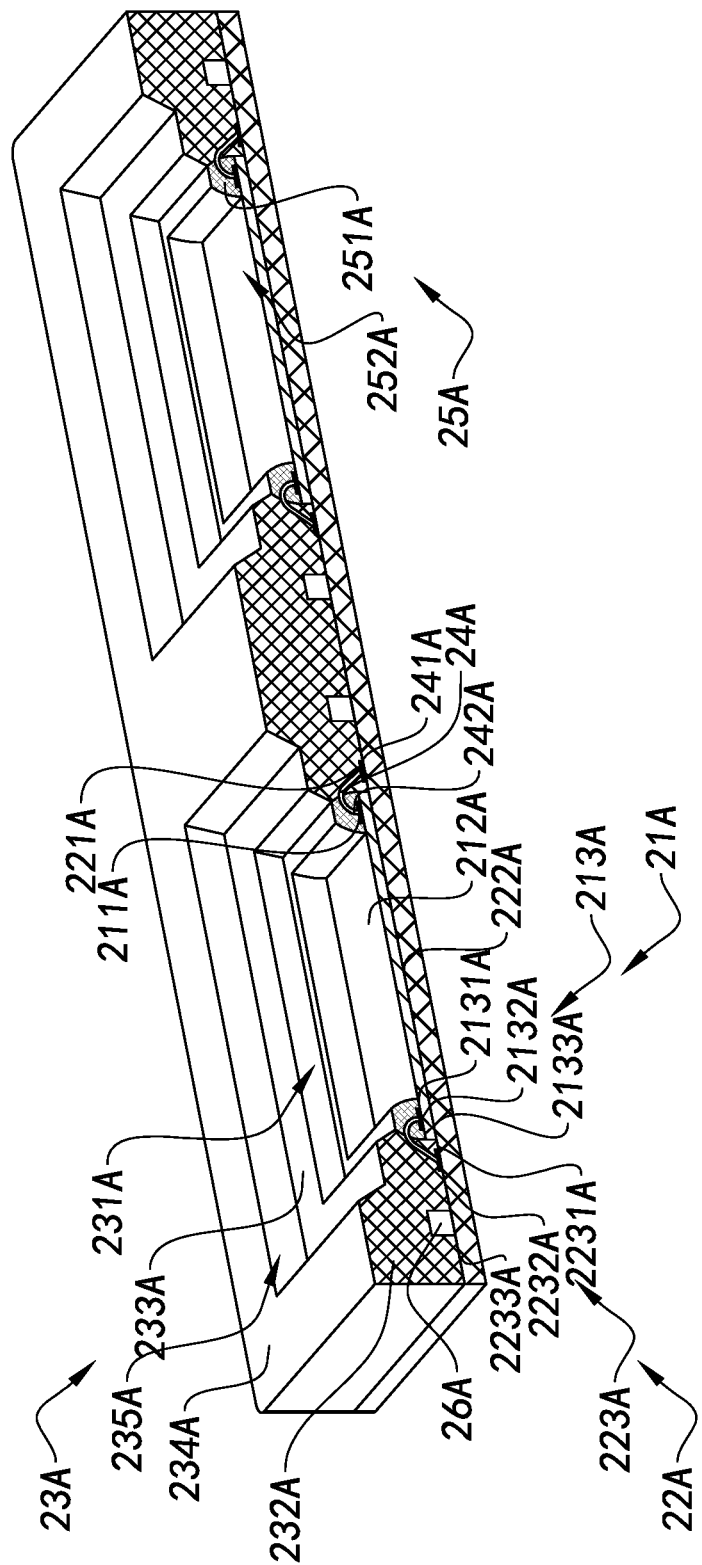
FIG. 19 is a perspective sectional view of one of the manufacturing steps of the array camera module according to the above preferred embodiment of the present invention, illustrating that a molded photosensitive assembly of the array camera module is formed after the molding material is solidified and cured.

According to FIG. 19, when the molding material is added and filled in the molding cavity 103A, the supporting body 251A prevents the molding material from entering the photosensitive area 212A of the photosensitive element 21A, so that after the molded base 23A is formed by solidifying and curing of the molding material, the molded base 23A further forms at least two light windows 231A therein. The light windows 231A are positioned corresponding to the photosensitive areas 212A and the photosensitive elements 21A respectively. The optical lens 10A is provided with a light path for the optical lens 10A and the photosensitive element 21A through the light window 231A. The molding material forms a molded body 232A of the molded base 23A after solidifying and curing. And, in this embodiment, the molded body 232A covers the periphery area 223A of the circuit board 22A and at least a part of the outer surface 2503A and the top surface 2501A of the supporting body 251A to form the molded photosensitive assembly 20A. In other words, the molded base 23A comprises one of the molded bodies 232A and has at least two of the light windows 231A, and that the filter member 40A and the driver 30A are subsequently mounted on the top surface of the molded body 232A while the optical lens 10A mounted on the driver 30A is held in the photosensitive path of the respective photosensitive element 21A.

It is worth mentioning that the molded body 232A integrally formed with the periphery area 223A of the circuit board 22A further covers the electronic components 26A for isolating the adjacent electronic components 26A by the molded body 232A and isolating the electronic components 26A and the photosensitive element 21A, such that even though the distance between two adjacent electronic components 26A is relatively close, the molded body 232A can prevent the adjacent electronic components 26A from contacting or interfering with each other, and that the molded body 232A can also prevent contaminants generated by the electronic components 26A from contaminating the photosensitive area 212A of the photosensitive element 21A to further improve the imaging quality of the camera module.

In addition, in the present invention, since each of the electronic components 26A is covered by the molded body 232A to prevent interfering with the adjacent electronic components 26A, the distance between every two adjacent electronic components 26A can be further reduced. Therefore, even if the circuit board 22A having a smaller attaching area, a larger number of the electronic components 26A can be mounted thereon, which improves the imaging quality of the array camera module with a size of the array camera module as small as possible. Moreover, in the present invention, the electronic components 26A and the photosensitive element 21A are isolated by the material of the molded body 232A which covers all the electronic components 26A, so that even the distance between the photosensitive element 21A and the electronic components 26A is relatively short, the photosensitive element 21A and the electronic components 26A do not interfere with each other. Similarly, the printed circuit board 22A with a smaller area can be mounted with a larger photosensitive element 21A with larger photosensitive area 212A thereon to improve the imaging quality of the array camera module.

Preferably, the molded body 232A has good heat insulation so that heat generated by the photosensitive element 21A during photoelectric conversion is insulated from transmitting to the electronic components 26A during the use of the array camera module, which ensures the reliability of the array camera module during operation.

According to FIG. 20 and FIG. 21, the filter member 40A is mounted on the top surface of the molded base 23A such that the light window 231A of the molded base 23A is sealed by the filter member 40A. Therefore, the light from the optical lens entering the inside of the camera module can be further filtered by the filter member 40A to improve the imaging quality of the camera module. As introduced above, although the features and advantages of the array camera module of the present invention are illustrated by taking two filter members 40A as an example in FIG. 20, one skilled in the art can understand that the array camera module may also comprise only one filter member 40A. After the filter member 40A is mounted on the top surface of the mold base 23A, the filter member 40A simultaneously covers the light window 231A in such a manner that the photosensitive area 212A of each of the photosensitive elements 21A may be positioned corresponding to different positions of the filter member 40A respectively.

Furthermore, the top surface of the molded base 23A comprises at least two inner surfaces 233A and one outer surface 234A, wherein in one example, the inner surfaces 233A and the outer surface 234A are on the same plane. The top surface of the molded base 23A is formed into a complete whole plane, wherein the filter members 40A are mounted on the inner surfaces 233A of the molded base 23A respectively, wherein the light windows 231A are enclosed by the filter members 40A respectively and the drivers 30 are mounted on different positions of the outer surface 234A of the molded base 23A to enable the filter member 40A positioned between the optical lens 10A mounted on the driver 30A and the photosensitive area 212A of the photosensitive element 21A. In another example, the inner surfaces 233A are positioned at a lower plane than the outer surface 234A to form at least two recesses 235A of the molded base 23A. The top surface of the molded base 23A has a stepped shape, and the filter members 40A mounted on the inner surface 233A of the molded base 23A are respectively positioned in the recesses 235A of the molded base 23A.

According to FIG. 22, the drivers 30A of the array camera module are mounted in the mounting spaces 51A of the supporter 50A respectively, and then a glue as a filler is filled between the outer casings of the drivers 30A and the inner wall of the supporter 50A to ensure that each of the drivers 30A does not sway when the array camera module is mounted or used, thereby ensuring the optical lenses 10A being coaxially mounted on the drivers 30A by the supporters 50A respectively, and the supporters 50A can also strengthen the structure of the array camera module to improve the stability of the array camera module. It is worth to mention that, in one embodiment, only the driver 30A may be disposed in the mounting space 51A of the supporter 50A such that the supporter 50A covers at least a part of the driver 30A. In another embodiment, the supporter 50A may also further cover at least a part of the molded base 23A, wherein the invention should not be limited herewith.

Figure 25:
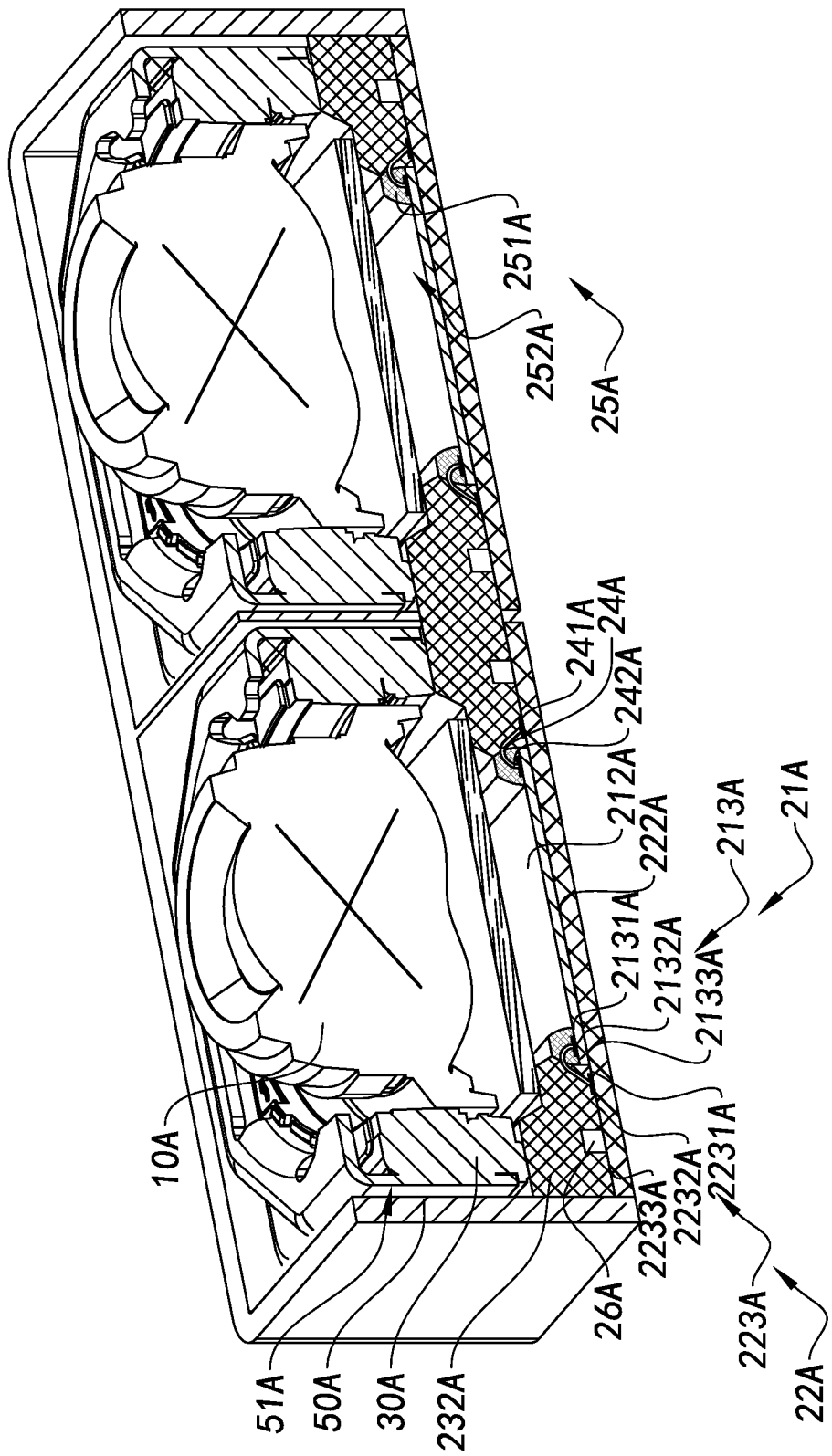
FIG. 25 is a perspective view of an alternative mode of the array camera module according to the above preferred embodiment of the present invention.

FIG. 25 illustrates a second alternative mode of the embodiment of the array camera module. Unlike the above embodying mode of the preferred embodiment of the present invention, the array camera module comprises two circuit boards 22A, each of which comprises one chip mounting area 222A and one periphery area 223A, wherein the photosensitive elements 21A are respectively mounted on the chip mounting areas 222A the circuit boards 22A. During the molding process for forming the molded base 23A, the molded body 232A of the molded base 23A and at least a part of the periphery area 223A of each of the circuit boards 22A are integrally connected. That is, in this alternative mode of the embodiment of the array camera module of the present invention, the circuit boards 22A are separable type circuit boards.

Figure 26:
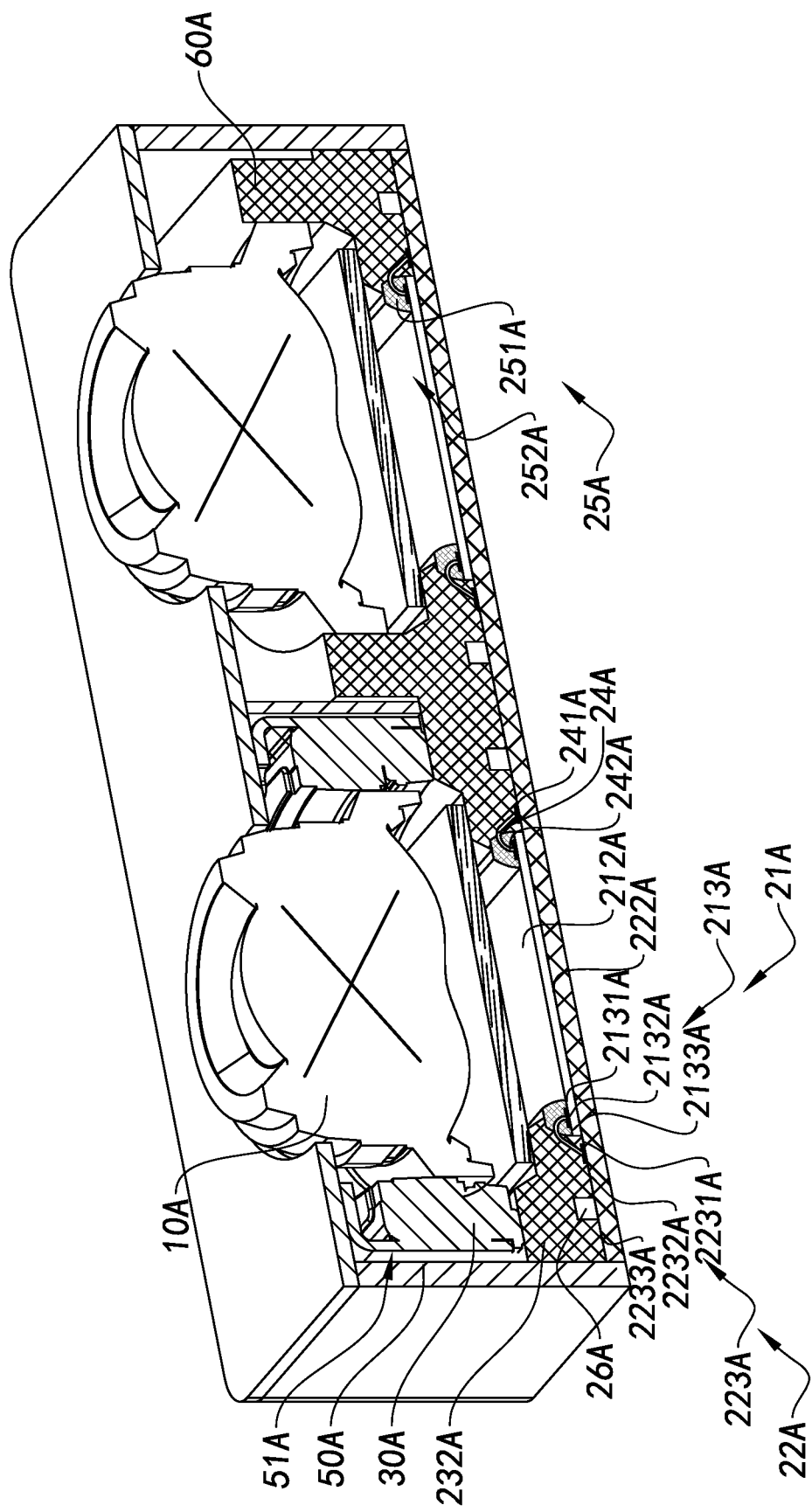
FIG. 26 is a perspective view of an alternative mode of the array camera module according to the above preferred embodiment of the present invention.

FIG. 26 illustrates a third alternative mode of the embodiment of the array camera module, wherein the array camera module comprises at least one lens-barrel 60A and at least one driver 30A, wherein the lens-barrel 60A is extended integrally on the top surface of the molded base 23A and the driver 30A is mounted on the top surface of the molded base 23A, wherein the lens-barrel 60A and the driver 30A are respectively adapted to mount the optical lens 10A thereon. Preferably, the lens-barrel 60A and the molded base 23A are integrally molded by a molding process. For example, when the array camera module is implemented as a dual lens camera module, the array camera module comprises only one driver 30A and one lens barrel 60A.

Figure 27A:
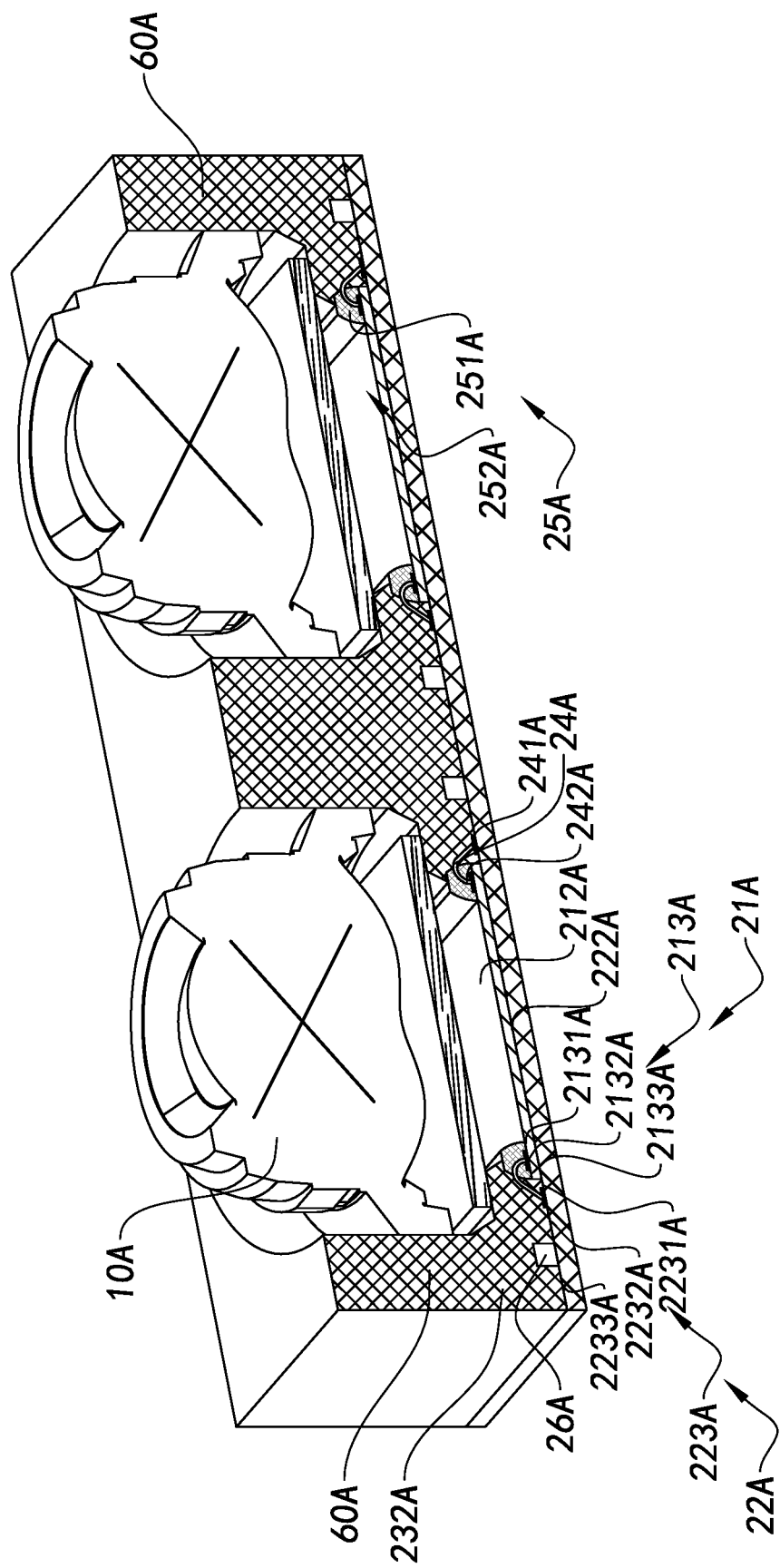
FIG. 27A is a perspective view of an alternative mode of the array camera module according to the above preferred embodiment of the present invention.

FIG. 27A illustrates a fourth alternative mode of the embodiment of the array camera module, wherein the array camera module comprises at least two lens barrels 60A, wherein each of the lens barrels 60A is integrally extended from the top surface of the molded base 23, and the optical lenses 10A are mounted on the lens barrels 60A respectively. Preferably, the lens barrels 60A and the molded base 23A are molded integrally during the molding process.

Figure 27B:
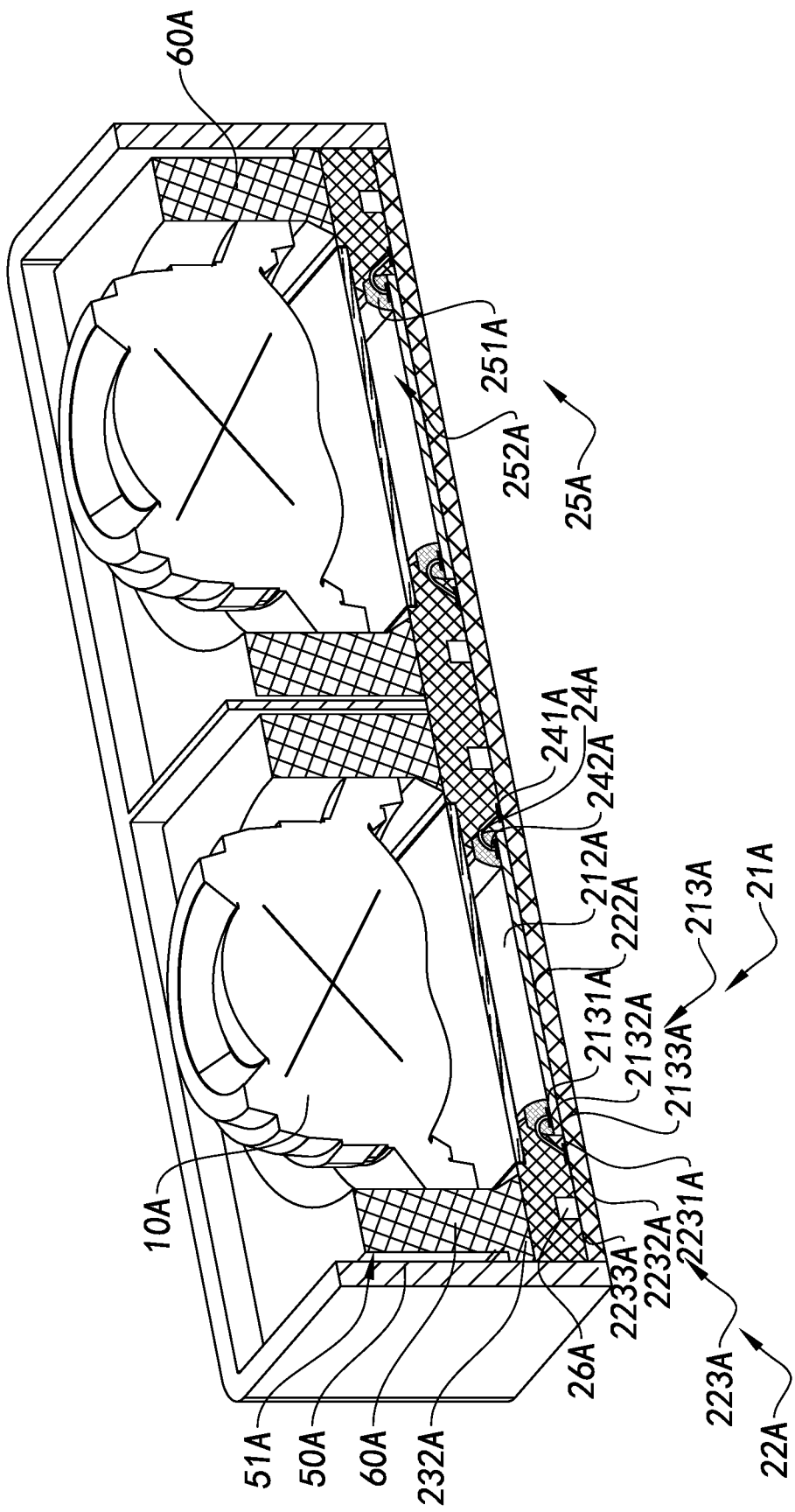
FIG. 27B is a perspective view of an alternative mode of the array camera module according to the above preferred embodiment of the present invention.

FIG. 27B illustrates a fifth alternative mode of the embodiment of the array camera module, wherein the array camera module comprises at least two lens barrels 60A. After the molded photosensitive assembly 20A is molded, the lens barrels 60A are respectively mounted on different positions on the top surface of the molded base 23A, and the optical lenses 10A are respectively mounted on the lens barrels 60A, so that the optical lenses 10A are held in the photosensitive paths of the photosensitive elements 21A respectively. It should be mentioned that each of the lens-barrels 60A may be a threaded lens barrel or an unthreaded lens barrel, and the present invention should not be limited to the types of lens-barrel.

In addition, two embodiments of the array camera module as shown in FIG. 27A and FIG. 27B are exemplary descriptions, and in other examples, at least one of the lens barrels 60A may be integrally molded with the molded base 23A by the molding process, and the other lens-barrel 60A can be mounted on the top surface of the molded base 23A. For example, when the array camera module is embodied as a two-lens camera module, one of the lens barrels 60A may be integrally molded with the molded base 23A by the molding process, and the other lens barrel 60A may be mounted on the top surface of the molded base 23A for focus adjusting.

Figure 28A:
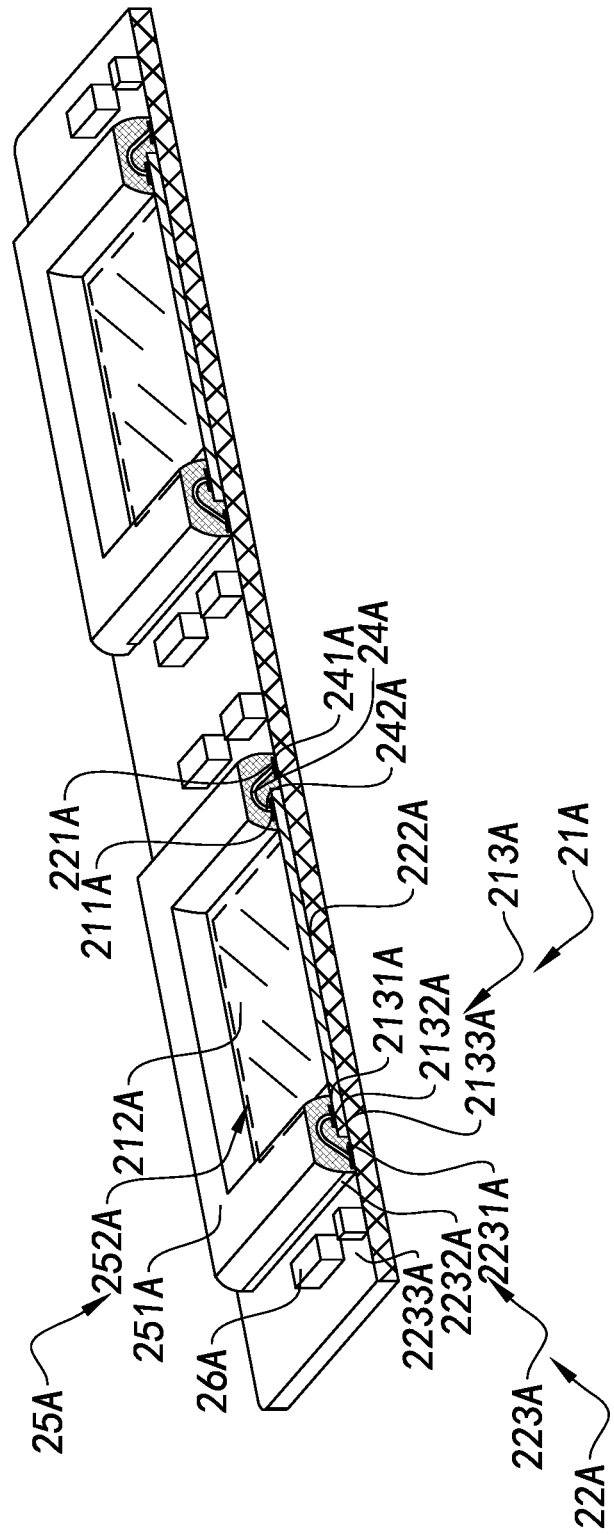
FIG. 28A is a perspective view of an alternative mode of the molded photosensitive assembly semi-finished product of the array camera module according to the above preferred embodiment of the present invention, illustrating that at least a part of the periphery area of the circuit board and the chip-outer portion, the chip-connecting portion and at least a part of the chip-inner portion of the non-photosensitive area of the photosensitive element are covered by the supporting body.

FIG. 28A illustrates an alternative mode of the embodiment of the molded photosensitive assembly 20A of the array camera module, wherein the supporting body 251A covers a part of the periphery area 223A of the circuit board 22A, the chip-inner portion 2131A, the chip-connecting portion 2132A, and at least a part of the chip-outer portion 2133A of the non-photosensitive area 213A of the photosensitive element 21A to form the molded base 23A. After molding, a part of the periphery area 223A of the circuit board 22A and the outer surface 2503A and at least a part of the top surface 2501A of the supporting body 251A are covered by the molded body 232A of the molded base 23A.

It is worth mentioning that the supporting body 251A can cover all of the wires 24A to fix each of the wires 24A before the molded base 23A is formed, wherein during the molding process, the supporting body 251A can prevent the wires 24A from contacting with the molding material, thereby preventing the impact force generated by the molding material added and filled in the molding cavity 103A from causing deformation of the wires 24A. In addition, the supporting body 251A may also have a good heat insulating property, so that after the molding material is added to the molding cavity 103A, heat is insulated from transmitting through the supporting body 251A during the curing of the molding material to the wires 24A so as to further ensure good electrical conductivity of the wires 24A.

Furthermore, the supporting body 251A is simultaneously formed on a part of the periphery area 223A of the circuit board 22A and at least a part of the non-photosensitive area 213A of the photosensitive element 21A for fixing the photosensitive element 21A and with the circuit board 22A, so that the supporting body 251A can prevent the photosensitive element 21A and the circuit board 22A from being displaced during the closing and clamping process of the molding process. The flatness of the photosensitive element 21A is also ensured.

Furthermore, the supporting body 251A is simultaneously formed on a part of the periphery area 223A of the circuit board 22A and at least a part of the non-photosensitive area 213A of the photosensitive element 21A to prevent any gap formed between the photosensitive element 21A and the mounting position of the circuit board 22A by means of the supporting body 251A, so that the supporting body 251A can prevent the molding material from entering the photosensitive element 21A between the circuit boards 22A during the molding process. The flatness of the photosensitive element 21A is ensured, thereby further improving the imaging quality of the array camera module.

Figure 28B:
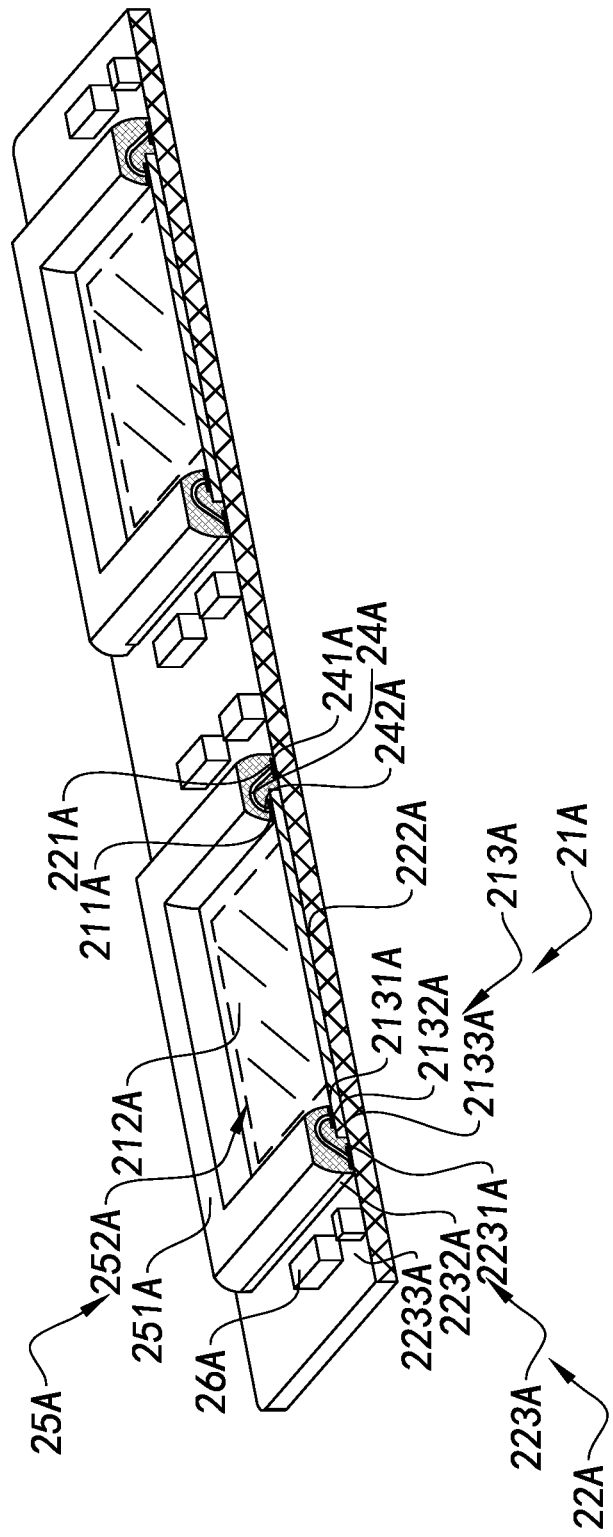
FIG. 28B is a perspective view of an alternative mode of the molded photosensitive assembly semi-finished product of the array camera module according to the above preferred embodiment of the present invention, illustrating that at least a part of the periphery area of the circuit board and the chip-outer portion and at least a part of the chip-connecting portion the non-photosensitive area of the photosensitive element are covered by the supporting body.

FIG. 28B illustrates another alternative mode of the embodiment of the molded photosensitive assembly 20A of the array camera module of the present invention, wherein the supporting body 251A covers a part of the periphery area 223A of the circuit board 22A, at least a part of the chip-connecting portion 2132A and the chip-outer portion 2133A of the non-photosensitive area 213A of the photosensitive element 21A to form the molded base 23A. After molding, a part of the periphery area 223A of the circuit board 22A and the outer surface 2503A and at least a part of the top surface 2501A of the supporting body 251A are covered by the molded body 232A of the molded base 23A.

Figure 28C:
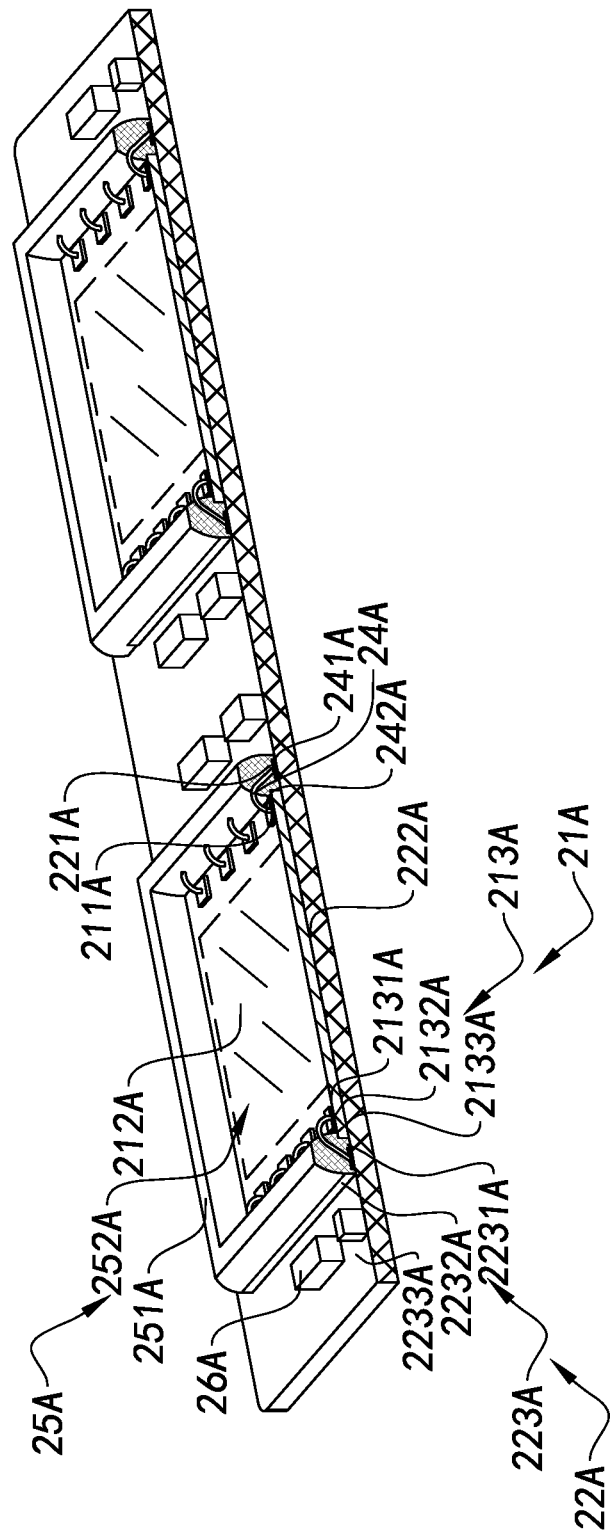
FIG. 28C is a perspective view of an alternative mode of the molded photosensitive assembly semi-finished product of the array camera module according to the above preferred embodiment of the present invention, illustrating that at least a part of the periphery area of the circuit board and at least a part of the chip-outer portion of the non-photosensitive area of the photosensitive element are covered by the supporting body.

Similarly, FIG. 28C illustrates another alternative mode of the embodiment of the molded photosensitive assembly 20A of the array camera module of the present invention, wherein the supporting body 251A covers a part of the periphery area 223A of the circuit board 22A and a part of the chip-inner portion 2131A of the non-photosensitive area 213A of the photosensitive element 21A to form the molded base 23A. After molding, a part of the periphery area 223A of the circuit board 22A and the outer surface 2503A and at least a part of the top surface 2501A of the supporting body 251A are covered by the molded body 232A of the molded base 23A.

One skilled in the art should understand that, in the two embodiments of the molded photosensitive assembly 20A as shown in FIG. 28B and FIG. 28C, the supporting body 251A may not cover the chip-inner portion 2131A of the non-photosensitive area 213A of the photosensitive element 21A, wherein the chip-inner portion 2131A of the photosensitive element 21A can be designed in a smaller size, such that the photosensitive element 21A having the same size can receive more light, thereby the imaging quality of the array camera module can be improved under controlling the size of the array camera module.

In addition, the supporting body 251A may not cover the chip-inner portion 2131A of the photosensitive element 21A, so that before the glue is applied and cured on a part of the non-photosensitive area 213A of the photosensitive element 21A to form the supporting body 251A, the glue flows away from the photosensitive area 212A of the photosensitive element 21A, so that even if the glue flows, the glue only flows to the chip-inner portion 2131A of the photosensitive element 21A, but not to the photosensitive area 212A of the photosensitive element 21A, thereby preventing the photosensitive area 212A of the photosensitive element 21A from being contaminated. That is, the chip-inner portion 2131A can maintain a safe distance between the supporting body 251A and the photosensitive area 212A of the photosensitive element 21A.

Figure 28D:
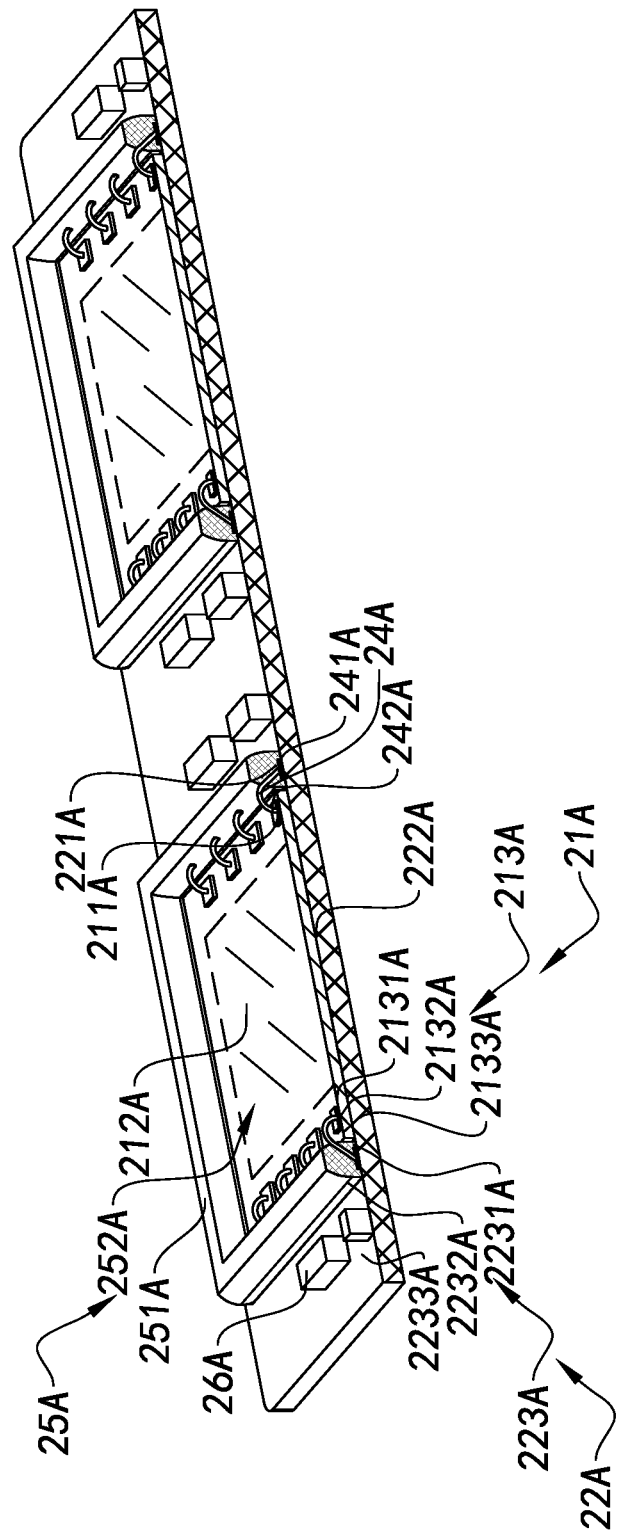
FIG. 28D is a perspective view of an alternative mode of the molded photosensitive assembly semi-finished product of the array camera module according to the above preferred embodiment of the present invention, illustrating that at least a part of the periphery area of the circuit board is covered by the supporting body.

FIG. 28D illustrates another alternative mode of the embodiment of the molded photosensitive assembly 20A of the array camera module of the present invention, wherein the supporting body 251A covers a part of the periphery area 223A of the circuit board 22A to form the molded base 23A. After molding, a part of the periphery area 223A of the circuit board 22A and the outer surface 2503A and at least part of the top surface 2501A of the supporting body 251A are covered by the molded body 232A of the molded base 23A.

Figure 28E:
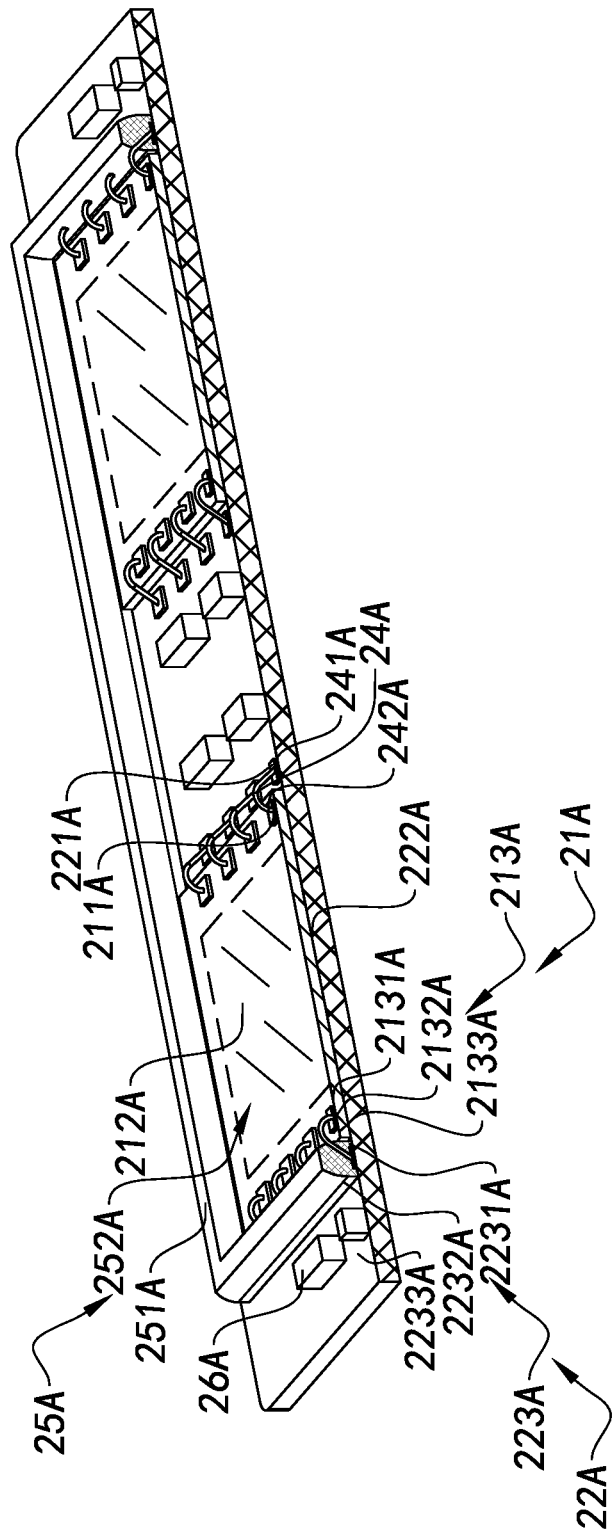
FIG. 28E is a perspective view of an alternative mode of the molded photosensitive assembly semi-finished product of the array camera module according to the above preferred embodiment of the present invention, illustrating that at least a part of the periphery area of the circuit board is covered by the supporting body.

FIG. 28E illustrates another alternative mode of the embodiment of the molded photosensitive assembly 20A of the array camera module of the present invention, wherein the number of the supporting member 25A is one. The supporting body 251A of the supporting member 25A covers a part of the periphery area 223A of the circuit board 22A such that the photosensitive areas 212A of the photosensitive elements 21A are arranged simultaneously corresponding to the same through hole 252A of the supporting member 25A. After the molded base 23A is molded, another portion of the periphery area 223A of the circuit board 22A and the outer surface 2503A and at least a part of the top surface 2501A of the supporting body 251A are covered by the molded body 232A of the molded base 23A.

In the two embodiments of the molded photosensitive assembly 20A of the array camera module of the present invention as shown in FIGS. 28D and 28E, the supporting body 251A may not cover any position of the non-photosensitive area 213A of the photosensitive element 21A. The supporting body 251A is arranged away from the photosensitive area 212A of the photosensitive element 21A, thereby avoiding any glue or other material forming the supporting body 251A to contaminate the photosensitive area 212A of the photosensitive element 21A during molding. Preferably, in the two embodiments of the molded photosensitive assembly 20A of the array camera module of the present invention as shown in FIGS. 28D and 28E, the supporting body 251A may cover connection positions of the wires 24A and the circuit connector 221A of the circuit board 22A, so that the supporting body 251A can prevent the molding material from contacting the connection position of each of the wires 24A and the circuit board 22A during the molding process to prevent the wires 24A from being deformed and detached.

One skilled in the art would understand that, although a plurality of embodiments of the molded photosensitive assembly 20A of the array camera module is illustrated in FIGS. 28A to 28E, they are merely examples of features and advantages of the invention. The supporting body 251A may cover the circuit-connecting portion 2232A, the circuit-inner portion 2231A and the circuit-outer portion 2233A of the circuit board 22A, and at least a part of at least one of the chip-outer portion 2133A, the chip-connecting portion 2132A and the chip-inner portion 2131A of the photosensitive element 21A. For example, the supporting body 251A may cover a part of the circuit-connecting portion 2232A of the circuit board 22A or all the circuit-connecting portions 2232A. Therefore, although the position where the supporting body 251A is covered by the covering body is not described in the following description of the present invention, one skilled in the art can understand that the scope of the array camera module of the present invention can include that the supporting body 251A is provided to cover any position and a combination of any position of the periphery area 223A of the circuit board 22A and the non-photosensitive area 213A of the photosensitive element 21A.

Figure 29:
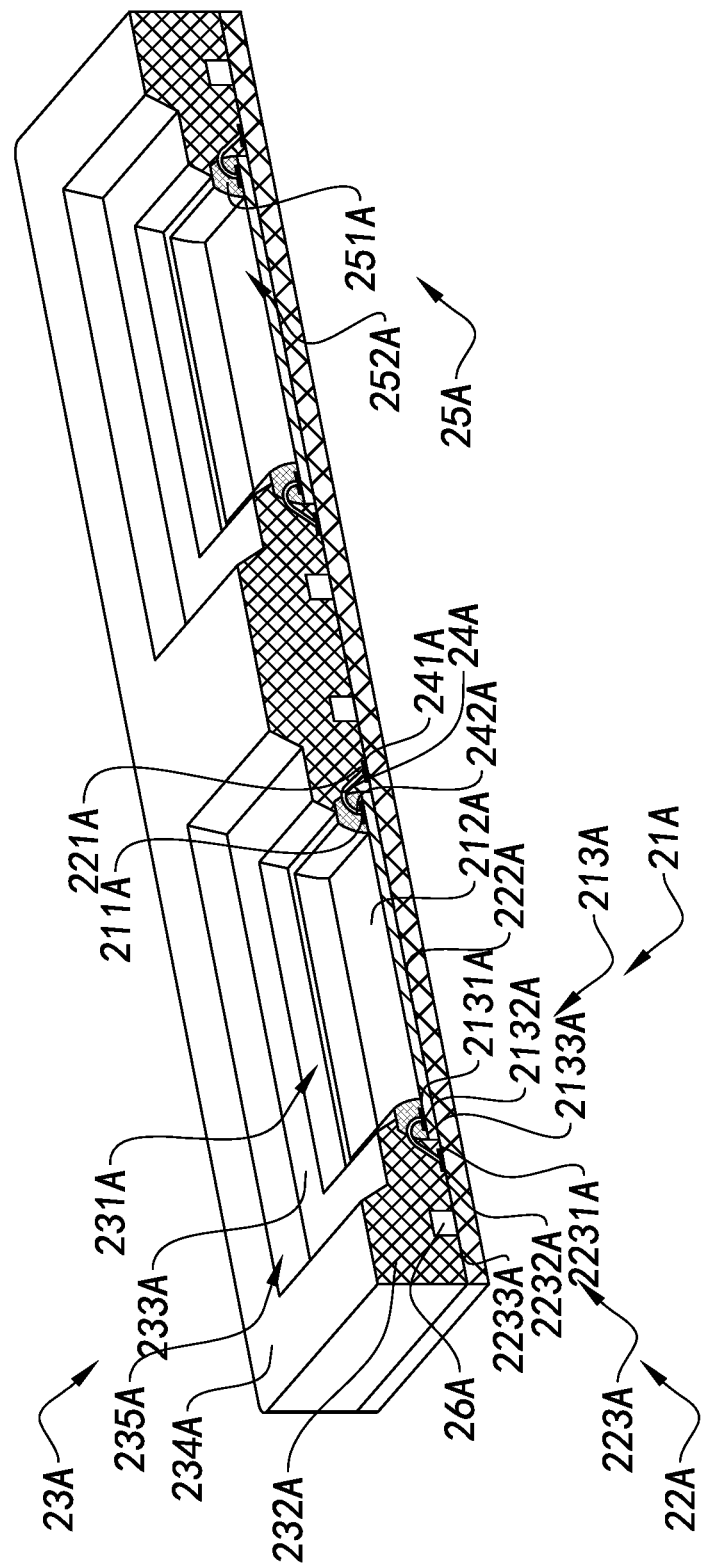
FIG. 29 is a sectional view of an alternative mode of the molded photosensitive element of the array camera module according to the above preferred embodiment of the present invention, illustrating that the molded base is covered by the outer surface of the supporting body.

In addition, FIG. 29 illustrates another alternative mode of the embodiment of the molded photosensitive assembly 20A of the array camera module of the present invention, wherein the pressing surface 1011A of the upper mold 101A and at least a part of the top surface 2501A of the supporting body 251A are contacted to covering at least a part of the top surface 2501A of the supporting body 251A by the molded body 232A after the molded base 23A is formed.

Figure 30:
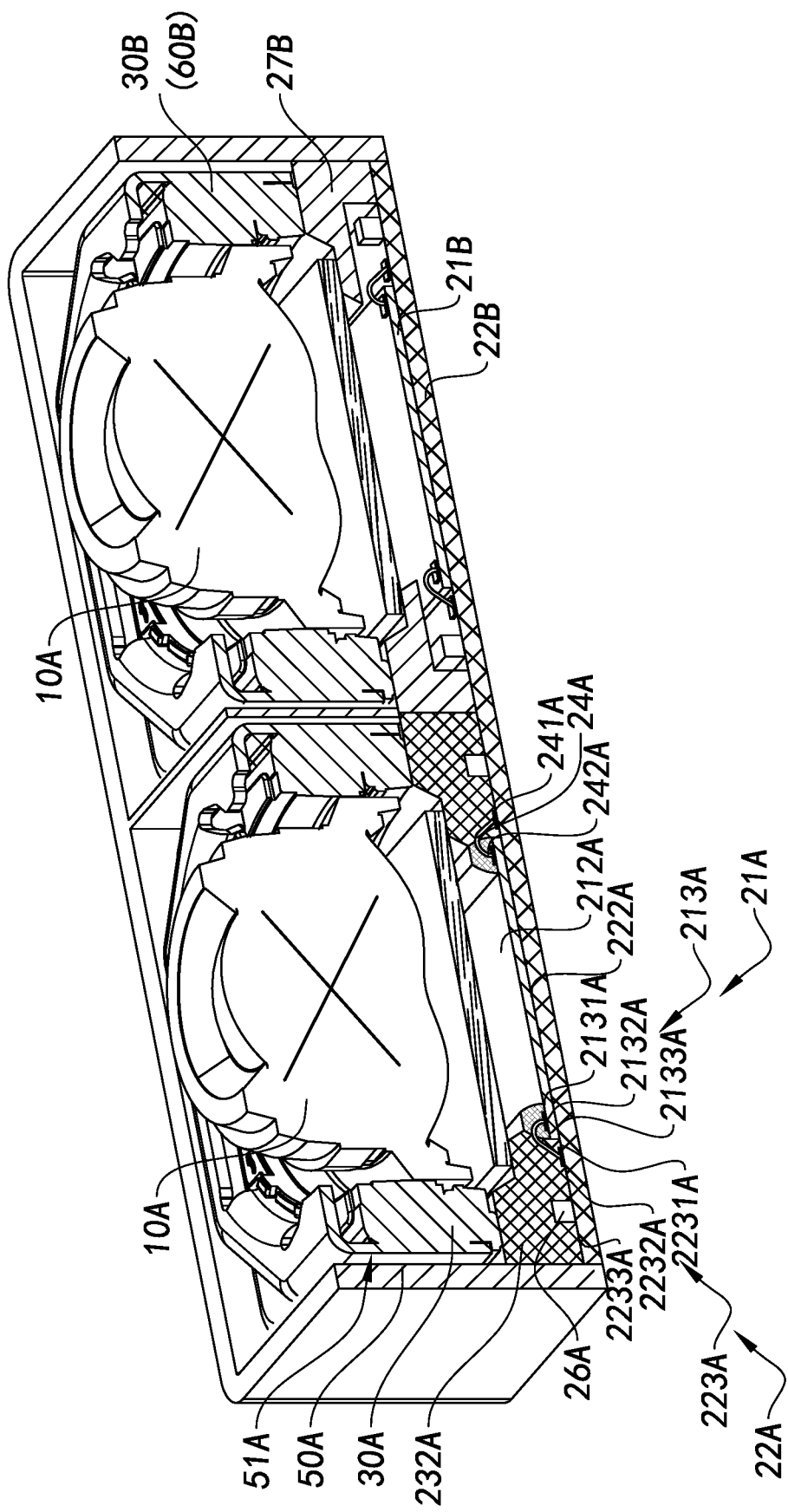
FIG. 30 is a sectional perspective view of the array camera module according to another preferred embodiment of the present invention.

It is worth to mention that, according to an embodiment of the invention, the array camera module comprises at least two optical lenses 10A and one molded photosensitive assembly 20A, wherein the optical lenses 10A are respectively set on the photosensitive paths of the photosensitive elements 21A of the molded photosensitive assembly 20A as described above in the present invention. In another embodiment, as shown in FIG. 30, the array camera module may also comprise at least two optical lenses 10A, one molded photosensitive element 20A and at least one additional photosensitive element 21B, wherein each of the additional photosensitive elements 21B is mounted on the circuit board 22A of the molded photosensitive assembly 20A, and the optical lenses 10A are provided along the photosensitive path of the at least one additional photosensitive element 21B and the photosensitive element 21A of the molded photosensitive element 20A respectively to form the array camera module. In addition, the array camera module further comprises at least one additional supporter 27B and at least one additional driver 30B or at least one additional lens-barrel 60B, wherein the at least one additional supporter 27B is mounted on the circuit board 22A of the molded photosensitive unit 20A. The at least one additional driver 30B or the at least one additional lens-barrel 60B is mounted on the circuit board 22A, and each of the optical lenses 10A is mounted on the driver 30A or lens-barrel 60A or the additional driver 30B or the additional lens-barrel 60B, such that the optical lenses 10A are respectively held along the photosensitive paths of the additional photosensitive element 21B and the photosensitive element 21A of the molded photosensitive assembly 20A. In addition, the additional photosensitive element 21B may not be mounted on the circuit board 22A of the molded photosensitive assembly 20A, but an additional circuit board 22B may be provided by the array camera module for mounting the additional photosensitive element 21B.

Figure 31:
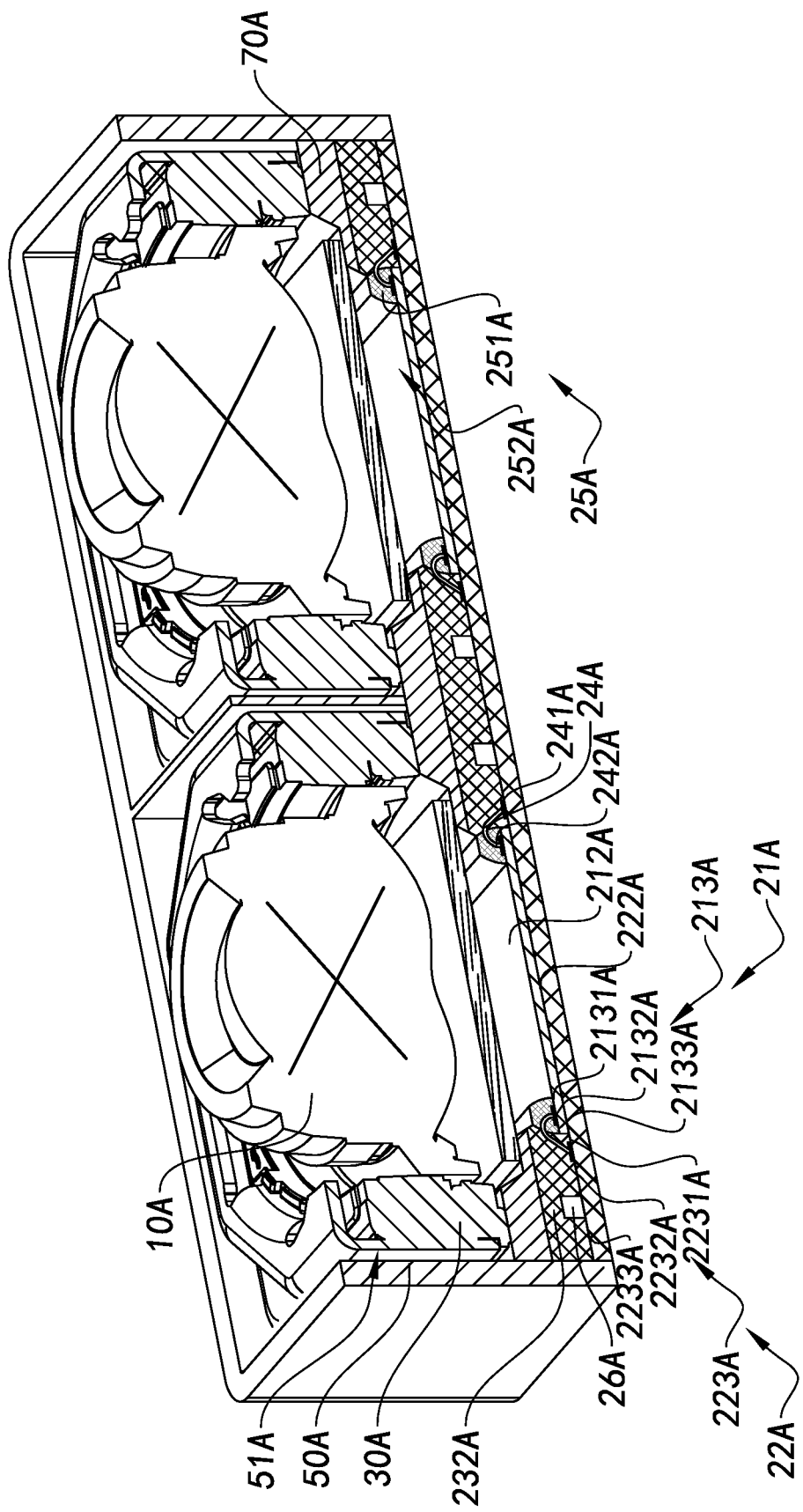
FIG. 31 is a sectional perspective view of the array camera module according to another preferred embodiment of the present invention.

FIG. 31 illustrates another alternative mode of the embodiment of the array camera module in which the filter member 40A is not directly mounted on the molded body 232A of the molded base 23A, but that the array camera module further provides at least one holder 70A, wherein the filter members 40A are mounted on the at least one holder 70A, and then the at least one holder 70A is mounted on the top surface of the molded body 232A such that the filter members 40A are respectively held between the optical lenses 10A and the photosensitive elements 21A, so that the size of the array camera module is reduced that reduces the manufacturing cost of the array camera module.

It is worth to mention that, in one embodiment, the number of the holders 70A equals to the number of the filter members 40A. That is, the holders 70A and the filter members 40A are matched and aligned one by one. For example, when the number of the filter members 40A is one, the number of the holders 70A is also one. In another embodiment, the number of the holders 70A, the number of the filter members 40A, and the number of the optical lenses 10A are preferred the same. For example, in the example as shown in FIG. 21, the number of the holders 70A, the number of the filter members 40A and the number of the optical lenses 10A are two.

In another embodiment, the number of the holders 70A may also be different from the number of the filter members 40A. For example, the number of the holders 70A may be only one, and the number of the filter members 40A may be more than one, wherein the filter members 40A can be mounted on different positions of the holder 70A.

With further referencing to FIG. 31, the top surface of the molded body 232A can be a flat surface, so that after the molded base 23A is molded, the holder 70A is firstly mounted on the top surface of the molded body 232A, and then the driver 30A or the lens barrel 60A is mounted on the holder 70A. That is, the driver 30A or the lens barrel 60A may not be directly mounted on the top surface of the molded body 232A, and may be mounted on the holder 70A.

Figure 32:
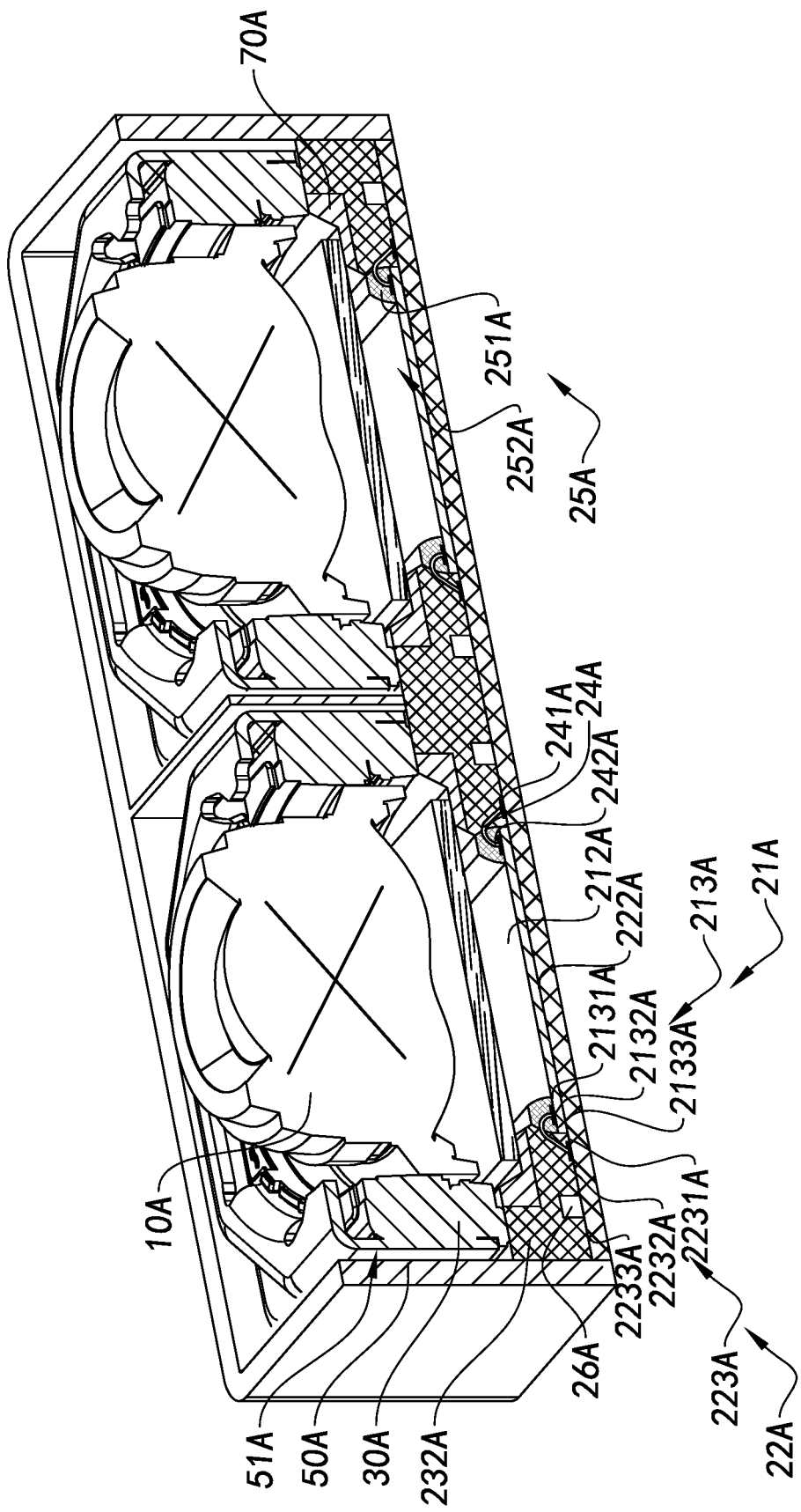
FIG. 32 is a sectional perspective view of the array camera module according to another preferred embodiment of the present invention.

FIG. 32 illustrates another alternative mode of the embodiment of the camera module, wherein the top surface of the molded body 232A has a recess 235A, wherein the holder 70A mounted on the top surface of the molded body 232A is received in the recess 235A to further reduce the height of the camera module. In this situation, the driver 30A or the lens barrel 60A can be directly mounted on the top surface of molded body 232A.

However, it will be understood by one skilled in the art that in other alternative modes of the array camera module of the present invention that, the optical lens 10A may also be directly mounted on the top surface of the molded body 232A or the optical lens 10A can also be directly mounted on the top surface of the holder 70A.

Figure 33:
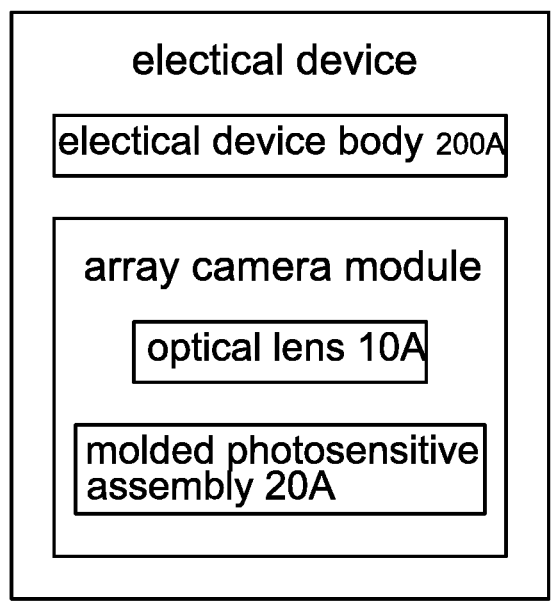
FIG. 33 is a schematic view of an electronic device with the array camera module according to another preferred embodiment of the present invention.

According to another aspect of the present invention, referring to FIG. 33, the present invention further provides an electronic device equipped with array camera module, wherein the electronic device with array camera module comprises an electronic device body 200A and at least one array camera module, wherein the at least one array camera modules is disposed on the electronic device body 200A for acquiring images.

According to another aspect of the present invention, the present invention further provides a manufacturing method of a molded photosensitive assembly 20A, wherein the manufacturing method comprises the steps of:

(a) connecting a photosensitive element 21A and a circuit board 22A through a set of wires 24A;

(b) placing the photosensitive element 21A and the circuit board 22A in an upper mold 101A or a lower mold 102A of a molding-die 100A;

(c) by closing and clamping the upper mold 101A and the lower mold 102A, supporting the upper mold 101A upwardly by a supporting member 25A to prevent the pressing surface 1011A of the upper mold 101A from being pressed against the set of wires 24A; and (d) adding and filling a fluid molding material into a molding cavity 103A formed between the upper mold 101A and the lower mold 102A to form a molded base 23A after the molding material is solidified and cured, wherein the molded base 23A comprises a molded body 232A and has a light window 231A, wherein at least a part of an periphery area 223A of the circuit board 22A and at least a part of the supporting member 25A are covered by the molded body 232A, wherein the photosensitive area 212 of the photosensitive elements 21A is positioned corresponding to the light window 231A.

Referring to FIG. 34A to FIG. 36F of the drawings, a camera module according to a preferred embodiment of the present invention is illustrated, wherein the camera module comprises at least one optical lens 10C, at least one photosensitive element 21C, at least one circuit board 22C, at least one protective frame 300C, and at least one integrated package holder 400C.

It is worth mentioning that the camera module of the present invention may be a fixed focus camera module or a zoom camera module. In other words, whether or not the camera module of the present invention allows focusing does not limit the scope of the present invention.

More specifically, the camera module of the present invention may be a single-lens camera module or a multi-lens camera module. For example, in a specific example, the camera module may be embodied as an array camera module. In other words, the number of the optical lens 10C of the camera module of the present invention does not limit the scope of the present invention.

Figure 34A:
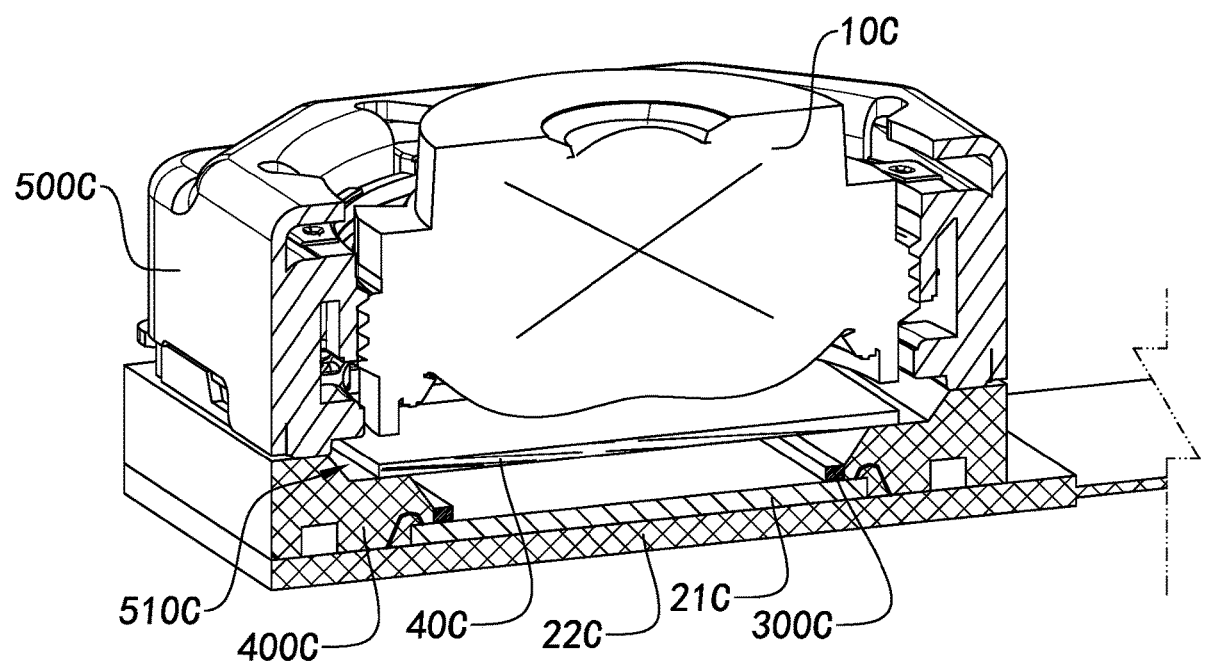
FIG. 34A is a sectional view of the camera module according to another preferred embodiment of the present invention.

Specifically, in the camera module of the present invention as shown in FIG. 34A, the protective frame 300C is convexly provided on the outer peripheral side of the photosensitive area of the photosensitive element 21C. It is worth mentioning that the protective frame 300C is similar with the supporting member 25 of the above embodiments of the present invention. The photosensitive element 21C is electrically connected to the circuit board 22C, and the integrated package holder 400C is provided to wrap at least a part of the circuit board 22C and at least a part of the protective frame 300C. Furthermore, the integrated package holder 400C may further cover at least a part of the non-photosensitive area of the photosensitive element 21C after being molded, so that the integrated package holder 400C, the photosensitive element 21C and the circuit board 22C are integrated to form a single piece. It is worth mentioning that the integral package holder 400C is similar with the molded base 23 of the above embodiments of the present invention. The optical lens 10C is disposed in a photosensitive path of the photosensitive element 21C. Light reflected by the object can be concentrated by the optical lens 10C to the inside of the camera module and be further received and photoelectrically converted by the photosensitive element 21C to generate an image related to the object.

In a specific example of the camera module of the present invention, the photosensitive element 21C is mounted on the circuit board 22C and the photosensitive element 21C is electrically connected with the circuit board 22C. For example, the photosensitive element 21C may be electrically connected to the circuit board 22C by a wire bonding process. For example, a gold wire is connected between the non-photosensitive area of the photosensitive element 21C and the circuit board 22C to electrically connect the photosensitive element 21C and the circuit board 22C by the gold wire as shown in FIG. 34A.

In another specific example of the camera module of the present invention, the photosensitive element 21C is electrically connected to the circuit board 22C while being mounted on the circuit board 22C. For example, the non-photosensitive area of the photosensitive element 21C is provided with a chip pad, and the circuit board 22C is provided with a circuit board pad. When the photosensitive element 21C is mounted on the circuit board 22C, the chip pad of the photosensitive element 21C is electrically connected with the circuit board pad of the circuit board 22C.

The protective frame 300C is a hollow structure that the protective frame 300C can be looped on the outer peripheral of the photosensitive area of the photosensitive element 21C. Preferably, the size of the inner side of the protective frame 300C is greater than or equal to the size of the photosensitive area of the photosensitive element 21C, so that when the protective frame 300C is protrudedly formed on the photosensitive element 21C, the protective frame 300C can be held on the outer peripheral side of the photosensitive area of the photosensitive element 21C so that the protective frame 300C does not block the photosensitive area of the photosensitive element 21C.

Preferably, the size of the outer side of the protective frame 300C is smaller than the size of the photosensitive element 21C, so that when the protective frame 300C is protrudedly formed on the photosensitive element 21C, the outer side of the non-photosensitive area of the photosensitive element 21C can be electrically conducted with the photosensitive element 21C and the circuit board 22C by a wire bonding process. However, it will be understood by one skilled in the art that when the photosensitive element 21C and the circuit board 22C are electrically connected through the chip pad and the circuit board pad, the size of the outer side of the protective frame 300C may be the same as the size of the photosensitive element 21C.

The integrated package holder 400C wraps the circuit board 22C and the non-photosensitive area of the photosensitive element 21C after being molded, for integrating the integrated package holder 400C, the circuit board 22C and the photosensitive element 21C into an integral body. In this way, the structural stability of the camera module can be increased, and the size of the camera module can be reduced, so that the camera module can be applied to an electronic device which is thin and in lightweight.

Furthermore, the integrated package holder 400C is arranged to wrap the outer peripheral side of the protective frame 300C, so that the integrated package holder 400C, the circuit board 22C, the protective frame 300C, and the photosensitive element 21C are integrated into an integral body. It can be understood that the integrated package holder 400C can also be arranged to wrap at least a part of the top surface of the protective frame 300C.

Furthermore, as shown in FIG. 34A, the camera module comprises at least one lens holding member 500C, wherein the lens holding member 500C is provided above an upper portion of the integrated package holder 400C, and the optical lens 10C is disposed on the lens holding member 500C to hold the optical lens 10C in the photosensitive path of the photosensitive element 21C by the lens holding member 500C.

In a specific example of the camera module of the present invention, the lens holding member 500C is disposed on an upper portion of the integrated package holder 400C after molded. In another specific example of the camera module of the present invention, the lens holding member 500C can be integrally formed with the integrated package holder 400C. In this way, the packaging error of manufacturing the camera module can be reduced to improve the imaging quality of the camera module.

Preferably, the lens holding member 500C may be embodied as a driver, such as a motor. That is, the optical lens 10C is operatively provided on the lens holding member 500C to be driven by the lens holding member 500C. The optical lens 10C moves back and forth along the photosensitive path of the photosensitive element 21C for adjusting the focal length of the camera module by changing the position between the optical lens 10C and the photosensitive element 21C. It is worth mentioning that the lens holding member 500C may be a variety of drivers for driving the optical lens 10C to move reciprocatedly along the photosensitive path of the photosensitive element 21C. For example, in this preferred embodiment of the invention, the lens holding member 500C may be implemented as a voice coil motor.

One skilled in the art will understand that once the lens holding member 500C is embodied as a motor, the lens holding member 500C is electrically connected to the circuit board 22C.

Furthermore, as shown in FIG. 34A, the camera module comprises a filter member 40C, wherein the filter member 40C is disposed between the optical lens 10C and the photosensitive element 21C. When light reflected by an object is collected from the optical lens 10C to the inside of the camera module, the light is filtered by the filter member 40C and received and photoelectrically converted by the photosensitive element 21C to improve the imaging quality of the camera module. In other words, the filter member 40C can function as a noise reduction to improve the imaging quality of the camera module.

It is worth to mention that the type of the filter member 40C can be unrestricted. For example, in a specific example of the camera module of the present invention, the filter member 40C can be embodied as an infrared cutoff filter for filtering infrared portion of the light by the filter member 40C, and in another specific example of the camera module of the present invention, the filter member 40C is embodied as a full-transmission spectral filter.

Figure 34B:
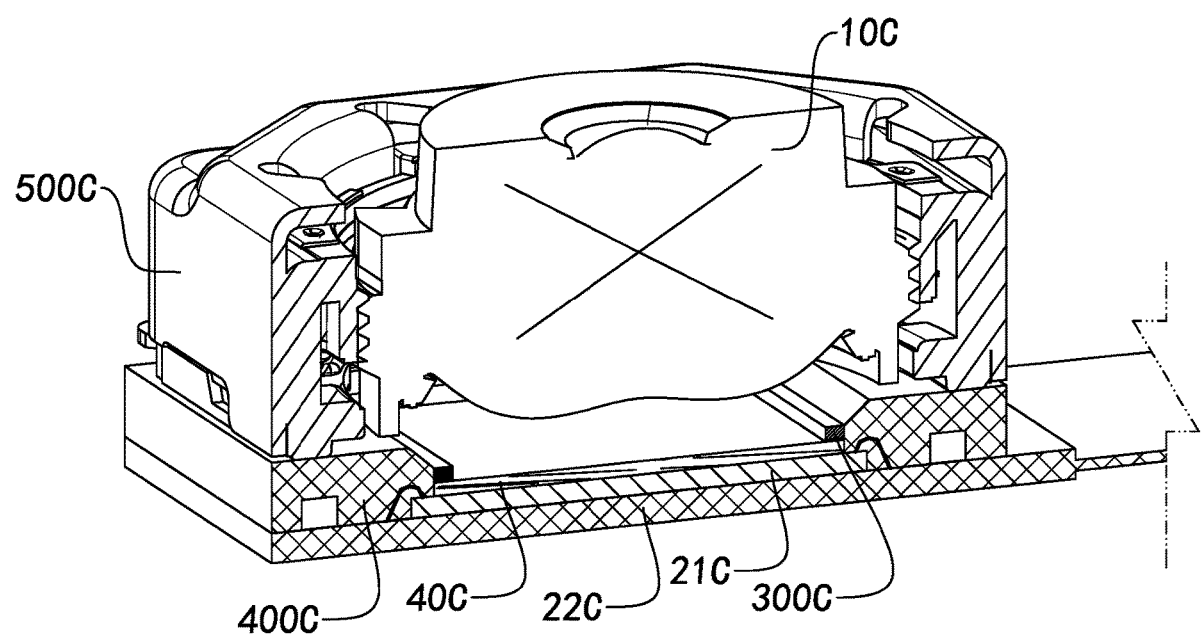
FIG. 34B is a sectional view of an alternative mode of the camera module according to the above preferred embodiment of the present invention.

According to an alternative mode of the embodiment of the camera module of the present invention as shown in FIG. 34B, the filter member 40C may also be provided on the photosensitive element 21C in an overlapping manner, and the protective frame 300C is formed on the outer peripheral side of the filter member 40C.

The integrated package holder 400C forms at least one mounting platform 410C for mounting the filter member 40C. For example, the mounting platform 410C may be a mounting recess formed in an upper portion of the integrated package holder 400C or the mounting platform 410C may be a flat surface formed on an upper portion of the integrated package holder 400C. In other words, the filter member 40C can be directly mounted on the upper portion of the integrated package holder 400C.

FIG. 36A to 36F are sectional views illustrating a manufacturing method of the camera module according to the present invention, wherein in the FIGS. 36A to 36F, the description of the camera module is shown in a sectional view for convenience of description of the structural relationship between the optical lens 10C, the photosensitive element 21C, the protective frame 300C, the circuit board 22C, and the integrated package holder 400C.

Figure 36A:
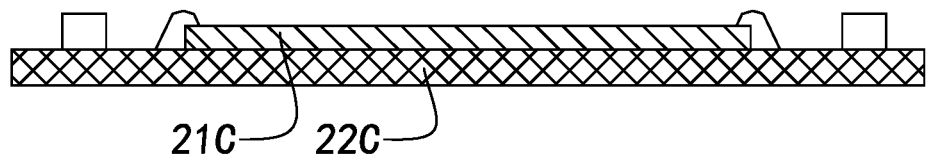
FIG. 36A is a sectional view of one of the manufacturing steps of the array camera module according to the above preferred embodiment of the present invention.

In the step shown in FIG. 36A, the photosensitive element 21C is conducted with the circuit board 22C. One skilled in the art will understand that, in the step as illustrated in FIG. 36A, after the photosensitive element 21C is mounted on the circuit board 22C, the photosensitive element 21C is electrically conducted with the circuit board 22C by a wire bonding process. The manner of which the photosensitive element 21C being electrically connected with the circuit board 22C is merely exemplified. The manner in which the photosensitive element 21C and the circuit board 22C are electrically connected does not constitute a limitation on the scope of the present invention. In another example of the camera module of the present invention, the photosensitive element 21C and the circuit board 22C may also be directly electrically connected through the chip pad and the circuit board pad.

Figure 36B:
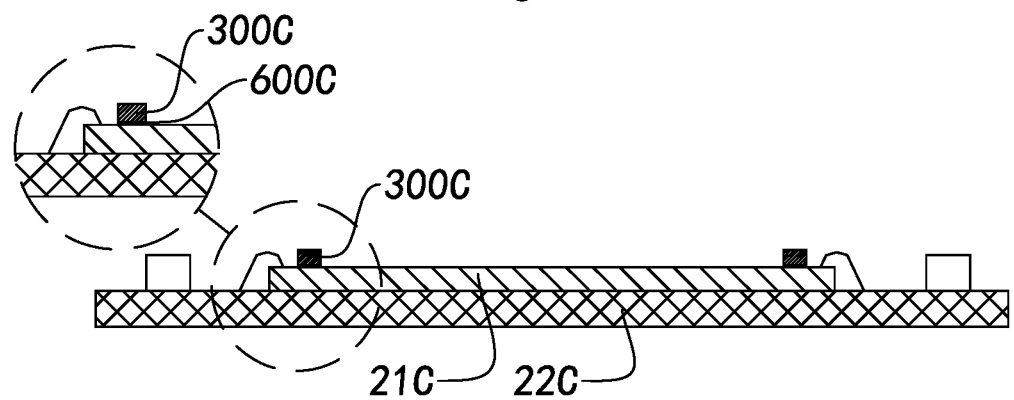
FIG. 36B is a sectional view of one of the manufacturing steps of the array camera module according to the above preferred embodiment of the present invention.

In the step as illustrated in FIG. 36B, the protective frame 300C is protrudedly provided on the outer peripheral side of the photosensitive area of the photosensitive element 21C. Specifically, in the manufacturing method of the camera module of the present invention, after the protective frame 300C is provided, the protective frame 300C is protrudedly formed on the outer peripheral side of the photosensitive area of the photosensitive element 21C. Preferably, a cementing layer 600C is formed between the protective frame 300C and the outer peripheral side of the photosensitive area of the photosensitive element 21C, and the cementing layer 600C is used to connect the protective frame 300C and the outer peripheral side of the photosensitive area the photosensitive element 21C.

For example, in an example of the camera module of the present invention, the glue is disposed on the outer peripheral side of the photosensitive frame 300C and/or the photosensitive area of the photosensitive element 21C to form the adhesive layer 600C between the protective frame 300C and/or the outer peripheral side of the photosensitive area of the photosensitive element 21C. That is, at least one of the surfaces of the protective frame 300C and the outer peripheral side of the photosensitive area of the photosensitive element 21C forms the cementing layer 600C. Subsequently, the cementing layer 600C is used to connect the protective frame 300C and the outer peripheral side of the photosensitive area of the photosensitive element 21C.

Preferably, after the glue is disposed on the outer peripheral side of the photosensitive frame 300C and the photosensitive area of the photosensitive element 21C, the glue may be rapidly solidified and cured to form the cementing layer 600C by heat curing or UV light curing for connecting the protective frame 300C and the outer peripheral side of the photosensitive area of the photosensitive element 21C. In another example of the camera module of the present invention, the protective frame 300C may be provided with the cementing layer 600C, so that the protective frame 300C may be directly used in the process of packaging the camera module. It is provided on the outer peripheral side of the photosensitive area of the photosensitive element 21C.

In addition, the protective frame 300C may be formed by an injection molding process or a stamping process. For example, the protective frame 300C may be a plastic product formed by an injection molding process.

Figure 35:
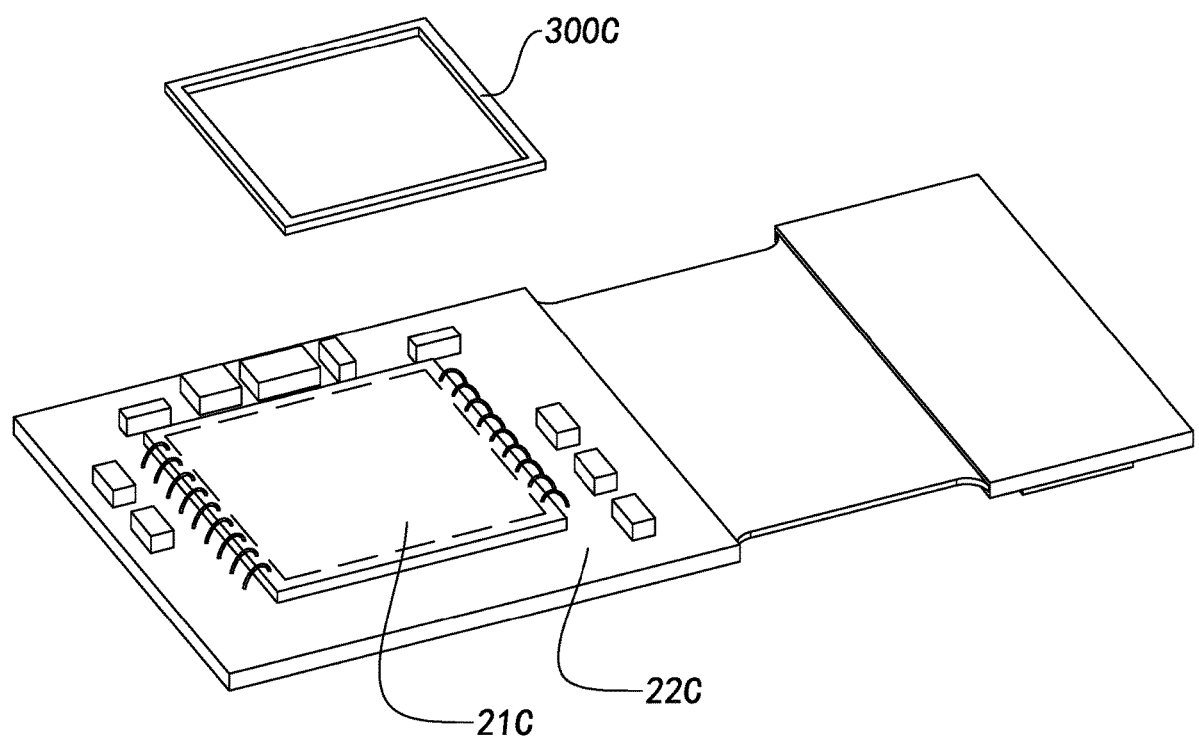
FIG. 35 is a perspective view of the circuit board, the photosensitive element and the protective frame of the camera module according to the above preferred embodiment of the present invention.

As shown in FIG. 35, the protective frame 300C is a hollow structure such that the protective frame 300C can be protrudedly formed on the outer peripheral side of the photosensitive area of the photosensitive element 21C for isolating the photosensitive area of the photosensitive element 21C with the external environment, so that during the subsequent encapsulation of the camera module, the protective frame 300C can prevent contaminants from entering the photosensitive area of the photosensitive element 21C to cause a bad stain point.

Figure 36C:
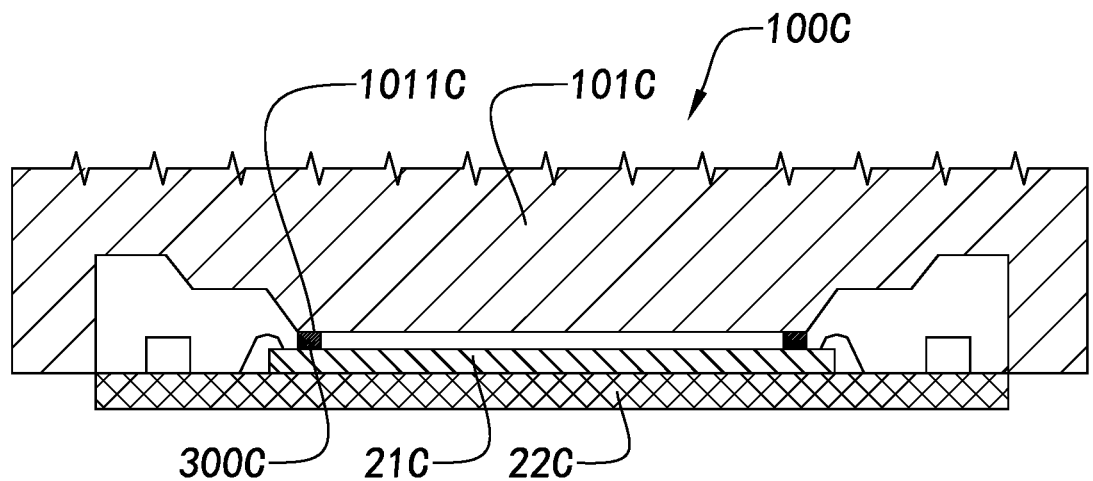
FIG. 36C is a sectional view of one of the manufacturing steps of the array camera module according to the above preferred embodiment of the present invention.

In the step as illustrated in FIG. 36C, the integral package holder 400C is formed by a molding-die 100C during the process of packaging the camera module, wherein the molding-die 100C comprises an upper mold 101C. A pressing surface 1011C of the upper mold 101C is pressed against the protective frame 300C to isolate the photosensitive area of the photosensitive element 21C and the external environment.

One skilled in the art would understand that the protective frame 300C is protrudedly formed on the outer peripheral side of the photosensitive area of the photosensitive element 21C, so that when the pressing surface 1011C of the upper mold 101C is pressed, the protective frame 300C can prevent the pressing surface 1011C of the upper mold 101C from contacting the photosensitive area of the photosensitive element 21C, so that the protective frame 300C can stop the pressing surface 1011C of the upper mold 101C causing damages or scratches to the photosensitive area of the photosensitive element 21C.

Figure 38:
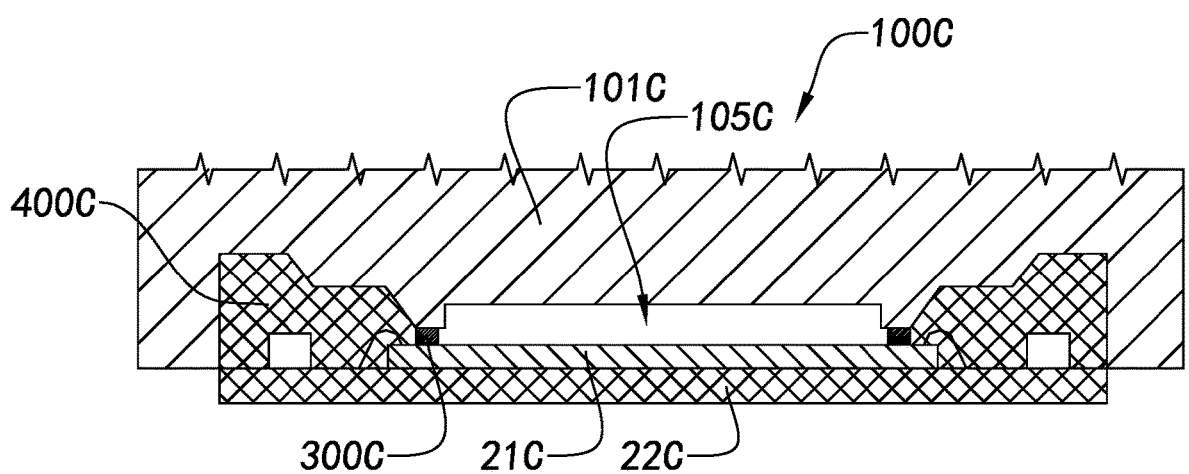
FIG. 38 is a sectional view of an alternative mode of one of the manufacturing steps in FIG. 36D of the array camera module according to the above preferred embodiment of the present invention.

Furthermore, an alternative mode of the manufacturing method of the camera module as illustrated in FIG. 38, wherein a recess 105C is formed in a concave manner in an inner surface of the upper mold 101C with respect to a part of the photosensitive area of the photosensitive element 21C, so that the recess 105C can maintain a safe distance between the photosensitive area of the photosensitive element 21C and the inner surface of the upper mold 101C during the process of molding the integral package holder 400C by the molding-die 100C. The safe distance further reduces the influence of the upper mold 101C on the photosensitive element 21C to prevent the photosensitive element 21C from being damaged or scratched by the inner surface of the upper mold 101C.

Preferably, the protective frame 300C has a predetermined elasticity such that when the pressing surface 1011C of the upper mold 101C is pressed against the protective frame 300C, the protective frame 300C can serve as a buffer to prevent the impact force generated by the upper mold 101C when contacting the protective frame 300C to damage the photosensitive element 21C. In addition, limited to the manufacturing method of the photosensitive element 21C and the manufacturing method of the circuit board 22C and the mounting process of the photosensitive element 21C and the circuit board 22C, there may be a mounting tilt after the photosensitive element 21C is mounted on the circuit board 22C. Accordingly, when the pressing surface 1011C of the upper mold 101C is pressed against the protective frame 300C, the protective frame 300C can be deformed and the photosensitive area of the photosensitive element 21C is isolated from the external environment to prevent the molding material for forming the integral package holder 400C from entering the photosensitive area of the photosensitive element 21C.

Figure 36D:
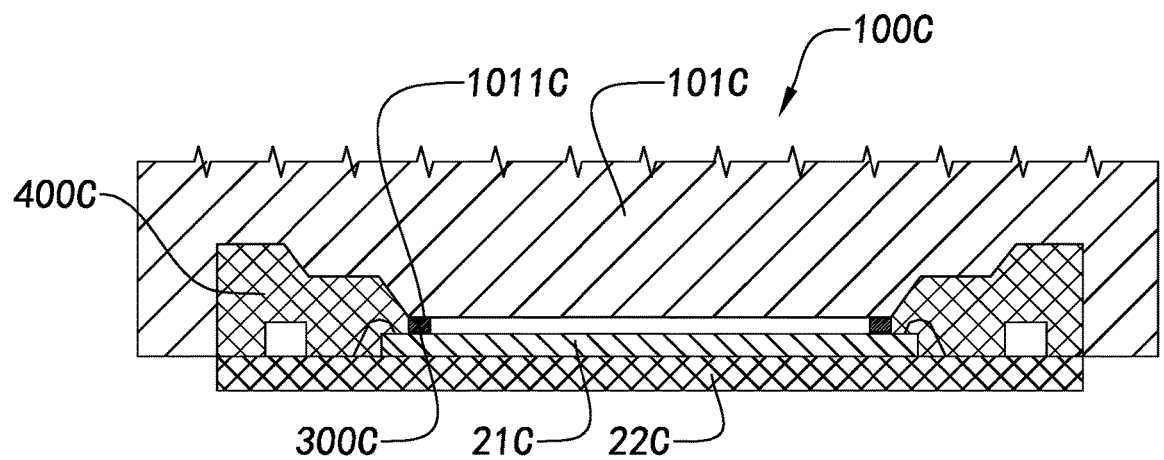
FIG. 36D is a sectional view of one of the manufacturing steps of the array camera module according to the above preferred embodiment of the present invention.
Figure 36E:
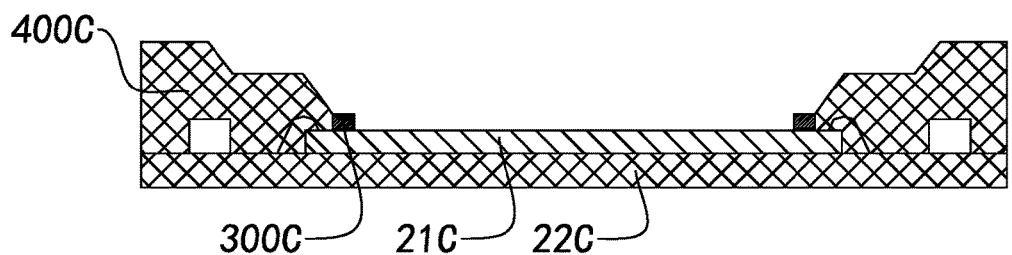
FIG. 36E is a sectional view of one of the manufacturing steps of the array camera module according to the above preferred embodiment of the present invention.

In the step as illustrated in FIG. 36D, the molding material is added and filled into the upper mold 101C, and the integral package holder 400C is formed after the molding material is cured, wherein the integral package holder 400C wraps the circuit board 22C and the non-photosensitive area of the photosensitive element 21C, such that the integrated package holder 400C, the circuit board 22C, and the photosensitive element 21C are integrated to form an integral body. Preferably, the integrated package holder 400C further wraps the outer peripheral side of the protective frame 300C to integrate the integrated package holder 400C, the circuit board 22C, the protective frame 300C, and the photosensitive element 21C to form an integral body. It is worth mentioning that the molding material is fluid or granular. After the molding-die 100C is removed, the integrally packaged holder 400C, the circuit board 22C, the protective frame 300C, and the photosensitive element 21C are integrally connected as shown in FIG. 36E.

One skilled in the art would understand that the photosensitive area of the photosensitive element 21C and the external environment are isolated, so that the molding material will not flow to the photosensitive area of the photosensitive element 21C after the molding material is added to the upper mold 101C, so that the protective frame 300C can prevent the molding material from damaging the photosensitive area of the photosensitive element 21C. In addition, the protective frame 300C has a predetermined elasticity such that there is no gap between the protective frame 300C and the upper mold 101C pressed against the protective frame 300C. Therefore, during the curing of the molding material added to the upper mold 101C, the phenomenon of "flashing" does not happen to ensure the image quality of the camera module.

Figure 37A:
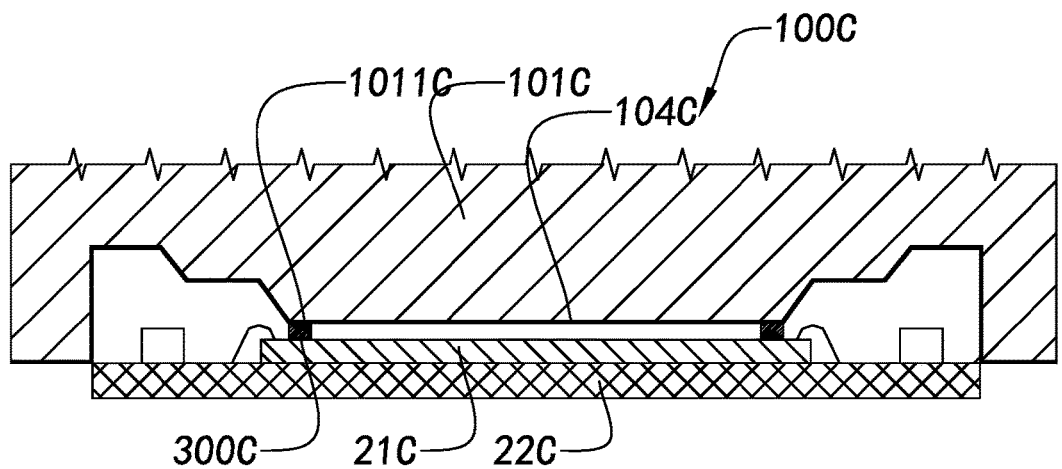
FIG. 37A is a sectional view of an alternative mode of one of the manufacturing steps in FIG. 36C of the array camera module according to the above preferred embodiment of the present invention.
Figure 37B:
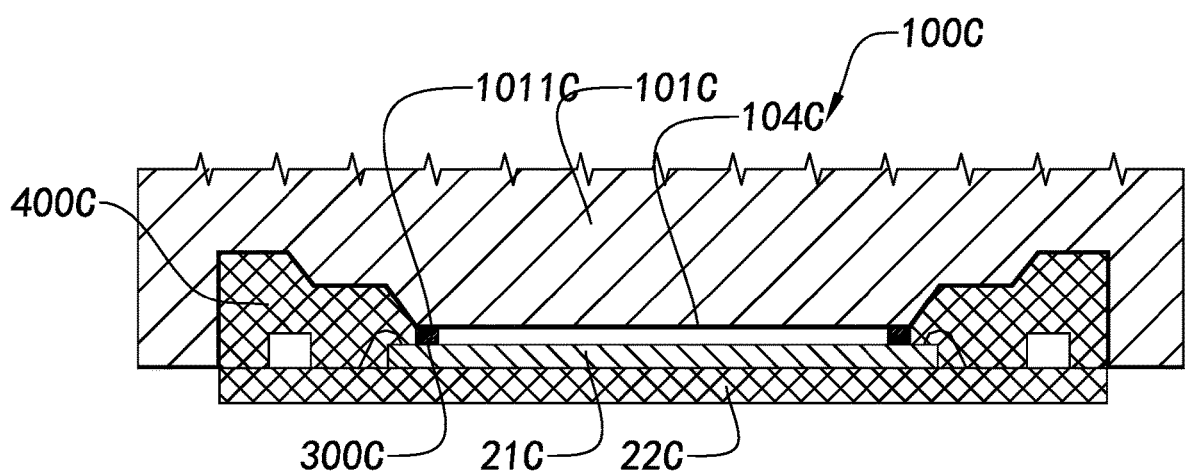
FIG. 37B is a sectional view of an alternative mode of one of the manufacturing steps in FIG. 36D of the array camera module according to the above preferred embodiment of the present invention.

Furthermore, according to an alternative mode of the manufacturing method of the camera module as illustrated in FIGS. 37A and 37B, wherein the pressing surface 1011C of the upper mold 101C is provided with a covering film 104C. When the pressing surface 1011C of the upper mold 101C is pressed against the protective frame 300C, the covering film 104C provided on the upper mold 101C is in direct contact with the protective frame 300C, so that the covering film 104C provides further protection to the photosensitive element 21C. In addition, it can be understood that the covering film 104C can reduce the difficulty of demolding and increase the sealing property by preventing the phenomenon "flash" appearing of the molding material on the inner side of the integrated package holder 400C during curing.

In addition, in the embodiment in which the pressing surface 1011C of the upper mold 101C is provided with the covering film 104, the protective frame 300C may also have no elasticity, so that the impact force generated when the mold 101C is pressed against the protective frame 300C is absorbed by the covering film 104C to avoid damaging the photosensitive element 21C.

Figure 36F:
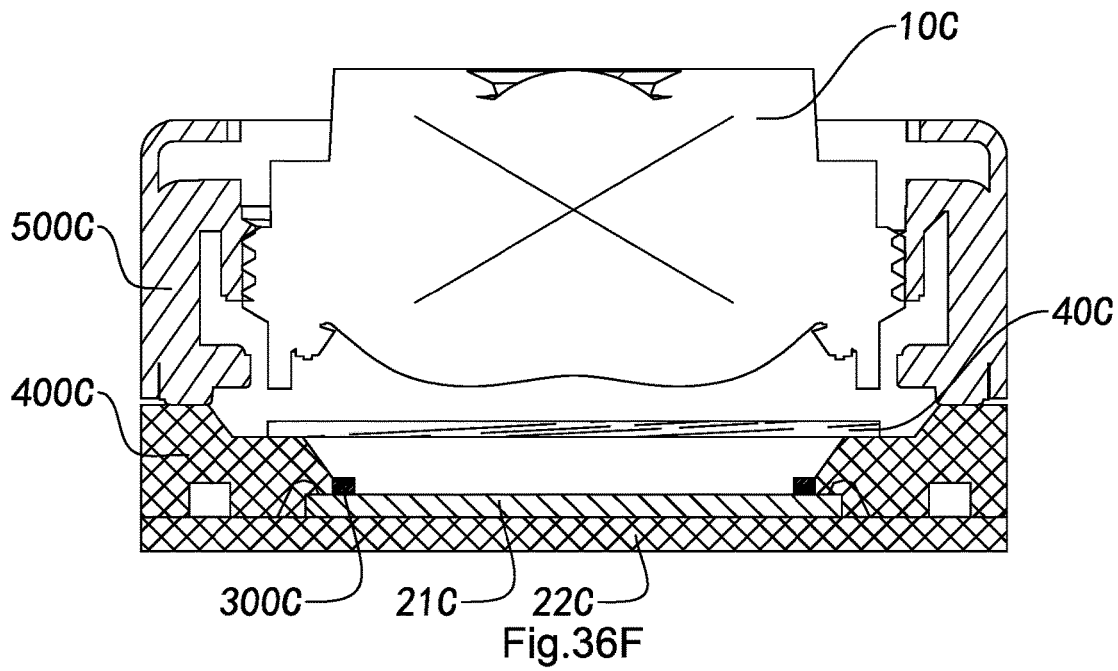
FIG. 36F is a sectional view of one of the manufacturing steps of the array camera module according to the above preferred embodiment of the present invention.

In the step as illustrated in FIG. 36F, the filter member 40C and the optical lens 10C are respectively arranged in the photosensitive path of the photosensitive element 21C to manufacture the camera module. Preferably, the filter member 40C is mounted on the integral package holder 400C and the optical lens 10C is held along the photosensitive path of the photosensitive element 21C by the lens holding member 500C provided to the integrated package holder 400C.

Figure 39A:
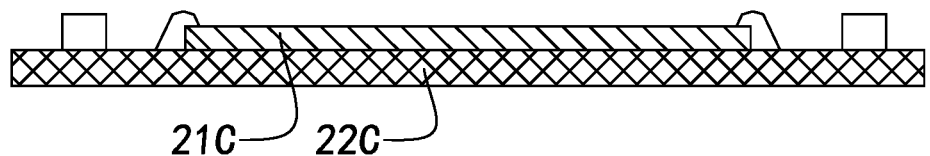
FIG. 39A is a sectional view of one of the manufacturing steps of the array camera module according to the above preferred embodiment of the present invention.

FIGS. 39A to 39G are sectional views illustrating another manufacturing method of the camera module according to the present invention. In the step as illustrated in FIG. 39A, the photosensitive element 21C is electrically connected with the circuit board 22C.

Figure 39B:
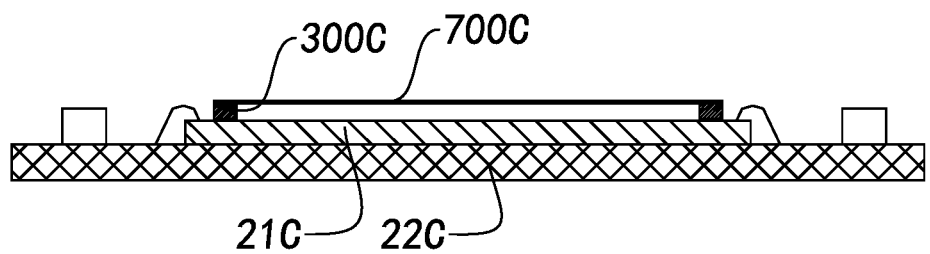
FIG. 39B is a sectional view of one of the manufacturing steps of the array camera module according to the above preferred embodiment of the present invention.

In the step as illustrated in FIG. 39B, the protective frame 300C is protrudedly formed on the outer peripheral side of the photosensitive area of the photosensitive element 21C. Preferably, the upper portion of the protective frame 300C is provided with a protective film 700C to facilitate the suction of the protective frame 300C by vacuum adsorption and the mounting of the protective frame 300C to the periphery of the photosensitive area of the photosensitive element 21C. It is understood by one skilled in the art that, after the protective frame 300C is disposed on the outer peripheral side of the photosensitive area of the photosensitive element 21C, the protective film 700C correspondingly covers the upper portion of the photosensitive area of the photosensitive element 21C to isolate the photosensitive area of the photosensitive element 21C and the external environment by the protective film 700C and the protective frame 300C, thereby preventing the molding material from flowing to the photosensitive area of the photosensitive element 21C in the subsequent steps.

Figure 39C:
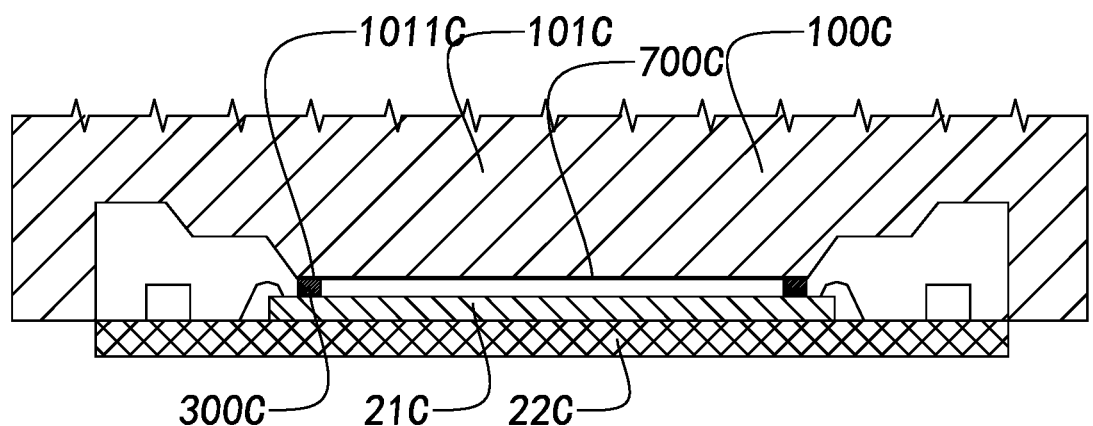
FIG. 39C is a sectional view of one of the manufacturing steps of the array camera module according to the above preferred embodiment of the present invention.

In the step as illustrated in FIG. 39C, the pressing frame 1011C of the upper mold 101C of the molding-die 100C is pressed against the protective frame 300C to further isolate the photosensitive area of the photosensitive element 21C and the external environment.

Figure 39D:
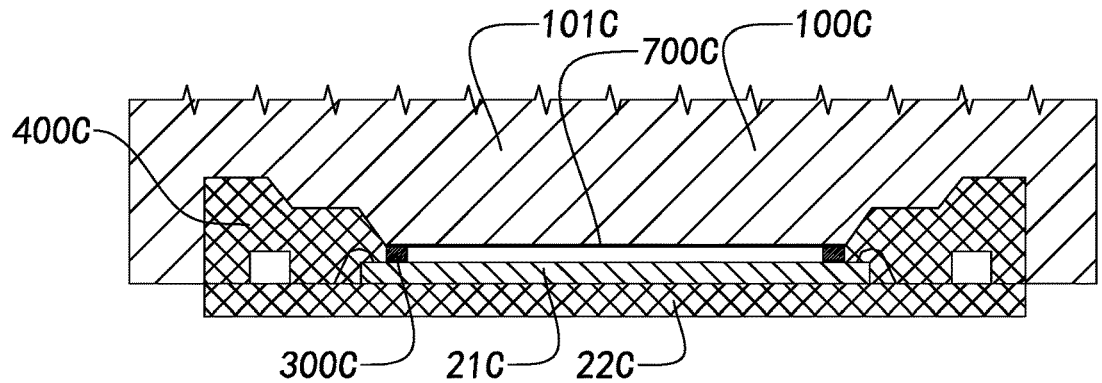
FIG. 39D is a sectional view of one of the manufacturing steps of the array camera module according to the above preferred embodiment of the present invention.
Figure 39E:
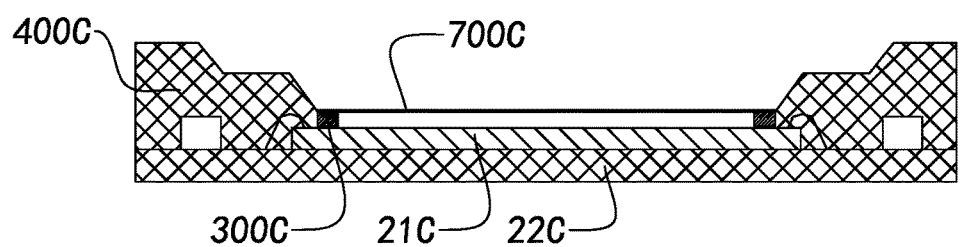
FIG. 39E is a sectional view of one of the manufacturing steps of the array camera module according to the above preferred embodiment of the present invention.

In the step as illustrated in FIG. 39D, the molding material is added to the molding-die 100C, and the integral package holder 400C is formed after the molding material is solidified and cured, wherein the integrated package holder 400C wraps the circuit board 22C and a non-photosensitive area of the photosensitive element 21C, so that the integrated package holder 400C, the circuit board 22C and the photosensitive element 21C are integrated to form an integral body. Preferably, the integrated package holder 400C further wraps the outer peripheral side of the protective frame 300C to integrate the integrated package holder 400C, the circuit board 22C, the protective frame 300C, and the photosensitive element 21C. After the molding-die 100C is opened, an integral body of the integrated package holder 400C, the circuit board 22C, the protective frame 300C, and the photosensitive element 21C can be obtained as shown in FIG. 39E, wherein the film 700C is still disposed on the protective frame 300C.

Figure 39F:
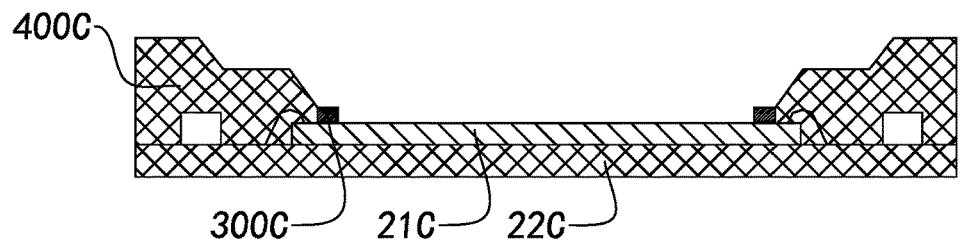
FIG. 39F is a sectional view of one of the manufacturing steps of the array camera module according to the above preferred embodiment of the present invention.

In the step as illustrated in FIG. 39F, the protective film 700C is removed from the protective frame 300C to obtain an integral body of the integrated package holder 400C, the circuit board 22C, the protective frame 300C, and the photosensitive element 21C.

Figure 39G:
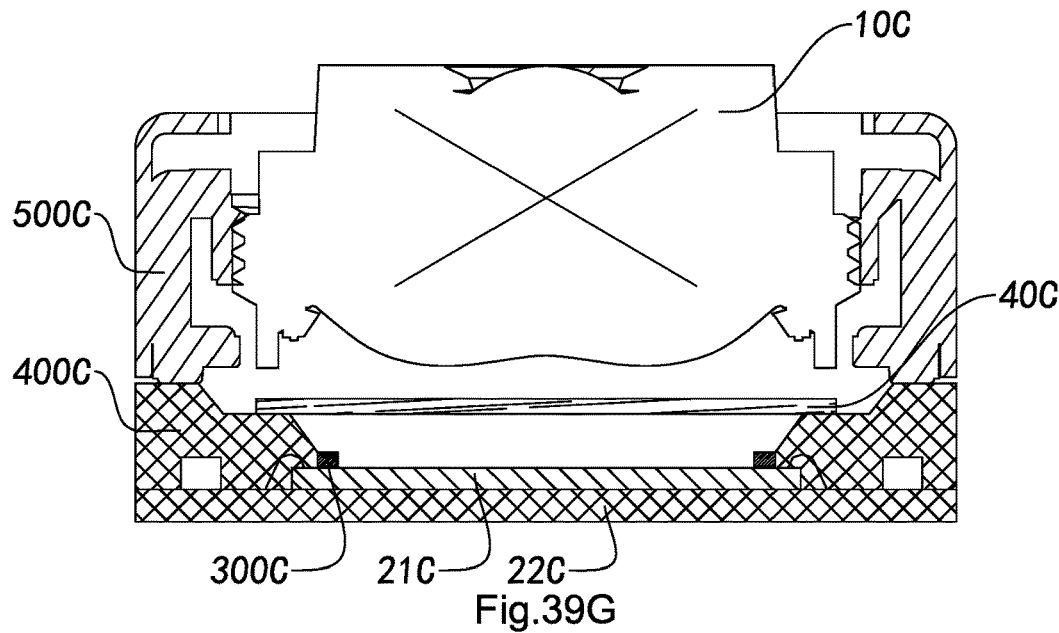
FIG. 39G is a sectional view of one of the manufacturing steps of the array camera module according to the above preferred embodiment of the present invention.
Figure 40:
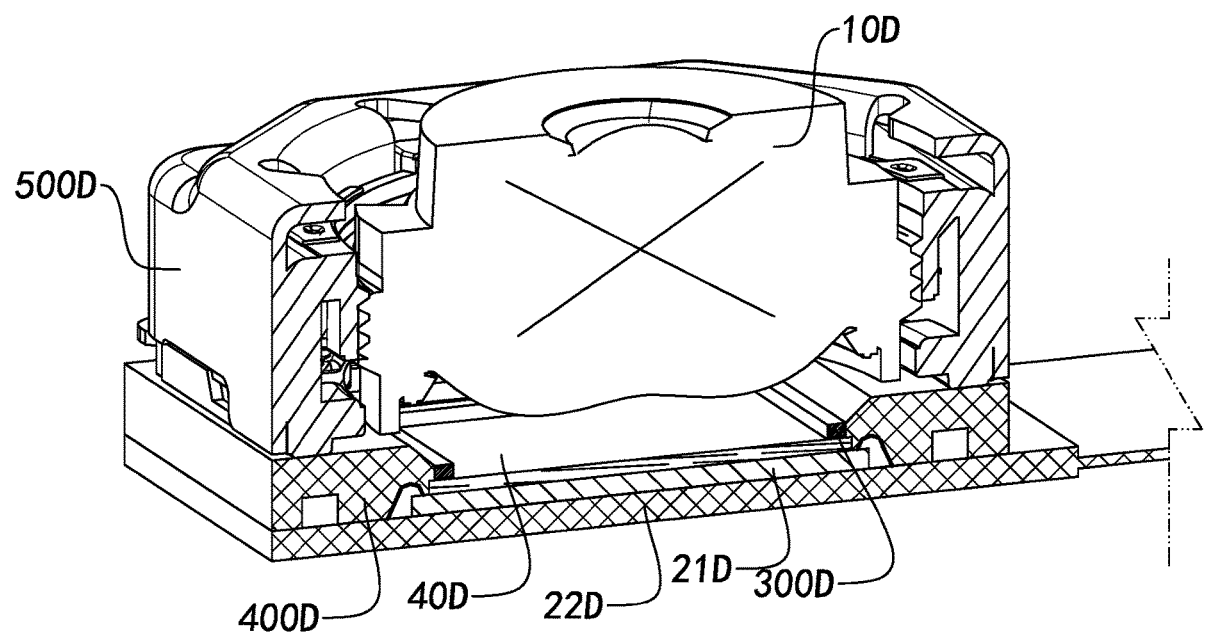
FIG. 40 is a sectional view of the camera module according to another preferred embodiment of the present invention.
Figure 41:
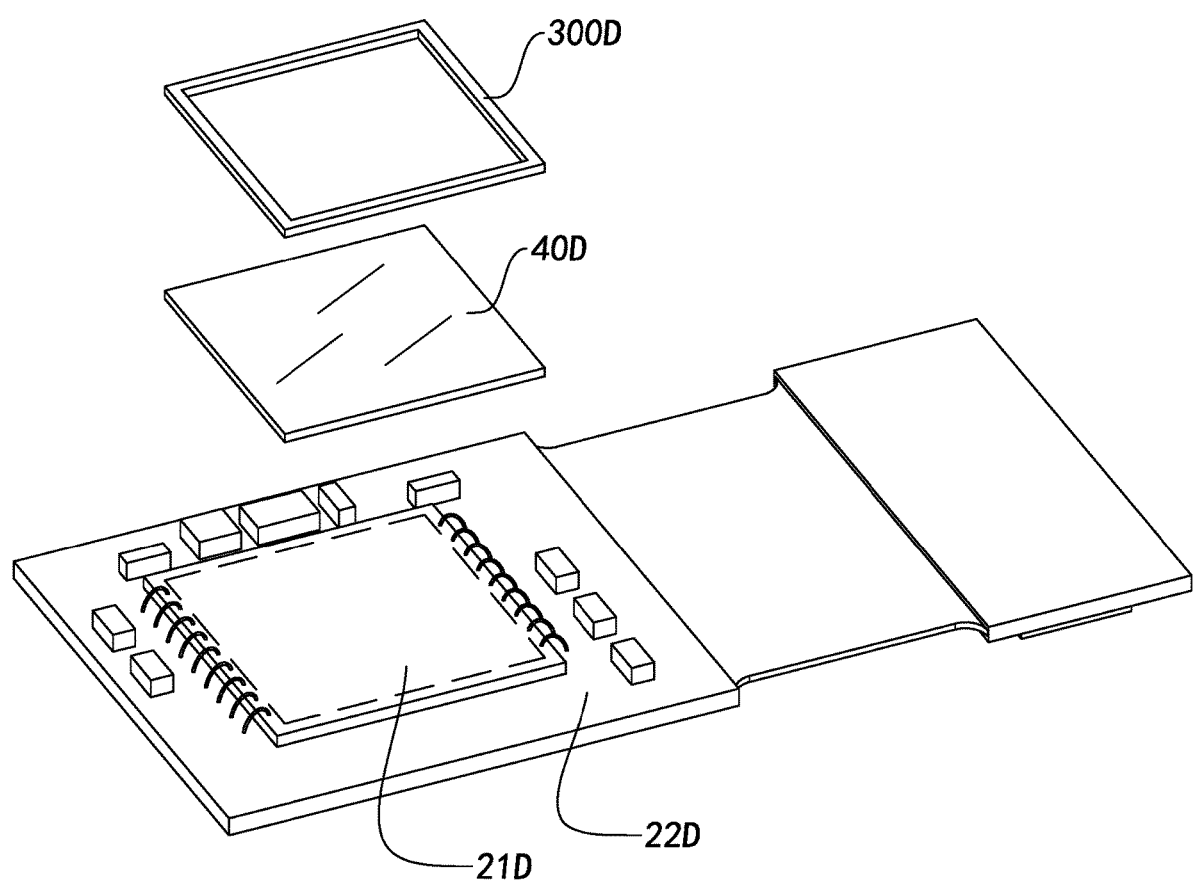
FIG. 41 is a perspective view illustrating the circuit board, the photosensitive element and the protective frame of the camera module according to the above preferred embodiment of the present invention.

In the step as illustrated in FIG. 39G, the filter member 40C and the optical lens 10C are aligned and disposed along the photosensitive path of the photosensitive element 21C to manufacture the camera module.

Referring to FIG. 40 to FIG. 42G of the drawings, the camera module according to another preferred embodiment of the present invention is illustrated, wherein the camera module comprises at least one optical lens 10D, at least one photosensitive element 21D, at least one protective frame 300D, at least one circuit board 22D, at least one integrated package holder 400D, and at least one filter member 40D, wherein the photosensitive element 21D and the circuit board 22D are electrically connected and the at least one filter member 40D is overlapped on the photosensitive element 21D, wherein the protective frame 300D is disposed on the outer periphery of the filter member 40D such that the protective frame 300D does not block the photosensitive area of the photosensitive element 21D. The integrated package holder 400D is arranged to wrap the outer periphery of the circuit board 22D and the filter member 40D to integrate the integrated package holder 400D, the filter member 40D, the photosensitive element 21D, and the circuit board 22D to form an integral body. The optical lens 10D is disposed in a photosensitive path of the photosensitive element 21D. Light reflected by the object is collected by the optical lens 10D into the inside of the camera module and received by the photosensitive element 21D for photoelectrically conversion to generate an image related to the object.

Preferably, the integrated package holder 400D wraps the outer periphery of the circuit board 22D and the filter member 40D during molding, so that the integrated package holder 400D, the filter member 40D, and the photosensitive element 21D are integrally combined with the circuit board 22D.

More preferably, the integral package holder 400D further wraps the outer side of the protective frame 300D to make the integrated package holder 400D, the filter member 40D, the photosensitive element 21D, the circuit board 22D, and the protective frame 300D being integrally combined.

The protective frame 300D is protrudedly formed on the outer periphery of the filter member 40D, so that when the inner surface of the upper mold 101D of a molding-die 100D is pressed against the protective frame 300D, the inner surface of the upper mold 101D does not contact with the surface of the filter member 40D, thereby preventing the inner surface of the upper mold 101D from being damaged or scratching the filter member 40D. That is, the protective frame 300D that is protrudedly formed on the outer periphery of the filter member 40D to maintain a safe distance between the surface of the filter member 40D and the inner surface of the upper mold 101D to prevent the inner surface of the upper mold 101D causing damages or scratches on the filter member 40D.

Furthermore, the camera module comprises at least one lens holding member 500D, wherein the lens holding member 500D is disposed on an upper portion of the integrated package holder 400D, and the optical lens 10D is disposed on the lens holding member 500D. The optical lens 10D is held in the photosensitive path of the photosensitive element 21D by the lens holding member 500D.

In a specific example of the camera module of the present invention, the lens holding member 500D is disposed at an upper portion of the integrated package holder 400D after molded. In another specific example of the camera module of the present invention, the lens holding member 500D can be integrally formed with the integrated package holder 400D. In this way, the packaging error of the camera module can be reduced in order to improve the imaging quality of the camera module.

Preferably, the lens holding member 500D may be embodied as a motor, i.e. the optical lens 10D being operatively disposed on the lens holding member 500D to be driven by the lens holding member 500D. The optical lens 10D moves back and forth along the photosensitive path of the photosensitive element 21D, thereby adjusting the focal length of the camera module by changing the position between the optical lens 10D and the photosensitive element 21D. It is worth mentioning that the lens holding member 500D may be various drivers for driving the optical lens 10D to move back and forth along the photosensitive path of the photosensitive element 21D, for example, in this preferred embodiment of the invention. The lens holding member 500D can be embodied as a voice coil motor.

One skilled in the art would understand that when the lens holding member 500D is embodied as a motor, the lens holding member 500D is electrically connected to the circuit board 22D.

Figure 42A:
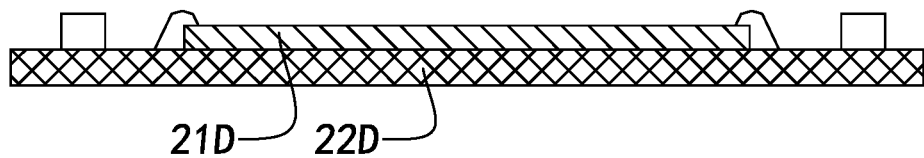
FIG. 42A is sectional view of one of the manufacturing steps of the array camera module according to the above preferred embodiment of the present invention.

FIGS. 42A to 42G are sectional views illustrating a manufacturing method of the camera module of the present invention. In the step as illustrated in FIG. 42A, the photosensitive element 21D is electrically connected to the circuit board 22D, wherein the manner of how the photosensitive element 21D and the circuit board 22D are electrically connected is not limited in this invention, similarly to the above-described preferred embodiments of the present invention.

Figure 42B:
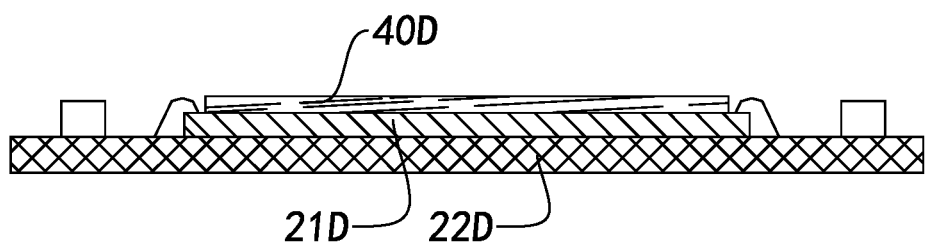
FIG. 42B is a sectional view of one of the manufacturing steps of the array camera module according to the above preferred embodiment of the present invention.
Figure 42C:
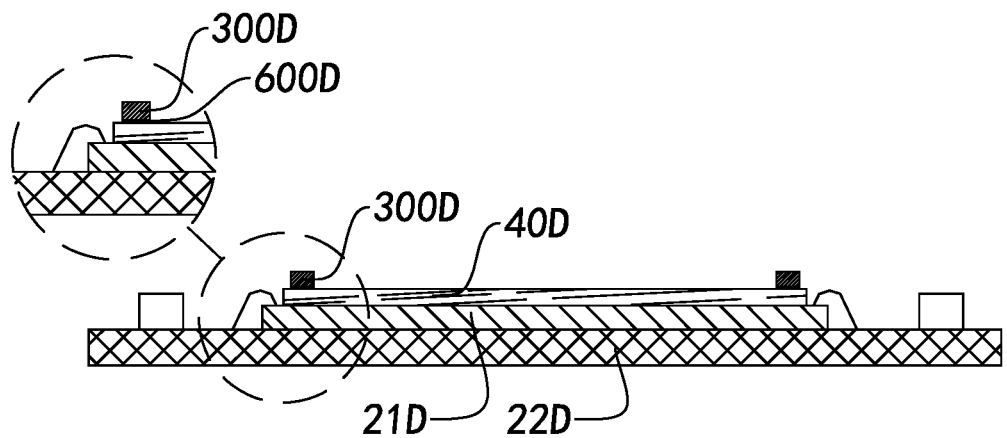
FIG. 42C is a sectional view of one of the manufacturing steps of the array camera module according to the above preferred embodiment of the present invention.

In the step as illustrated in FIG. 42B, the filter member 40D is overlappedly disposed on the photosensitive element 21D. One skilled in the art would understand that the manner that the filter member 40D and the photosensitive element 21D are overlapped can reduce the back focus of the camera module, thereby facilitating miniaturization of the camera module to enable the camera module to be applied to electronic devices that are thin and lightweight.

In the step, as illustrated in step 42C, the protective frame 300D is placed on the outer periphery of the filter member 40D, wherein the protective frame 300D does not block the photosensitive area of the photosensitive element 21D. One skilled in the art would understand that after the protective frame 300D is provided, the protective frame 300D can be disposed on the outer periphery of the filter member 40D through a cementing layer 600D. That is, the cementing layer 600D disposed between the protective frame 300D and the filter member 40D is used to connect the protective frame 300D with the filter member 40D.

Figure 42D:
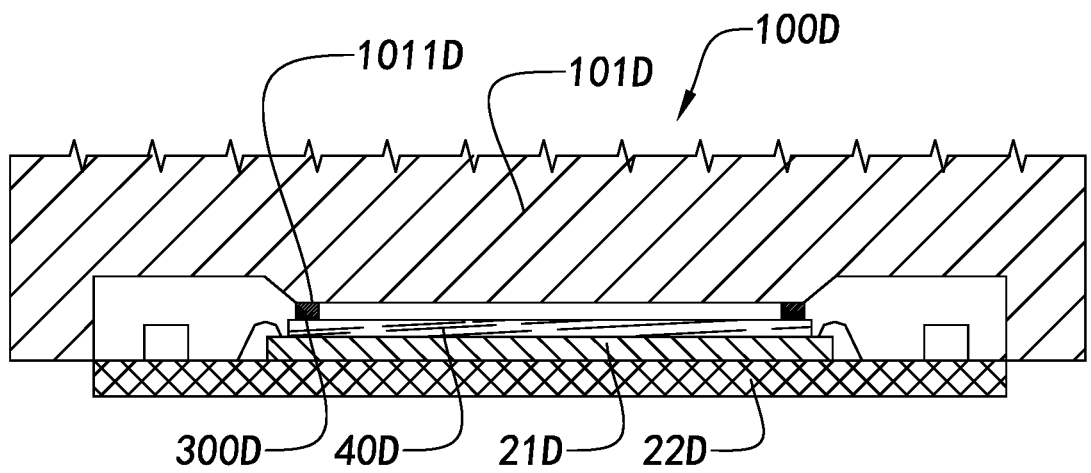
FIG. 42D is a sectional view of one of the manufacturing steps of the array camera module according to the above preferred embodiment of the present invention.

In the step as illustrated in FIG. 42D, the protective frame 300D is pressed by the pressing surface 1011D of the upper mold 101D to isolate the inner region and the outer periphery of the filter member 40D, wherein the size of an inner region of the filter member 40D is greater than or equal to the photosensitive area of the photosensitive element 21D to prevent the protective frame 300D from blocking the photosensitive area of the photosensitive element 21D. One skilled in the art would understand that the protective frame 300D is protrudedly formed on the outer periphery of the filter member 40D, so that when the pressing surface 1011D of the upper mold 101D is pressed against the protective frame 300D, the protective frame 300D can prevent the pressing surface 1011D of the upper mold 101D from contacting the photosensitive area of the filter member 40D, so that the protective frame 300D can block the pressing surface 1011D of the upper mold 101D to cause damages or scratches on the inner region of the filter member 40D.

Preferably, the protective frame 300D has a predetermined elasticity such that when the pressing surface 1011D of the upper mold 101D is pressed against the protective frame 300D, the protective frame 300D can serve as a buffer to prevent the pressure generated by the upper mold 101D damaging the filter member 40D.

Figure 42E:
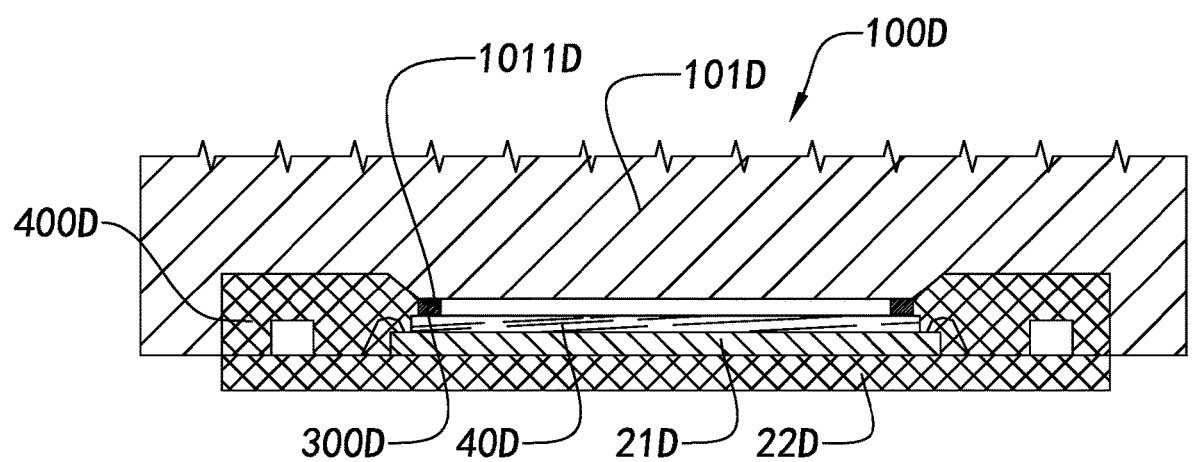
FIG. 42E is a sectional view of one of the manufacturing steps of the array camera module according to the above preferred embodiment of the present invention.
Figure 42F:
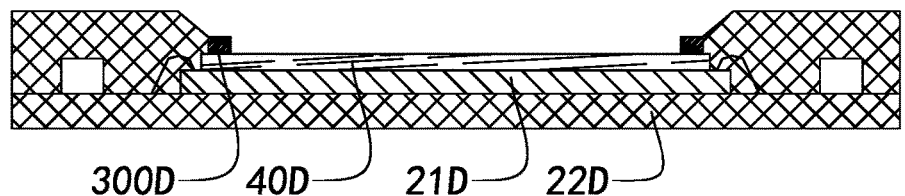
FIG. 42F is a sectional view of one of the manufacturing steps of the array camera module according to the above preferred embodiment of the present invention.

In the step as illustrated in FIG. 42E, the molding material is added to the upper mold 101D, and the integral package holder 400D is formed after the molding material is solidified and cured, wherein the integral package holder 400D wraps the circuit board 22D and the non-photosensitive area of the photosensitive element 21D, such that the integrated package holder 400D, the circuit board 22D, and the photosensitive element 21D are integrated to form an integral body. Preferably, the integrated package holder 400D further wraps the outer peripheral side of the protective frame 300D to integrate the integrated package holder 400D, the circuit board 22D, the protective frame 300D, and the photosensitive element 21D to form an integral body. It is worth mentioning that the molding material is fluid or granular. After the molding-die 100D is removed, the integrally packaged holder 400D, the circuit board 22D, the protective frame 300D, and the photosensitive element 21D are integrally connected as shown in FIG. 36E.

One skilled in the art would understand that the photosensitive area of the photosensitive element 21D and the external environment are isolated, so that the molding material does not flow to the photosensitive area of the photosensitive element 21D after the molding material is added to the upper mold 101D, so that the protective frame 300D can prevent the molding material from damaging the photosensitive area of the photosensitive element 21D. In addition, the protective frame 300D has a predetermined elasticity such that there is no gap between the protective frame 300D and the upper mold 101D pressed against the protective frame 300D. Therefore, during the solidifying and curing of the molding material added to the upper mold 101D, the phenomenon of "flashing" does not happen to ensure the image quality of the camera module.

Figure 42G:
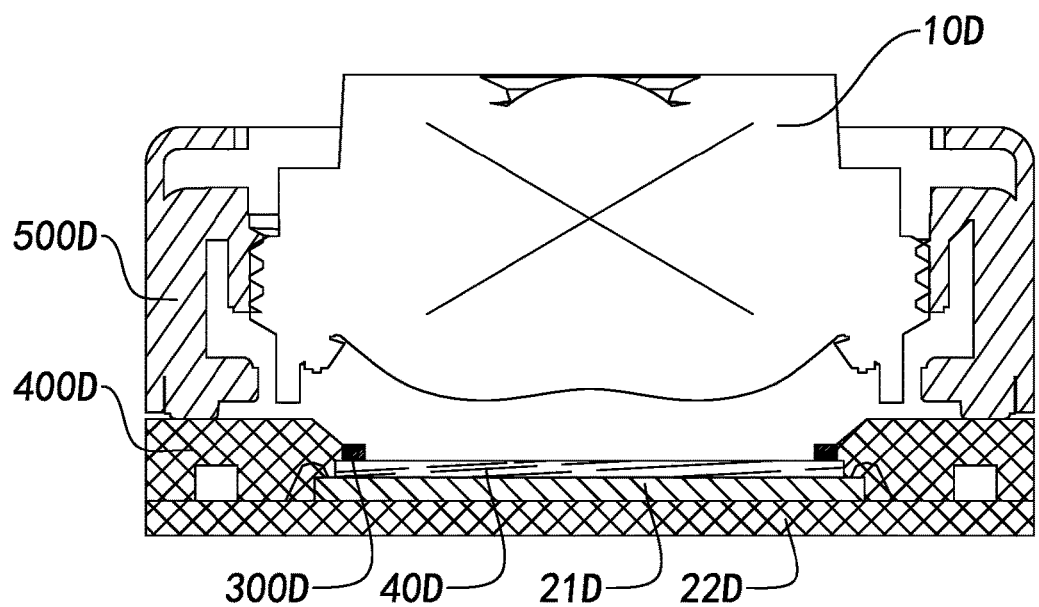

In the step as illustrated in FIG. 42G, the filter member 40D and the optical lens 10D are aligned and disposed along the photosensitive path of the photosensitive element 21D to fabricate the camera module.

Furthermore, the present invention further provides a manufacturing method of a camera module, wherein the manufacturing method comprises the following steps:

(a) electrically connecting at least one photosensitive element 21C with at least one circuit board 22C;

(b) providing at least one protective frame 300C, wherein the protective frame 300C is formed on an outer peripheral side of a photosensitive area of the at least one photosensitive element 21C;

(c) pressing an inner surface of an upper mold 101C of a molding-die 100C against the at least one protective frame 300C to isolate the photosensitive area and a non-photosensitive area of the at least one photosensitive element 21C;

(d) wrapping the at least one circuit board 22C and the non-photosensitive area of the at least one photosensitive element 21C by a molding material added and cured in the molding-die 100C, wherein after the molding material is solidified and cured, an integrated package holder 400C is integrally formed and coupled with the photosensitive element 21C and the circuit board 22C; and (e) providing at least one optical lens 10C, wherein the optical lens 10C is disposed in a photosensitive path of the at least one photosensitive element 21C to form the camera module.

Furthermore, the present invention also provides a manufacturing method of a camera module, wherein the manufacturing method comprises the following steps:

(A) electrically connecting at least one photosensitive element 21C and at least one circuit board 22C;

(B) overlapping a filter member 40C on the at least one photosensitive element 21C;

(C) providing at least one protective frame 300C, wherein the protective frame 300C is disposed on an outer peripheral side of the filter member 40C;

(D) pressing an inner surface of an upper mold 101C of a molding-die 100C against the protective frame 300C to isolate an inner region and an outer peripheral side of the filter member 40C;

(E) wrapping the at least one circuit board 22C and the outer peripheral side of the filter member 20C by a molding material added and cured in the molding-die 100C, wherein after the molding material is solidified and cured, an integrated package holder 400C is integrally formed and coupled with the photosensitive element 21C and the circuit board 22C; and (F) providing at least one optical lens 10C, wherein the at least one optical lens 10C is aligned and disposed in a photosensitive path of the at least one photosensitive element 21C to form the camera module.

Figure 43:
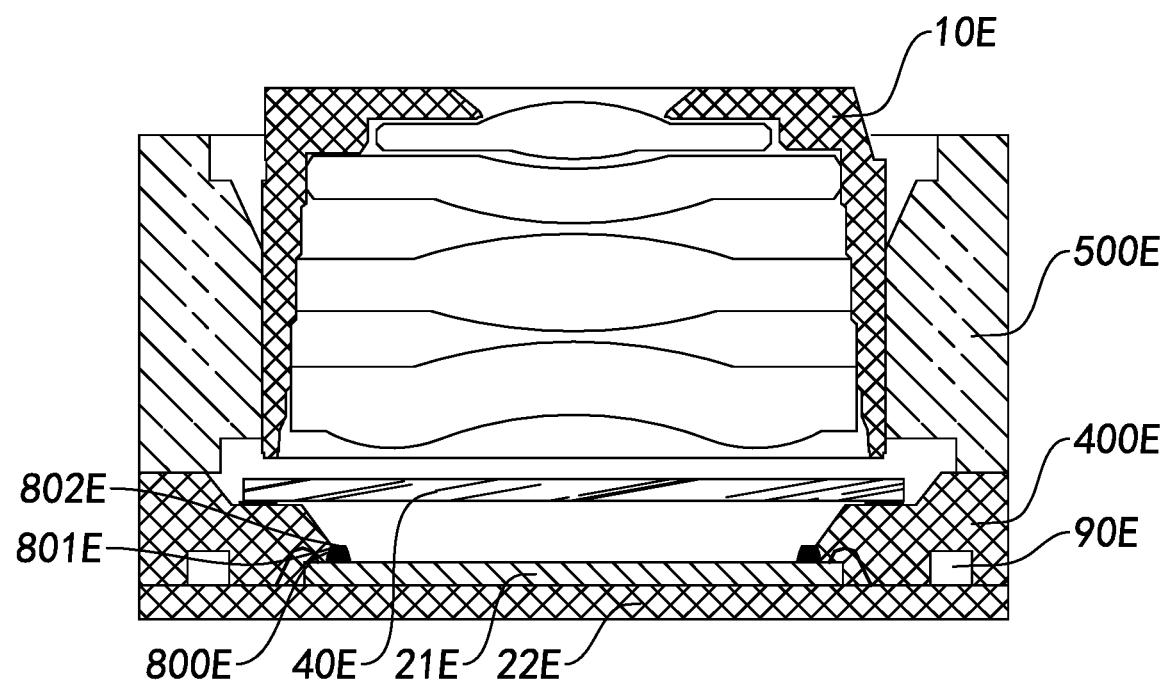
FIG. 43 is a diagram showing the internal configuration of the camera module part according to a preferred embodiment of the invention taken along the intermediate position.
Figure 44:
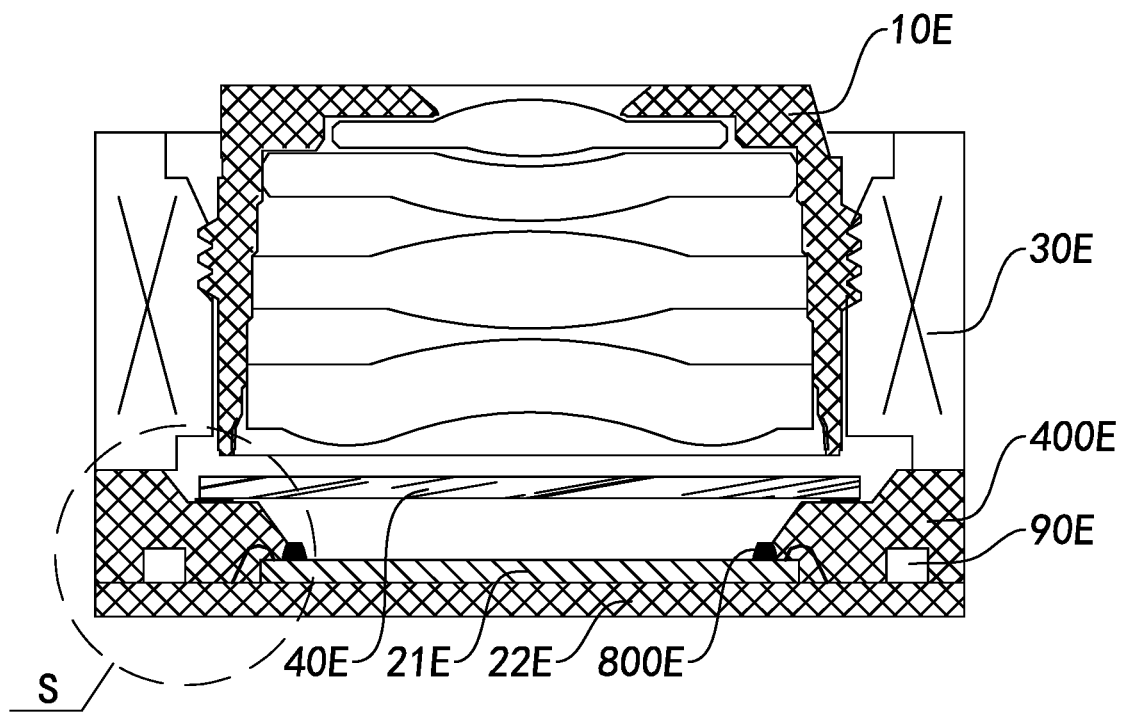
FIG. 44 is a sectional view of the camera module according to another preferred embodiment of the present invention.

Referring to FIGS. 43 and 44, the present invention provides a camera module and a manufacturing method thereof, wherein the camera module can be installed in an electronic device for capturing information, including image or video, of the environment around the electronic device.

It is worth mentioning that type of such electronic device is not limited in the invention. For example, the electronic device can be a civil electronic device, such as a smartphone, a tablet, a media player, a laptop, a PDA, a remote controller, a medical electronic device such as an endoscope, or any other electronic device that can equip with the array camera module in other fields.

The camera module of the present invention as shown in FIG. 43 can be embodied as a fixed focus module, wherein the camera module includes at least one optical lens 10E, at least one photosensitive element 21E such as a photosensitive chip, at least one insulating member 800E, a circuit board 22E, and an integral encapsulating support structure 400E. The photosensitive element 21E is conductively and electrically connected with the circuit board 22E. The insulating member 800E is provided to insulate a photosensitive area of the photosensitive element 21E with the encapsulating support structure that, in one embodiment, the insulating member 800E is provided around the periphery around at least the photosensitive area of the photosensitive element 21E. It is embodied that the insulating member 800E has a ring-shape and is positioned in a non-photosensitive area of the photosensitive element 21E. The integral encapsulating support structure 400E is molded on the circuit board 22E to enclose, case, and/or wrap up every non-photosensitive area of the photosensitive element 21E and an outer peripheral surface 801E of the insulating member 800E. The optical lens 10E is supported along a photosensitive path of the photosensitive element 21E. Light reflected from an object enters the camera module through the optical lens 10E, and then is captured by the photosensitive element 21E to conduct a photoelectric conversion to generate corresponding image of the object.

The insulating member 800E is adapted for insulating the encapsulating support structure 400E from blocking the photosensitive area of the photosensitive element 21E. For example, the insulating member 800E can be embodied as ring-shaped, such as a circular or square frame shape. In other words, the middle of the insulating member 800E is hollow, so as to avoid the insulating member 800E from blocking the photosensitive area of the photosensitive element 21E.

It is worth mentioning that although FIG. 43 illustrates that the camera module of the present invention only includes one optical lens 10E and one photosensitive element 21E, those skilled in the art should be able to understand that the camera module of the present invention can also include two or more optical lenses 10E and two or more photosensitive elements 20E, so as to have the camera module forming an array camera module. Therefore, the camera module of the present invention as shown in FIG. 43 is merely an exemplary description. In fact, the quantities and types of the optical lens 10E and the photosensitive element 21E of the present invention should not limit the detail and scope of the camera module of the present invention.

Besides, the photosensitive element 21E of the camera module of the present invention as shown in FIG. 43 is mounted on the circuit board 22E and conductively and electrically connected to the circuit board 22E through the technology of gold, silver or copper wire bonding. Nevertheless, person skilled in art should understand that the circuit board 22E may have a circuit board bonding pad and the photosensitive element can have a chip bonding pad, so that the photosensitive element 21E can be mounted on the circuit board 22E with the chip bonding pad of the photosensitive element 21E corresponding to the circuit board bonding pad of the circuit board 22E, while the photosensitive element 21E and the circuit board 22E is conductively and electrically connected with each other. In addition, the photosensitive element 21E can also merely electrically connected to the circuit board 22E without mounting thereon. As a result, the flatness and smoothness of the photosensitive element 21E will not be affected and limited by the flatness and smoothness of the circuit board 22E. For example, the flatness and smoothness of the photosensitive element 21E can be ensured by means of the integral encapsulating support structure 400E.

Furthermore, the camera module includes at least a camera lens supporter 500E, wherein the camera lens supporter 500E is disposed on top of the respective integral encapsulating support structure 400E. The optical lens 10E is supported in the respective camera lens supporter 500E that substantially holds the optical lens 10E in position and be aligned along the photosensitive path of the photosensitive element 21E. It is worth mentioning that in one embodiment of the camera module of the present invention, the camera lens supporter 500E is able to be separately made and then mounted on the integral encapsulating support structure 400E. In one embodiment of the camera module of the present invention, the integral encapsulating support structure 400E can be made integrally extending to form the camera lens supporter 500E. In other words, the camera lens supporter 500E and the integral encapsulating support structure 400E can be integrally formed, wherein the deviation generated when mounting an independent camera lens supporter 500E on the integral encapsulating support structure 400E is eliminated and thus the imaging quality of the camera module is improved by reducing the package tilt of the camera module.

Figure 45:
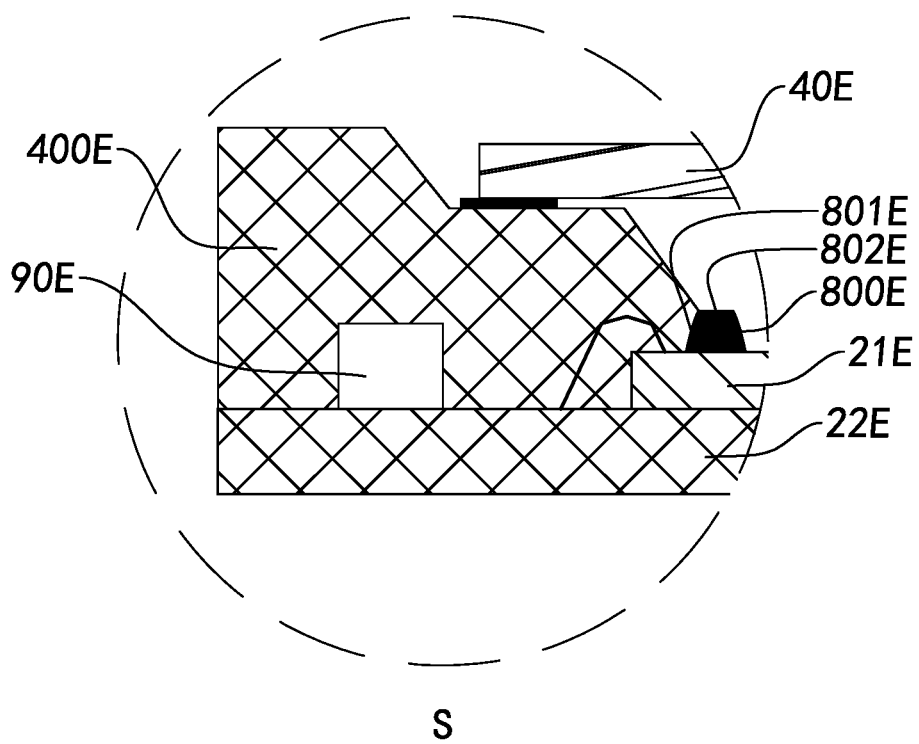
FIG. 45 is an enlarged sectional view of on the position S in FIG. 44.

FIGS. 44 and 45 illustrate an example of the camera module of the present invention that is embodied as a zoom lens module, which is able to change the focal length of the camera module based on specific utility needs of the user, so as to enhance the environmental adaptability of the camera module. Specifically, the camera module of the present invention includes at least a driver, which can be any similar driver unit. For example, it can be a voice coil motor 30E according to the present embodiment. Each voice coil motor 30E is mounted on the respective integral encapsulating support structure 400E and electrically connected with the circuit board 22E. The optical lens 10E is drivably mounted on the voice coil motor 30E and kept aligned along the photosensitive path of the photosensitive element 21E by the voice coil motor 30E. Besides, the voice coil motor 30E is able to drive the optical lens 10E to move back and forth along the photosensitive path of the photosensitive element 21E for adjusting the focal length of the camera module.

Person skilled in the art should understand that the voice coil motor 30E of the camera module of the present invention can be electrically connected to the circuit board 22E through various ways. For example, in one embodiment, the integral encapsulating support structure 400E is able to be built in with at least a wire having one end electrically connected to the circuit board 22E and the other end forming a bonding pad on the surface of the integral encapsulating support structure 400E or the other end connected to a bonding pad provided on the surface of the integral encapsulating support structure 400E. Therefore, as the voice coil motor 30E is mounted on the integral encapsulating support structure 400E, the bonding pad of the voice coil motor 30E and the bonding pad of the surface of the integral encapsulating support structure 400E are bonded together so as to electrically connect the voice coil motor 30E with the circuit board 22E. For example, in another embodiment, the voice coil motor 30E can be conductively connected to the circuit board 22E by coating a conductive layer on the surface of the integral encapsulating support structure 400E.

Further, the camera module of the present invention includes at least one filter member 40E. The filter member 40E is supported between the optical lens 10E and the photosensitive element 21E. Light reflected from an object enters the camera module through the optical lens 10E. Then the light is filtered by the filter member 40E and received by the photosensitive element 21E to conduct a photoelectric conversion. The filter member 40E is able to reduce noise effect and improve the imaging quality of the camera module.

It is worth mentioning that types of the filter member 40E is not limited in the invention. For example, in a preferred embodiment of the camera module of the present invention, the filter member 40E can be embodied as an IR-Cut Filter. As a result, the filter member 40E can be used to filter infrared ray in the light. Also, in another preferred embodiment of the camera module of the present invention, the filter member 40E can be embodied as a piece of fully-transparent spectrum filter.

The integral encapsulating support structure 400E forms at least one platform for mounting the filter member 40E in position. For example, the platform may have a mounting slot formed on the top of the integral encapsulating support structure 400E or form no mounting slot on the top and the filter member 40E is mounted thereon directly. When the camera module of the present invention is embodied as the array camera module, the quantity of the filter member 40E can be embodied as one piece, and all the optical lenses 10E and the photosensitive elements 20E are respectively provided corresponding to different portions of the filter member 40E. Nevertheless, quantity of the filter member 40E of the present invention is preferably equal to the quantity of the photosensitive element 21E and the optical lens 10E, so that each filter member 40E, each optical lens 10E, and each photosensitive element 21E are arranged to one another correspondingly.

Figure 46:
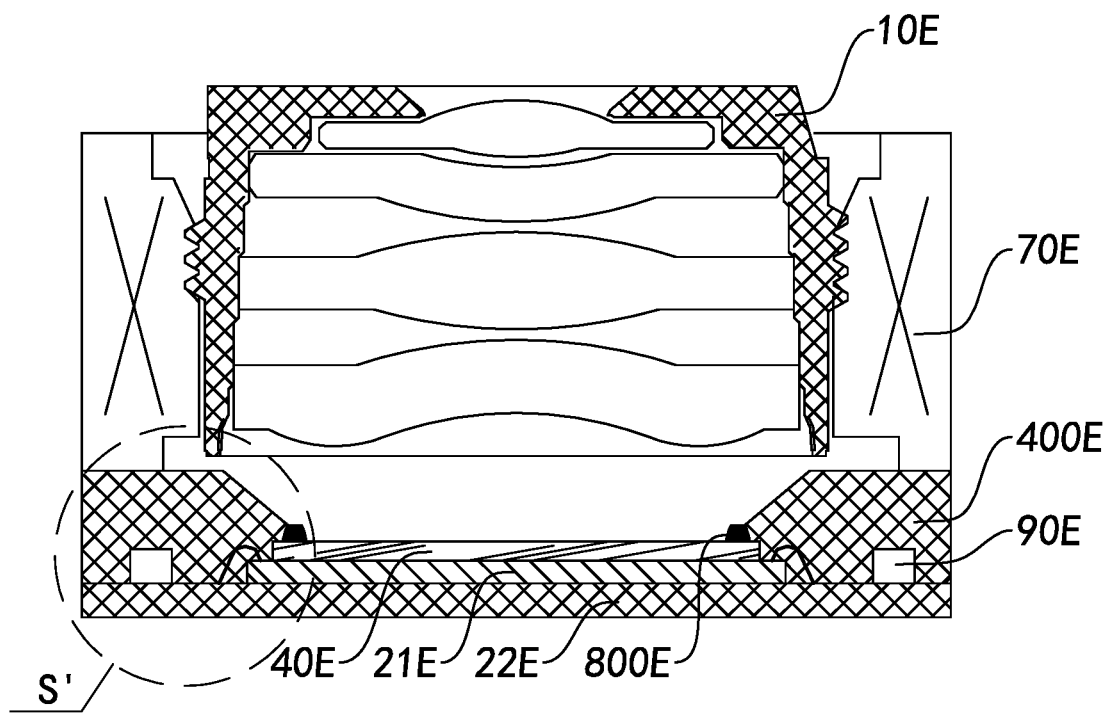
FIG. 46 is a sectional view of the camera module according to another preferred embodiment of the present invention.
Figure 47:
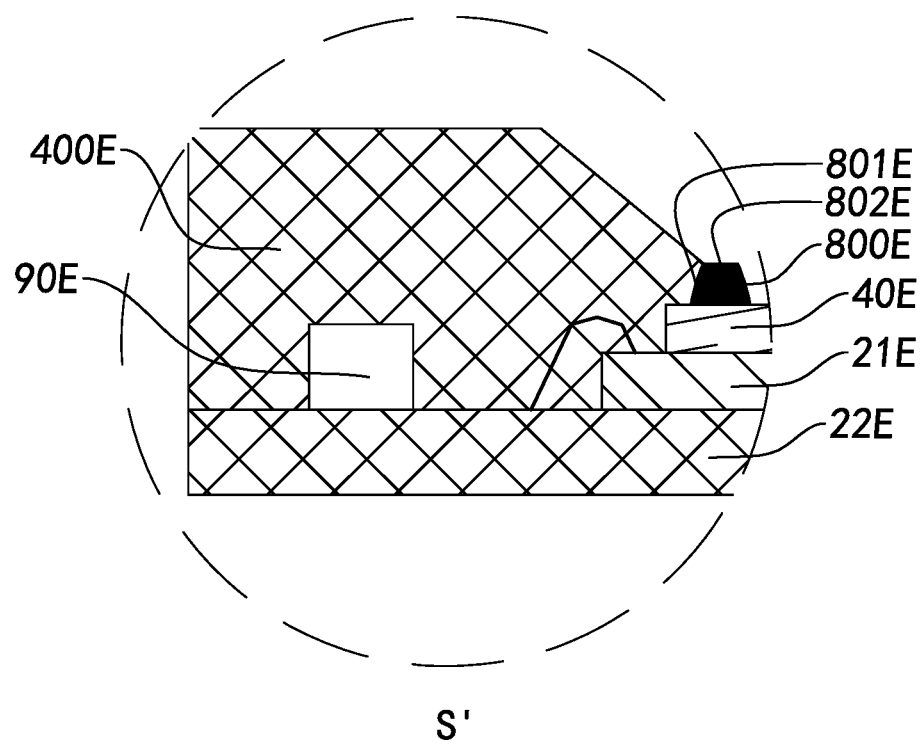
FIG. 47 is an enlarged sectional view of on the position S' in FIG. 46.

FIGS. 46 and 47 illustrate another preferred embodiment of the camera module of the present invention, wherein the insulating member 800E is not disposed on the photosensitive element 21E. Particularly, in the embodiment as shown in FIGS. 46 and 47, the filter member 40E is embodied to disposed overlappingly on top of the photosensitive element 21E which is electrically connected to the circuit board 22E. The insulating member 800E is disposed on the peripheral edge of the filter member 40E to divide an inner area and an outer area of the filter member 40E by the insulating member 800E. The integral encapsulating support structure 400E is formed to enclose and cover the circuit board 22E and the outer area of the filter member 40E and the circuit board 22E, so as to integrally couple the integral encapsulating support structure 400E, the filter member 40E, the photosensitive element 21E, and the circuit board 22E to form an integral structure.

By overlapping the filter member 40E on the photosensitive element 21E and then forming the integral encapsulating support structure 400E as described above, the photosensitive area of the photosensitive element 21E can be prevented from being damaged or polluted by the molding material during the molding of the integral encapsulating support structure 400E, so as to ensure the reliability of the photosensitive element 21E.

It is worth mentioning that the portion of the filter member 40E corresponding to the photosensitive area of the photosensitive element 21E is defined as the inner area of the filter member 40E. The portion of the filter member 40E corresponding to the non-photosensitive area of the photosensitive element 21E is defined as the outer area of the filter member 40E. The insulating member 800E, adapted for insulating the photosensitive area of the photosensitive element 21E from the integral capitulating support structure 400E, is disposed between the inner area and the outer area on the filter member 40E according to the present embodiment. After the integral encapsulating support structure 400E is formed by such as compression molding, the integral encapsulating support structure 400E encloses, cases, and wraps up the outer area of the filter member 40E to ensure the integral encapsulating support structure 400E do not block the photosensitive area of the photosensitive element 21E as well as the corresponding inner area of the filter member 40E. It is worth mentioning that the periphery of the photosensitive area of the photosensitive element 21E between the photosensitive element 21E and the filter member 40E can be applied with adhesive to further provide an insulating structure.

Besides, according to the present embodiment of the camera module of the present invention, the filter member 40E is directly overlapped with the photosensitive element 21E that can decrease a back focal length of the camera module. By so, it is more likely to reduce the height size of the camera module that renders the camera module of the present invention adapted to be more applicable to electronic devices to meet the lighter and thinner demands thereof.

Figure 48:
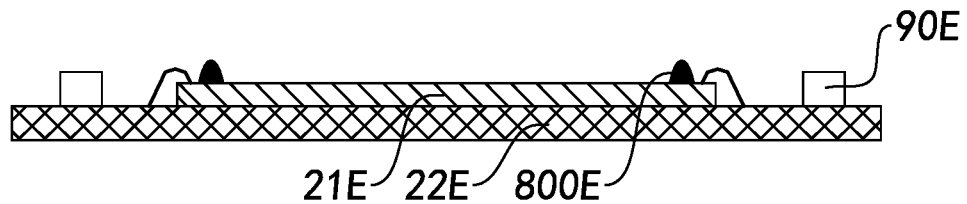
FIG. 48 is a sectional view of a first step of a manufacturing method of the array camera module according to the above preferred embodiment of the present invention.
Figure 49:
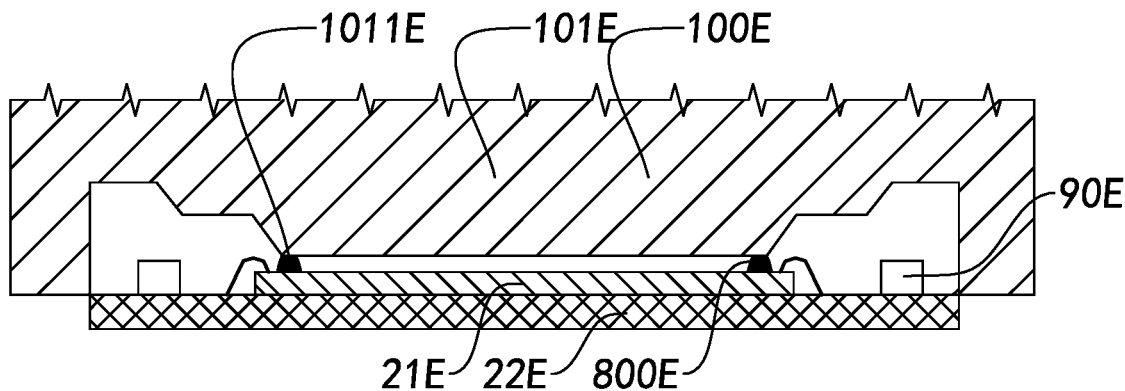
FIG. 49 is a sectional view of a second step of the above manufacturing method of the array camera module according to the above preferred embodiment of the present invention.
Figure 50:
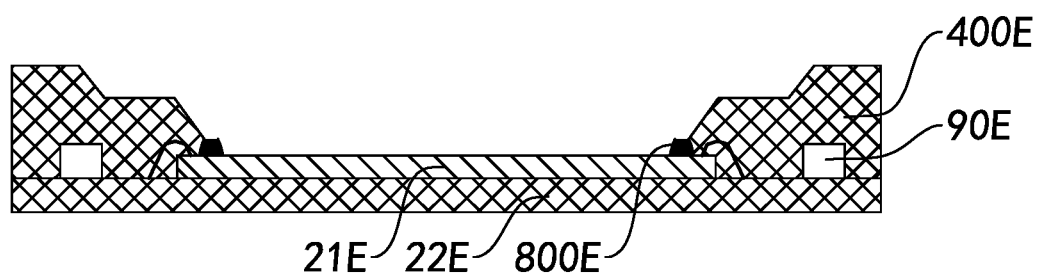
FIG. 50 is a sectional view of a third step of the above manufacturing method of the array camera module according to the above preferred embodiment of the present invention.

Referring to FIGS. 48 to 50, a manufacture process of the camera module of the present invention is illustrated. FIG. 48 illustrates a step of the manufacturing process of the camera module as an embodiment, wherein the photosensitive element 21E is mounted on the circuit board 22E. Besides, the photosensitive element 21E is electrically connected with the circuit board 22E with bonding wires by applying wire bonding technology. The insulating member 800E is attached on the periphery around the photosensitive area of the photosensitive element 21E.

Optionally, in one embodiment of the camera module, the photosensitive element 21E and the circuit board 22E can be conductively connected with each other by means of bonding pad soldering. Hence, the example as shown in FIG. 48 that the photosensitive element 21E and the circuit board 22E are conductively connected with each other by gold bonding wires is merely a particular embodiment.

Besides, the photosensitive element 21E can be conductively connected with the circuit board 22E before attaching the insulating member 800E on the photosensitive element 21E. On the other hand, the insulating member 800E can also be disposed on the photosensitive element 21E before electrically connecting the photosensitive element 21E with the circuit board 22E.

In one embodiment of the present invention, after the photosensitive element 21E is electrically connected with the circuit board 22E, an adhesive element in form of adhesive film, adhesive gel form or spraying glue is applied at least around the periphery of the photosensitive element 21E, which forms the insulating member 800E. It is worth mentioning that because the adhesive element is directly applied to attach on the photosensitive element 21E in adhesive gel form or spraying glue form, the insulating member 800E formed after solidification protrudes from the surface of the photosensitive element 21E. Person skilled in the art should appreciate that the adhesive element can also be made from elastic material such as rubber, silicon, or polyester material and when the adhesive element having a predetermined stickiness is applied by drawing or spraying on the periphery around the photosensitive element 21E, a certain height of the adhesive element is protruded to form the insulating member 800E while it is prevented from flowing to the photosensitive area of the photosensitive element 21E that ensures the photosensitive area of the photosensitive element 21E from being polluted by the adhesive element.

Furthermore, after the adhesive element is applied by drawing or spraying on the periphery of the photosensitive element 21E, the adhesive element can be solidified on the photosensitive element 21E to form the insulating member 800E through solidifying reaction such as heat drying or UV (Ultraviolet) ray exposure. Nonetheless, person skilled in the art should understand that the adhesive element can also be solidified through other methods or be solidified naturally. Hence, the damp, heat treatment or UV exposure may accelerate the solidification process of the adhesive element, but it is not the only method and condition to solidify the adhesive element. It is worth mentioning that the adhesive element may or may not have stickiness after solidification. However, in some embodiments, when the adhesive element has stickiness, it can provide a resilient ability with respect to the compression die during molding and a sticking ability to attach dusts to reduce the dark spot defective of the camera module.

FIG. 47 illustrates another step of the manufacturing process of the camera module according to a preferred embodiment of the present invention, wherein the circuit board 22E, the photosensitive element 21E and the insulating member 800E are received in a molding-die such as a compression mold and pressed against an upper mold of the molding-die. It is appreciated that the insulating member 800E protruded from the photosensitive element 21E ensures the upper mold of the molding-die to merely contact with the insulating member 800E and avoids any direct contact between the upper mold of the molding-die and the photosensitive element 21E, especially the photosensitive area thereof, so as to prevent the photosensitive element 21E from being damaged under pressure from the upper mold of the molding-die.

It is worth mentioning that the insulating member 800E formed by the solidified adhesive element is preferred to have an elasticity or flexibility, so that the insulating member 800E may absorb any over pressure from the upper mold of the molding-die and compensate any tilt occurred in the attachment of the photosensitive element 21E and the circuit board 22E. In other words, the insulating member 800E is deformable to insulate and isolate the photosensitive area of the photosensitive element 21E from the outside environment, that provides a relative sealing effect to prevent any liquid form molding material from flowing to the photosensitive area of the photosensitive element 21E during the molding process.

As show in FIG. 50, a step of forming the integral encapsulating support structure 400E in the manufacturing process of the camera module is illustrated, wherein the molding material, for example in solid form or in small particles or powder form, is placed in a molding-die, such as a compression mold, insert mold and die mold, and then heated to melt to liquid form material to flow to mold the encapsulating support structure 400E. Then, after the integral encapsulating support structure 400E is solidified, the encapsulating support structure 400E encloses and wraps up at least the top surface of the circuit board 22E and the non-photosensitive area of the photosensitive element 21E to integrally connect the integral encapsulating support structure 400E, the circuit board 22E, and the photosensitive element 21E to form an integral structure.

It is appreciated that the integral encapsulating support structure 400E also covers the peripheral surface 801E of the insulating member 800E so that the integral encapsulating support structure 400E, the circuit board 22E, the insulating member 800E, and the photosensitive element 21E are integrally connected together to form an integral structure.

It is worth mentioning that since the insulating member 800E isolates and insulates the photosensitive area of the photosensitive element 21E from the outside environment, the molding material heated to become liquid in the molding-die is not able to flow to the photosensitive area of the photosensitive element 21E. That is the insulating member 800E stops the molding material for forming the integral encapsulating support structure 400E from flowing to the photosensitive area of the photosensitive element 21E from the non-photosensitive area thereof, that also prevents burrs be formed at the side, facing the photosensitive area of the photosensitive element 21E, of the integral encapsulating support structure 400E so as to ensure the imaging quality of the camera module and increase the product yield rate of the camera module.

It is worth mentioning that the integral encapsulating support structure 400E, the circuit board 22E and the photosensitive element 21E are integrally connected together to from an integral structure that substantially enforces the strength of the circuit board 22E. In addition, the flatness and smoothness of the photosensitive element 21E will no longer be restricted to the flatness and smoothness of the circuit board 22E, but to be maintained by the integral encapsulating support structure 400E. Accordingly, the circuit board 22E can selectively be a flexible printed circuit board with less thickness. By so, it can further reduce the height size of the camera module so as to more applicable electronic device with the demands of being lighter and thinner.

It is worth mentioning that the camera module of the present invention further includes a set of electrical elements including one or more resistance-capacitance components 90E, wherein the resistance-capacitance components 90E are mounted on the circuit board 22E. During the molding process, the heated liquid form molding material is compressed to flow and fill between the resistance-capacitance components 90E on the circuit board 22E automatically, so as to form the solidified integral encapsulating support structure 400E with all the resistance-capacitance components 90E being enclosed and covered therein. Therefore, the integral encapsulating support structure 400E can not only insulate the resistance-capacitance component 90E from the photosensitive element 21E, but also overlap the integral encapsulating support structure 400E with the resistance-capacitance components 90E to save space that results in further reduction of the height size, length size and width size of the camera module.

The molding material is an insulation material such as resin or plastic. According to the preferred embodiment, resin material is preferred to be used as molding material to form the integral encapsulating support structure 400E, which not only has good strength and electrical insulation ability, but also provides a good heat dissipation ability that has relatively high melting point after solidification and can conduct heat generated from the photosensitive element 21E in function to outside. Person skilled in the art should appreciate that these features and properties of the integral encapsulating support structure 400E of the present invention are especially effective in enhancing the performance of the camera module that is embodied as an array camera module having multiple camera modules built with a large piece of integral encapsulating support structure 400E encapsulated multiple circuit boards and photosensitive elements for coupling with multiple optical lenses respectively as disclosed in the above embodiment.

It is worth mentioning that the insulating member 800E formed by the adhesive element may have stickiness after solidification so as to stick pollutant like dust that was generated during the manufacturing process of the camera module, and thus to stop pollutant like dust from polluting the photosensitive area of the photosensitive element, in order to enhance the imaging quality of the camera module by preventing dark spots of the camera module from occurring.

After the above manufacturing steps, the optical lens 10E is supported above the integral encapsulating support structure 400E and positioned along the photosensitive path of the photosensitive element 21E to produce the camera module. When the camera module is used, light reflected from an object enters the camera module through the optical lens 10E, and then the light is filtered by the filter member 40E and received by the photosensitive element 21E to conduct a photoelectric conversion and generate image corresponding to the object.

In one embodiment of the camera module of the present invention, the optical lens 10E is held in the photosensitive path of the photosensitive element 21E by being installed on the integral encapsulating support structure 400E or on the camera lens supporter 500E integrally formed with the integral encapsulating support structure 400E. In another embodiment of the camera module of the present invention, the optical lens 10E is held in the photosensitive path of the photosensitive element 21E by being installed on the voice coil motor 30E mounted on the integral encapsulating support structure 400E.

Figure 51:
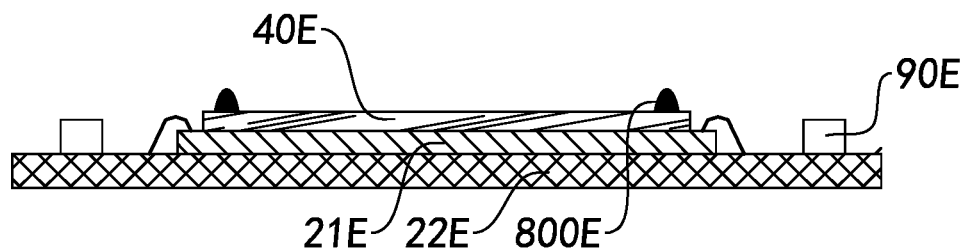
FIG. 51 is a sectional view of a first step of another manufacturing method of the array camera module according to the above preferred embodiment of the present invention.
Figure 52:
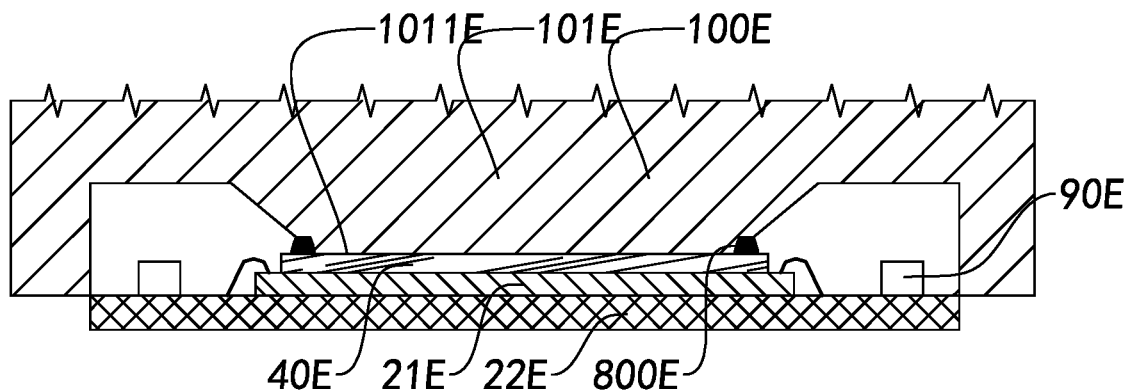
FIG. 52 is a sectional view of a second step of the above manufacturing method of the array camera module according to the above preferred embodiment of the present invention.
Figure 53:
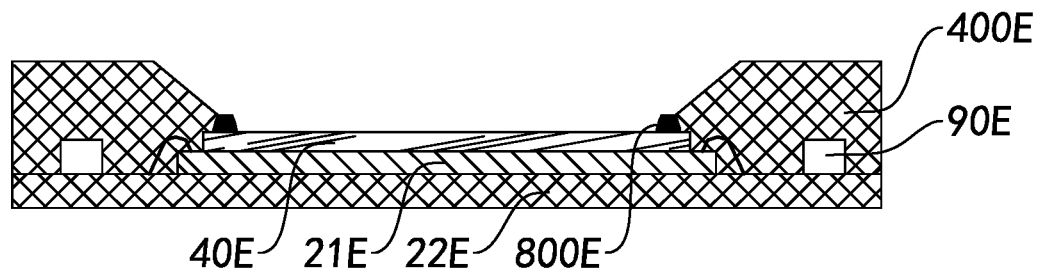
FIG. 53 is a sectional view of a third step of the above manufacturing method of the array camera module according to the above preferred embodiment of the present invention.

Referring to FIGS. 51 to 53, an alternative manufacture process of the camera module of the present invention is illustrated. FIG. 51 illustrates an example of a specific step of the manufacturing process of the camera module, wherein the photosensitive element 21E is mounted and electrically connected to the circuit board 22E, and the filter member 40E is overlappingly disposed above the photosensitive element 21E, so as to position the inner area of the filter member 40E in correspondence with the photosensitive area of the photosensitive element 21E and to position the outer area of the filter member 40E in correspondence with the non-photosensitive area of the photosensitive element 21E. The insulating member 800E is formed after an adhesive element applied on the filter member 40E by drawing or spraying is solidified.

FIG. 52 illustrates another step of the manufacturing process of the camera module according to one embodiment, wherein the circuit board 22E, the photosensitive element 21E, the filter member 40E, and the insulating member 800E are received in the molding-die and being compressed against the upper mold of the molding-die. It is appreciated that due to the protruded insulating member 800E formed on the filter member 40E, the upper mold of the molding-die can only contact with the insulating member 800E that avoids any direct contact between the upper mold of the molding-die and the filter member 40E, so as to ensure the filter member 40E from being damaged by pressure from the upper mold of the molding-die.

It is worth mentioning that the insulating member 800E formed by the adhesive element is preferred to have elasticity and flexibility after solidification, so that when tilt exist in the attachment of the photosensitive element 21E and the circuit board 22E, the insulating member 800E is able to compensate. In other words, the insulating member 800E insulates and isolates the inner area of the filter member 40E from other components of the camera module, so as to prevent the liquid form molding material from entering the inner area of the filter member 40E during the molding process of the integral encapsulating support structure 400E.

FIG. 53 illustrates a step of the formation of the integral encapsulating support structure 400E in the manufacturing process of the camera module, wherein the molding material is received in the molding-die and heated to form the integral encapsulating support structure 400E after the molding material is solidified. The integral encapsulating support structure 400E will wrap up the circuit board 22E and the outside area of the filter member 40E, so as to integrally combine the integral encapsulating support structure 400E, the filter member 40E, the photosensitive element 21E, and the circuit board 22E together.

It is appreciated that since the insulating member 800E insulates the inner area of the filter member 40E from the outer area thereof, the molding material added in the molding-die is prevented to flow to the inner area of the filter member 40E, that avoids burrs forming at the side facing the inner area of the filter member 40E of the integral encapsulating support structure 400E, so as to ensure the imaging quality of the camera module and increase the product yield rate of the camera module.

And then, the optical lens 10E is supported in the photosensitive path of the photosensitive element 21E to produce the camera module. When the camera module is used, light reflected from an object enters the camera module through the optical lens 10E, and then the light is filtered by the filter member 40E and received by the photosensitive element 21E to conduct a photoelectric conversion and generate image of the corresponding object.

Figure 54:
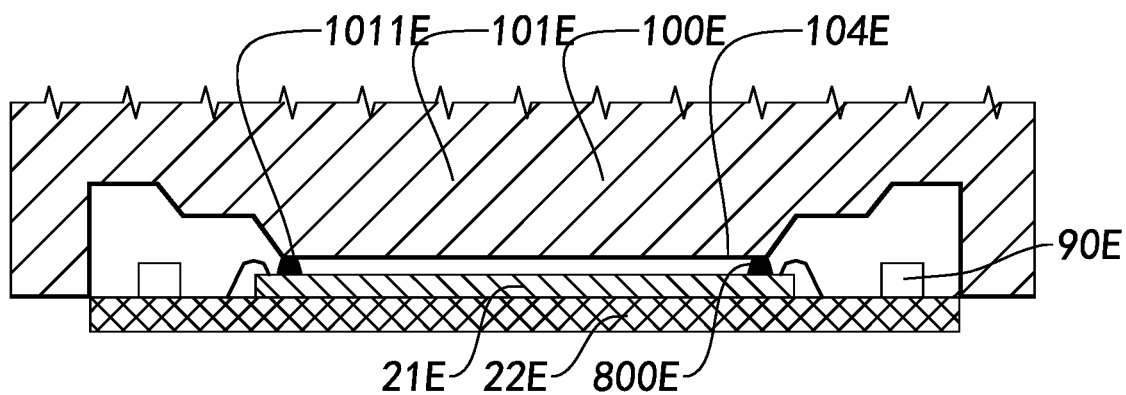
FIG. 54 is a sectional view of a first step of a manufacturing method of the array camera module according to the above preferred embodiment of the present invention.
Figure 55:
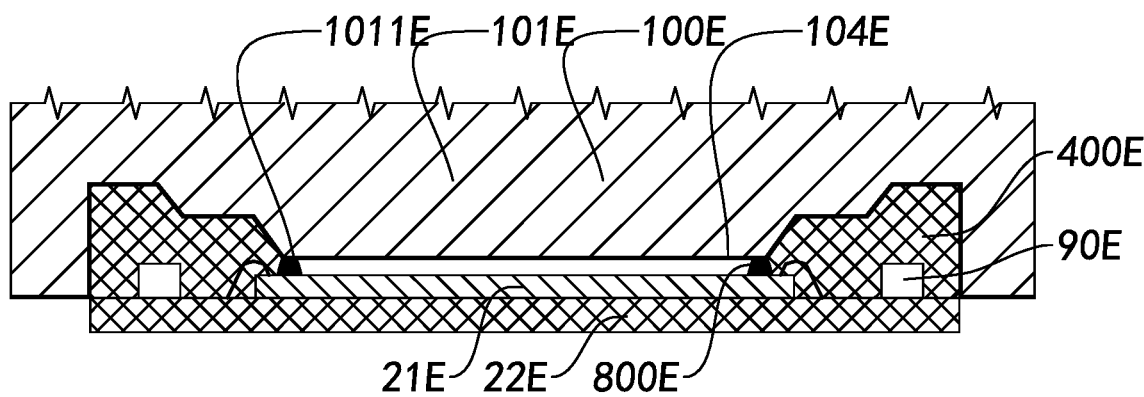
FIG. 55 is a sectional view of a second step of the above manufacturing method of the array camera module according to the above preferred embodiment of the present invention.

Referring to FIGS. 54 to 55, another manufacture process of the present invention is illustrated. FIG. 54 illustrates the conductive connection of the circuit board 22E and the photosensitive element 21E of the camera module, wherein the insulating member 800E is provided on the photosensitive element 21E to divide the photosensitive area and the non-photosensitive area of the photosensitive element 21E. When the circuit board 22E, the photosensitive element 21E, and the insulating member 800E are placed in the molding-die, a covering film 104E provided on the bottom surface of the upper mold of the molding-die to protect the upper mold from directly contacting with the photosensitive element 21E or interacts with the insulating member 800E, such that the covering film 104E and the insulating member 800E are in contact to protect the upper mold of the molding-die from directly pressing on the photosensitive element 21E.

It is worth mentioning that, nevertheless FIG. 54 illustrates the photosensitive element 21E of the present invention with the insulating member 800E provided thereon as an example to show the covering film 104E interacting with the insulating member 800E, the covering film 104E is able to be provided on a mold pressing surface of the upper mold of the molding-die 100E. Therefore, the difficulty of demolding has been reduced and, due to the cushion effect and the connection between the insulating member 800E and the covering film 104E, the tightness thereof is also enhanced.

FIG. 55 illustrates a step of forming the integral encapsulating support structure 400E in the manufacturing process of the camera module, wherein the molding-die, with the molding material placed therein, is adapted to form the integral encapsulating support structure 400E after the molding material is solidified, wherein the integral encapsulating support structure 400E encapsulates at least the top surface of the circuit board 22E, at least portion of the non-photosensitive area of the photosensitive element 21E, and the outer peripheral surface of the insulating member 800E, so as to combine the integral encapsulating support structure 400E, the photosensitive element 21E, and the circuit board 22E to form an integral structure.

And then, the optical lens 10E is supported along the photosensitive path of the photosensitive element 21E to produce the camera module. When the camera module is in used, light reflected from an object enters the camera module through the optical lens 10E, and then the light is filtered by the filter member 40E and received by the photosensitive element 21E to conduct photoelectric conversion and generate image of the respective object.

Figure 56:
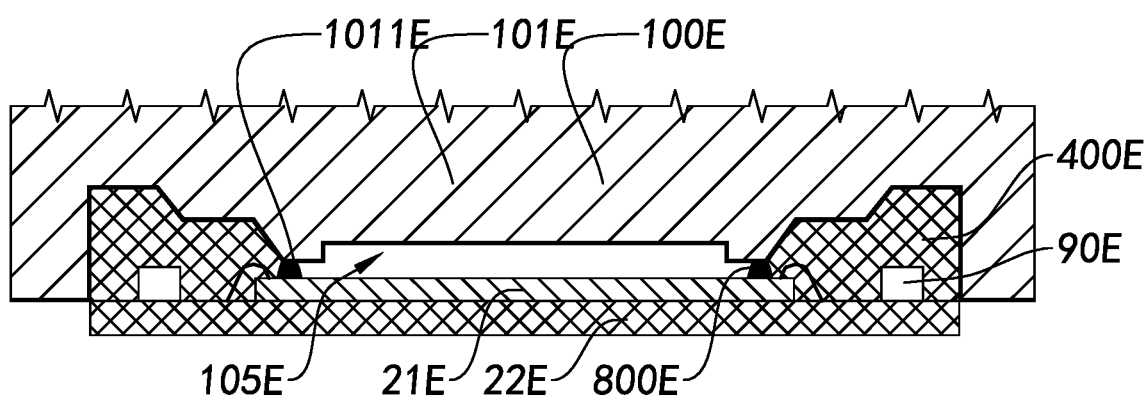
FIG. 56 is a sectional view illustrating a manufacturing method of the array camera module according to another preferred embodiment of the present invention

As shown in FIG. 56, the molding-die 100E forms an inner recess 105, corresponding to the photosensitive area of the photosensitive element 21E, in the bottom surface of the molding-die 100E, so as to provide a safety gap between the photosensitive element 21E and the bottom surface of the molding-die 100E, that further reduces the adverse effect to the photosensitive area of the photosensitive element 21E and prevents it from being damaged and scratched. It is appreciated that such inner recess 105 may also utilize in the embodiments as illustrated in FIGS. 54 and 55. In other words, the bottom surface of the molding-die in the present embodiment can also further provided with the covering film 104E.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention comprises all modifications encompassed within the spirit and scope of the following claims.

What is claimed is:

1. A molded photosensitive assembly manufactured by a molding process via an upper mold having a pressing surface and a lower mold, comprising:
   at least one circuit board having at least one chip mounting area;
   at least one photosensitive element, provided on said at least one chip mounting area of said at least one circuit board, having a photosensitive area and a non-photosensitive area;
   at least a set of wires, wherein two ends of each of said set of wires are respectively connected to said at least one photosensitive element and said at least one circuit board;
   at least one supporting member formed by a first substance to seal said end of each of said set of wires at said at least one photosensitive element, wherein said supporting member has a through hole, a top surface, an inner surface and an outer surface, wherein said through hole is formed within said inner surface; and
   at least one molded base formed by a second substance to seal said end of each of said set of wires at said at least one circuit board, wherein said at least one base comprises a molded body and has at least one light window communicated with said through hole of said supporting member, wherein said set of wires, said at least one circuit board and said at least one photosensitive element are protected by said at least one supporting member when and after said at least one molded body is molded, wherein said at least one molded body is integrally coupled to cover at least a part of said at least one circuit board and at least a part of said non-photosensitive area of said at least one photosensitive element, wherein said photosensitive area of said at least one photosensitive element is positioned corresponding said at least one light window of said at least one molded base, wherein a partial portion of said top surface of said supporting member is arranged for contacting with the pressing surface of the upper mold to form a sealed environment within said inner surface of said supporting member, wherein said supporting member blocks a molding material of said molded base entering into said through hole, such that said partial portion of said top surface of said supporting member is unsealed and uncovered from said molded body, a remainder portion of said top surface of said supporting member that is arranged for not contacting with the pressing surface of the upper mold is sealed and covered by said molded body, said outer surface of said supporting body is sealed and covered by said molded body while said inner surface of said supporting body is unsealed and uncovered to form said light window thereat above said top surface of said supporting body.

2. The molded photosensitive assembly, as recited in claim 1, further comprising one or more electronic components integrally encapsulated by said molded base, wherein said at least one circuit board has a periphery area, wherein said periphery area and said chip mounting area are integrally molded, wherein said one or more electronic components are provided on said periphery area, wherein said at least one supporting member is positioned between said one or more electrical components and said photosensitive area of said at least one photosensitive element, wherein said at least one supporting member comprises a frame-shaped supporting body, wherein said supporting body is provided outside of said photosensitive area of said photosensitive element, wherein said photosensitive area of said at least one photosensitive element is disposed corresponding to said through hole while at least a part of said supporting body is covered by said at least one molded body.

3. The molded photosensitive assembly, as recited in claim 1, wherein said top surface is extended inwardly and outwardly to said inner surface and said outer surface respectively.

4. The molded photosensitive assembly, as recited in claim 2, wherein said top surface is extended inwardly and outwardly to said inner surface and said outer surface respectively.

5. The molded photosensitive assembly, as recited in claim 1, wherein said mold photosensitive assembly comprises at least two of said photosensitive elements, at least two sets of said wires and at least two of said supporting members, wherein said at least one circuit board has two said chip mounting areas, wherein said at least two photosensitive elements are provided on said two chip mounting areas of said at least one circuit board, wherein said at least two sets of wires respectively and electrically connect said at least two photosensitive elements with said at least one circuit board, wherein said at least one molded base has at least two of said light windows positioned corresponding to said photosensitive areas of said two photosensitive elements respectively, wherein said at least one circuit board and said at least two photosensitive elements are protected by said at least two supporting members when and after said at least one molded body is molded.

6. The molded photosensitive assembly, as recited in claim 5, further comprising one or more electronic components, wherein said at least one circuit board has a periphery area, wherein said periphery area and said at least two chip mounting areas are integrally molded, wherein said one or more electronic components are provided on said periphery area, wherein said at least two supporting members are positioned between said one or more electrical components and said photosensitive areas of said at least two photosensitive elements, wherein each of said at least two supporting member comprises a frame-shaped supporting body, wherein said supporting bodies are provided outside of said photosensitive areas of said at least two photosensitive elements respectively, wherein said photosensitive areas of said at least two photosensitive elements are disposed corresponding to said through holes respectively while at least a part of each of said two supporting body is covered by said at least one molded body.

7. The molded photosensitive assembly, as recited in claim 5, wherein said top surface is extended inwardly and outwardly to said inner surface and said outer surface respectively.

8. The molded photosensitive assembly, as recited in claim 6, wherein said top surface is extended inwardly and outwardly to said inner surface and said outer surface respectively.

9. The molded photosensitive assembly, as recited in claim 1, wherein said non-photosensitive area of said at least one photosensitive element comprises a chip-inner portion, a chip-connecting portion and a chip-outer portion, wherein said at least one photosensitive element has a chip connector for electrically connecting with said set of wires, wherein said chip connector of said at least one photosensitive element is disposed on said chip-connecting portion, wherein said chip-inner portion and said chip-outer portion are respectively positioned on an inside and an outside of said chip-connecting portion, wherein at least a part of said chip-inner portion of said at least one photosensitive element is covered by said supporting body of said at least one supporting member.

10. The molded photosensitive assembly, as recited in claim 2, wherein said non-photosensitive area of said at least one photosensitive element comprises a chip-inner portion, a chip-connecting portion and a chip-outer portion, wherein said at least one photosensitive element has a chip connector for electrically connecting with said set of wires, wherein said chip connector of said at least one photosensitive element is disposed on said chip-connecting portion, wherein said chip-inner portion and said chip-outer portion are respectively positioned on an inside and an outside of said chip-connecting portion, wherein at least a part of said chip-inner portion of said at least one photosensitive element is covered by said supporting body of said at least one supporting member.

11. The molded photosensitive assembly, as recited in claim 2, wherein said non-photosensitive area of said at least one photosensitive element comprises a chip-inner portion, a chip-connecting portion and a chip-outer portion, wherein said at least one photosensitive element has a chip connector for electrically connecting with said set of wires, wherein said chip connector of said at least one photosensitive element is disposed on said chip-connecting portion, wherein said chip-inner portion and said chip-outer portion are respectively positioned on an inside and an outside of said chip-connecting portion, wherein at least a part of said chip-inner portion and at least a part of said chip-connecting portion of said non-photosensitive area of said at least one photosensitive element are covered by said at least one supporting member.

12. The molded photosensitive assembly, as recited in claim 6, wherein each of said non-photosensitive areas of said at least two photosensitive elements comprises a chip-inner portion, a chip-connecting portion and a chip-outer portion, wherein each of said at least two photosensitive elements has a chip connector for electrically connecting with said set of wires, wherein said chip connector of each of said at least two photosensitive elements is disposed on said chip-connecting portion thereof, wherein said chip-inner portion and said chip-outer portion are respectively positioned on an inside and an outside of said chip-connecting portion thereof, wherein at least a part of said chip-inner portion of each of said at least two photosensitive elements is covered by said supporting body of said at least one supporting member.

13. The molded photosensitive assembly, as recited in claim 6, wherein each of said non-photosensitive areas of said at least two photosensitive elements comprises a chip-inner portion, a chip-connecting portion and a chip-outer portion, wherein each of said at least two photosensitive elements has a chip connector for electrically connecting with said set of wires, wherein said chip connector of each of said at least two photosensitive elements is disposed on said chip-connecting portion thereof, wherein said chip-inner portion and said chip-outer portion are respectively positioned on an inside and an outside of said chip-connecting portion thereof, wherein at least a part of said chip-inner portion and at least a part of said chip-connecting portion of each of said at least two photosensitive elements are covered by one of said supporting bodies of said supporting member.

14. A manufacturing method of a molded photosensitive assembly, comprising the steps of:
(a) electrically connecting at least one photosensitive element with at least one circuit board through a set of wires, wherein said at least one photosensitive element is provided on a chip mounting area of said at least one circuit board, wherein the step (a) comprises the steps of:
(a.1) connecting one end of said set of wires at said at least one photosensitive element;
(a.2) connecting another end of said set of wires at said at least one circuit board; and
(a.3) sealing at least a supporting member at said end of said set of wires at said at least one photosensitive element, wherein said supporting member is upwardly protruded from said at least one photosensitive element, wherein said supporting member has an inner surface, an outer surface, and a through hole defined within said inner surface;
(b) placing said at least one photosensitive element and said at least one circuit board in a molding cavity of a molding-die which comprises an upper mold and a lower mold, wherein said molding cavity is formed between said lower mold and said upper mold when said upper mold and said lower mold are closed and clamped, wherein the step (b) comprises the steps of:
(b.1) placing said at least one photosensitive element and said at least one circuit board on said lower mold;
(b.2) closing said lower mold by said upper mold when said supporting body is pressed by a pressing surface of said upper mold to form a sealed environment at said inner surface of said supporting body and to prevent said set of wires being pressed by said pressing surface of said upper mold, wherein said pressing surface of said upper mold is pressed against a partial portion of a top surface of said supporting member;

(c) when a molding material is added in said molding cavity, reducing an impact force generated by said molding material with said supporting member provided in said molding cavity to block said molding material entering into said closed environment, such that said supporting member blocks said molding material entering into said through hole; and (d) forming at least one molded base after said molding material is solidified and cured to seal said end of each of said set of wires at said at least one circuit board, wherein said at least one molded base comprises a molded body and has a light window positioned corresponding to a photosensitive area of said at least one photosensitive element, wherein a periphery area of said at least one circuit board, said at least one supporting member and at least a part of a non-photosensitive area of said at least one photosensitive element are covered by said molded body, wherein said outer surface of supporting member is sealed and covered by said molded body while said inner surface of said supporting member is unsealed to form said light window thereat, wherein said partial portion of said top surface of said supporting member is unsealed and uncovered from said molded body while a remainder portion of said top surface of said supporting member that is arranged for not contacting with the pressing surface of the upper mold is sealed and covered by said molded body.

15. The manufacturing method, as recited in claim 14, wherein said supporting member is disposed to cover at least a part of said set of wires.

16. The manufacturing method, as recited in claim 15, further comprising a step of integrally molding one or more electronic components provided on a periphery area and said chip mounting area of said at least one circuit board, wherein said at least one supporting member is positioned between said one or more electrical components and said photosensitive area of said at least one photosensitive element, wherein said at least one supporting member comprises a frame-shaped supporting body, wherein said supporting body is provided outside of said photosensitive area of said photosensitive element, wherein said photosensitive area of said at least one photosensitive element is disposed corresponding to said through hole while at least a part of said supporting body is covered by said at least one molded body.

17. The manufacturing method, as recited in claim 16, wherein said top surface being pressed by said pressing surface of said upper mold, wherein said top surface is extended inwardly and outwardly to said inner surface and said outer surface respectively, wherein said through hole is formed by said inner surface and is uncovered by said molded body, and at least said outer surface of said supporting body is covered by said molded body.

18. The manufacturing method, as recited in claim 16, wherein said top surface being pressed by said pressing surface of said upper mold, wherein said top surface is extended inwardly and outwardly to said inner surface and said outer surface respectively, wherein said through hole is formed by said inner surface and is uncovered by said molded body, wherein said outer surface of said supporting body and at least a part of said top surface are covered by said molded body.

19. The manufacturing method, as recited in claim 17, wherein said non-photosensitive area of said at least one photosensitive element comprises a chip-inner portion, a chip-connecting portion and a chip-outer portion, wherein said at least one photosensitive element has a chip connector for electrically connecting with said set of wires, wherein said chip connector of said at least one photosensitive element is disposed on said chip-connecting portion, wherein said chip-inner portion and said chip-outer portion are respectively positioned on an inside and an outside of said chip-connecting portion, wherein at least a part of said chip-inner portion of said at least one photosensitive element is covered by said supporting body of said at least one supporting member.

20. The manufacturing method, as recited in claim 18, wherein said non-photosensitive area of said at least one photosensitive element comprises a chip-inner portion, a chip-connecting portion and a chip-outer portion, wherein said at least one photosensitive element has a chip connector for electrically connecting with said set of wires, wherein said chip connector of said at least one photosensitive element is disposed on said chip-connecting portion, wherein said chip-inner portion and said chip-outer portion are respectively positioned on an inside and an outside of said chip-connecting portion, wherein at least a part of said chip-inner portion and at least a part of said chip-connecting portion of said non-photosensitive area of said at least one photosensitive element are covered by said at least one supporting member.

* * * * *